United States Patent [19]

Keck et al.

[11] Patent Number: 5,526,867

[45] Date of Patent: *Jun. 18, 1996

[54] METHODS OF FORMING ELECTRONIC PACKAGES

[75] Inventors: Steven D. Keck, Hockessin; Michael A. Rocazella, Newark; Peter M. Engelgau, Dover; Gregory E. Hannon, Newark, all of Del.; Danny R. White, Elkton, Md.; Alan S. Nagelberg, Wilmington, Del.

[73] Assignee: Lanxide Technology Company, LP, Newark, Del.

[*] Notice: The portion of the term of this patent subsequent to May 9, 2010, has been disclaimed.

[21] Appl. No.: 467,482

[22] Filed: Jun. 6, 1995

Related U.S. Application Data

[63] Continuation of Ser. No. 934,746, Oct. 7, 1992, abandoned, which is a continuation-in-part of Ser. No. 520,936, May 9, 1990, Pat. No. 5,163,499, which is a continuation-in-part of Ser. No. 484,575, Feb. 23, 1990, abandoned, which is a continuation-in-part of Ser. No. 405,747, Sep. 11, 1989, abandoned, which is a continuation-in-part of Ser. No. 376,416, Jul. 7, 1989, abandoned, which is a continuation-in-part of Ser. No. 368,564, Jun. 20, 1989, abandoned, which is a continuation-in-part of Ser. No. 269,464, Nov. 10, 1988, Pat. No. 5,040,588.

[51] Int. Cl.⁶ .................................................. B22D 19/14
[52] U.S. Cl. .......................... 164/97; 164/98; 174/52.3; 174/52.4
[58] Field of Search ........................ 164/91, 97, 98, 164/100, 101, 102, 103, 105, 108, 109; 174/52.1, 52.3, 52.4

[56] References Cited

U.S. PATENT DOCUMENTS

| | | | |
|---|---|---|---|
| 2,951,771 | 9/1960 | Butler | 117/114 |
| 3,031,340 | 4/1962 | Girardot | 117/118 |
| 3,149,409 | 9/1964 | Maruhn | 29/156.5 |
| 3,364,976 | 1/1968 | Reding et al. | 164/63 |
| 3,396,777 | 8/1968 | Reding, Jr. | 164/97 |
| 3,399,332 | 8/1968 | Savolainen | 428/620 |
| 3,547,180 | 12/1970 | Cochran et al. | 164/61 |

(List continued on next page.)

FOREIGN PATENT DOCUMENTS

| | | |
|---|---|---|
| 1238428 | of 0000 | Canada . |
| 0094353 | 11/1983 | European Pat. Off. . |
| 0115742 | 8/1984 | European Pat. Off. . |
| 0183016 | 6/1986 | European Pat. Off. . |
| 0332384 | 9/1989 | European Pat. Off. . |
| 0340957 | 11/1989 | European Pat. Off. . |
| 0364963 | 4/1990 | European Pat. Off. . |
| 2819076 | 10/1979 | Germany . |
| 44441 | 8/1983 | Japan . |
| 2156718 | 10/1985 | United Kingdom . |

OTHER PUBLICATIONS

K. A. Schmidt and C. Zweben, Electronic Materials Handbook, vol. I, Packaging, pp. 1126–1128, copyright 1989, printed Nov. 1989, ASM International, Materials Park, Ohio.

(List continued on next page.)

*Primary Examiner*—Kuang Y. Lin

[57] ABSTRACT

The present invention relates to the formation of a macrocomposite body for use as an electronic package or container. The macrocomposite body is formed by spontaneously infiltrating a permeable mass of filler material or a preform with molten matrix metal and bonding the spontaneously infiltrated material to at least one second material such as a ceramic or ceramic containing body or a metal or metal containing body. Moreover, prior to infiltration, the filler material or preform is placed into contact with at least a portion of a second material such that after infiltration of the filler material or preform by molten matrix metal, the infiltrated material is bonded to said second material, thereby forming a macrocomposite body. The macrocomposite body may then be coated by techniques according to the present invention to enhance its performance or bonding capabilities.

20 Claims, 18 Drawing Sheets

U.S. PATENT DOCUMENTS

| | | | |
|---|---|---|---|
| 3,608,170 | 9/1971 | Larson et al. | 29/149.5 |
| 3,718,441 | 2/1973 | Landingham | 29/182.1 |
| 3,864,154 | 2/1975 | Gazza et al. | 264/60 X |
| 3,865,267 | 2/1975 | Gazza et al. | 264/60 X |
| 3,905,699 | 10/1975 | Umehara et al. | 419/17 |
| 3,969,553 | 7/1976 | Kondo et al. | 427/299 |
| 3,970,136 | 7/1976 | Cannell et al. | 164/108 |
| 4,033,400 | 7/1977 | Gurwell | 164/98 |
| 4,044,816 | 8/1977 | Krueger | 164/98 |
| 4,055,451 | 10/1977 | Cockbain | 228/195 |
| 4,067,379 | 1/1978 | Hassler | 164/98 |
| 4,082,864 | 4/1978 | Kendall et al. | 427/248 |
| 4,119,363 | 10/1978 | Camlibel et al. | 350/96.20 |
| 4,158,719 | 6/1979 | Frantz | 428/567 |
| 4,232,091 | 11/1980 | Grimshaw et al. | 428/472 |
| 4,347,265 | 8/1982 | Washo | 29/592.1 |
| 4,376,803 | 3/1983 | Katzman | 428/405 |
| 4,376,804 | 3/1983 | Katzman | 428/408 |
| 4,404,262 | 9/1983 | Watmough | 428/539.5 |
| 4,450,207 | 5/1984 | Donomoto et al. | 428/614 |
| 4,473,103 | 9/1984 | Kenney et al. | 164/97 |
| 4,506,108 | 3/1985 | Kersch et al. | 174/52 FP |
| 4,559,246 | 12/1985 | Jones | 427/299 |
| 4,570,316 | 2/1986 | Sakamaki et al. | 29/156.89 |
| 4,587,177 | 5/1986 | Toaz et al. | 428/614 |
| 4,630,665 | 12/1986 | Novak | 164/97 |
| 4,657,065 | 4/1987 | Wada et al. | 164/461 |
| 4,662,429 | 5/1987 | Wada et al. | 164/461 |
| 4,673,435 | 6/1987 | Yamaguchi et al. | 75/235 |
| 4,677,901 | 7/1987 | Ban et al. | 92/213 |
| 4,679,493 | 7/1987 | Munro et al. | 92/212 |
| 4,713,111 | 12/1987 | Cameron et al. | 75/68 R |
| 4,731,298 | 3/1988 | Shindo et al. | 428/611 |
| 4,753,690 | 6/1988 | Wada et al. | 148/11.5 A |
| 4,784,974 | 11/1988 | Butt | 437/221 |
| 4,802,524 | 2/1989 | Donomoto | 164/97 |
| 4,828,008 | 5/1985 | White et al. | 164/66.1 |
| 4,871,008 | 10/1989 | Dwivedi | 164/6 |
| 4,875,616 | 10/1989 | Nixdorf | 228/253 |
| 4,884,737 | 12/1989 | Newkirk | 228/248 |
| 4,932,099 | 6/1990 | Corwin | 164/97 |
| 4,935,055 | 6/1990 | Aghajanian et al. | 164/66.1 |
| 4,978,054 | 12/1990 | Ferrando | 228/120 |
| 5,000,986 | 3/1991 | Li | 228/120 |
| 5,001,299 | 3/1991 | Hingorany | 174/52.4 |
| 5,004,034 | 4/1991 | Park | 164/97 |
| 5,011,063 | 4/1991 | Claar | 228/124 |
| 5,040,588 | 8/1991 | Newkirk et al. | 164/97 |
| 5,163,499 | 11/1992 | Newkirk | 164/108 |
| 5,235,135 | 8/1993 | Knecht | 174/52.3 |

OTHER PUBLICATIONS

K. G. Beasley, Electronic Materials and Processes, 3rd Electronic Conference (closed session), pp. 9–19, date of conference: Jun. 20–22, 1989, SAMPE International, Covina, California.

A. L. Geiger and M. Jackson, Advanced Materials and Processes, pp. 23–30, Jul. 1989, ASM International, Materials Park, Ohio.

C. Williams, Ceramic Bulletin, pp. 714–721, vol. 70, No. 4, Apr. 1991, the American Ceramic Society, Inc. (ACerS), Columbus, Ohio.

F. Delannay, L. Froyen, and A. Deruyttere, "Review: The Wetting of Solids by Molten Metals and Its Relation to the Preparation of Metal–Matrix Composites", Journal of Materials Science, vol. 22, No. 1, pp. 1–16, Jan. 1987.

A. Mortensen, M. N. Gungor; J. A. Cornie, and M. C. Flemings "Alloy Microstructures in Cast Metal Matrix Composites", Journal of Metals, vol. 38, No. 3, pp. 30–35, Mar. 1986.

G. R. Edwards and D. L. Olson, "The Infiltration Kinetics of Aluminum in Silicon Carbide Compacts", Annual Report from Center for Welding Research, Colorado School of Mines, under ONR Contract No. M00014–B5–K–0451, DTIC Report AD–A184 682, Jul. 1987.

K. G. Beasly, Industry–University Advanced Materials Conference II, date of conference: Mar. 6–9, 1989, Advanced Materials Institute, Colorado School of Mines, Golden, Colorado.

J. J. Licari and L. R. Enlow, Hybrid Microcircuit Technology Handbook: Materials, Processes, Design, Testing and Production, pp. 174–248, copyright 1988, NOYES Publications, Park Ridge, NJ.

J. R. Tyler and M. R. van den Bergh, Electronic Materials and Processes, vol. 3, pp. 1068–1078, Jun. 20, 1989, SAMPE International, Covina, CA.

A. L. Geiger and M. Jackson, Electronic Materials and Processes, 3rd Electronic Conference (restricted session), pp. 20–31, date of conference: Jun. 20–22, 1989, SAMPE International, Covina, CA.

C. A. Neugebauer, Journal of Electronic Materials, pp. 229–239, vol. 18, No. 2, Feb. 1989, The Minerals, Metals and Materials Society (TMS), Warrendale, PA.

J. D. Gardner, G. L. Hira and A. L. Oppedal, Electronic Materials and Processes, 3rd Electronic Conference (restricted session), pp. 32–42, date of conference: Jun. 20–22, 1989, SAMPE Intenational, Covina, CA.

W. De la Torre & W. C. Riley, Electronic Materials and Processes, vol. 3, pp. 1079–1091, Jun. 20, 1989, SAMPE International, Covina, California.

J. W. Roman, Proceedings, Eleventh Annual Discontinuously Reinforced MMC Working Group, pp. 193–206, date of proceedings: Feb. 14–16, 1989, available Dec. 1989, MMCIAC, Kaman Science Corporation, Santa Barbara, California.

A. L. Geiger and M. Jackson, Microelectronic Packaging Technology: Materials and Processes, pp. 93–102, date of conference: Apr. 24–28, 1989, ASM International, Metals Park, Ohio.

R. Keeler, Electronic Packaging and Production, pp. 80–82, Feb. 1989, Cahners Publishing Co., Denver, Colorado.

K. A. Schmidt, C. Zweeben, and R. Arsenault, Thermal and Mechanical Behavior of Metal Matrix and Ceramic Matrix Composites, pp. 155–164, date of conference: Nov. 7–8, 1988, American Society for Testin (ASTM), Philadephia, PA.

C. Thaw, R. Minet, J. Zemany, and C. Zweben, SAMPE Journal, pp. 40–43, vol. 23, No. 6, Nov./Dec. 1987, SAMPE International, Covina, CA.

N. R. Stockham and C. J. Dawes, International Journal for Hybrid Microelectronics, pp. 509–519, vol. 6, No. 1, Oct. 1983.

C. Davidoff, Metal Finishing Guidebook & Directory: 44th Annual Edition, pp. 413–418, 1976, Metals and Plastics Publications, Inc., Hackensack, New Jersey.

METHODS OF FORMING ELECTRONIC PACKAGES

This is continuation of application Ser. No. 07/934,746 filed on Oct. 7, 1992, abandoned, which is a CIP of U.S. Ser. No. 07/520,936, filed May 9, 1990, and which issued on Nov. 17, 1992, as U.S. Pat. No. 5,163,499, which was a CIP of U.S. Ser. No. 07/484,575, filed Feb. 23, 1990, and now abandoned, which is a CIP of U.S. Ser. No. 07/405,747, filed Sep. 11, 1989, and now abandoned, which was a CIP of U.S. Ser. No. 07/376,416, filed Jul. 7, 1989, and now abandoned, which was a CIP of U.S. Ser. No. 07/368,564, filed Jun. 20, 1989, and now abandoned, which as a CIP of U.S. Ser. No. 07/269,464, filed Nov. 10, 1988, and which issued on Aug. 20, 1991, as U.S. Pat. No. 5,040,588.

TECHNICAL FIELD

The present invention relates to the formation of a macrocomposite body for use as an electronic package, said macrocomposite body being formed by spontaneously infiltrating a permeable mass of filler material or a preform with molten matrix metal and bonding the spontaneously infiltrated material to at least one second material such as a ceramic and/or a metal. Particularly, an infiltration enhancer and/or infiltration enhancer precursor and/or infiltrating atmosphere are in communication with a filler material or a preform, at least at some point during the process, which permits molten matrix metal to spontaneously infiltrate the filler material or preform. Moreover, prior to infiltration, the filler material or preform is placed into contact with at least a portion of a second material such that after infiltration of the filler material or preform, the infiltrated material is bonded to the second material, thereby forming a macrocomposite body for use as an electronic package.

BACKGROUND ART

There has been a long felt need in the electronic packages container art to utilize an appropriate container or package within which electronic components (e.g., an electronic chip) can be mounted and hermetically sealed.

Historically, electronic chips have been made of ceramic materials such as alumina and, more recently, materials such as gallium arsenide. Thus, some of the requirements for the package or container are that the package be compatible with the electronics (e.g., electronic chips) housed therein. Specifically, the thermal expansion coefficient of the container should approach that of the electronic (e.g., ceramic chip(s)); the package or container should be capable of dissipating any heat generated by the ceramic chip(s); the package or container should be readily fixable (e.g., weldable or solderable) to a lid for hermetically sealing the ceramic chip inside of the package or container; the package should not be adversely affected by any environment to which it is exposed; and the package or container should preferably be relatively inexpensive to manufacture into desirable shapes. Moreover, in many cases it is necessary for electrical leads to be connected with, for example, the ceramic chip(s) or other electronics contained within the package or container. Thus, some means for insulating the electrical leads from the package or container may also be required. Moreover, the electrical leads may need to be hermetically sealed within the container to prevent exposure of the contents of the package or container to any harmful external environment.

Still further, in some cases it may be desirable to provide a coating or series of coatings (e.g., by electroplating, chemical vapor deposition, etc.) onto at least a portion, or substantially all, of a surface of the formed package. Such a coating or layer may: facilitate bonding of electrical leads directly to the electronic package; create a protective layer on the electronic package to enhance the corrosion resistance, erosion resistance, etc., of the package; and/or may function as an electric ground for any electronics (e.g., electronic chip(s), etc.) contained therein. Examples of acceptable coating materials may include Au, Zn, Ni, etc. and mixtures thereof. Thus, a means for coating the surface of the package or container may be required.

The art is replete with attempts to satisfy each of the needs discussed above, however, to date, the art has not satisfactorily solved all of the attendant problems. Description of Commonly Owned U.S. Patent Applications The subject matter of this application is further related to that of several other copending and co-owned patent applications and co-owned patents. Particularly, these other copending patent applications and co-owned patents describe novel methods for making metal matrix composite materials (hereinafter sometimes referred to as "Commonly Owned Metal Matrix Patent Applications").

A novel method of making a metal matrix composite material is disclosed in Commonly Owned U.S. Pat. No. 4,828,008, issued May 9, 1989, from U.S. patent application Ser. No. 049,171, filed May 13, 1987, in the names of White et al., and entitled "Metal Matrix Composites", now allowed in the United States. According to the method of the White et al. invention, a metal matrix composite is produced by infiltrating a permeable mass of filler material (e.g., a ceramic or a ceramic-coated material) with molten aluminum containing at least about 1 percent by weight magnesium, and preferably at least about 3 percent by weight magnesium. Infiltration occurs spontaneously without the application of external pressure or vacuum. A supply of the molten metal alloy is contacted with the mass of filler material at a temperature of at least about 675° C. in the presence of a gas comprising from about 10 to 100 percent, and preferably at least about 50 percent, nitrogen by volume, and a remainder of the gas, if any, being a nonoxidizing gas, e.g., argon. Under these conditions, the molten aluminum alloy infiltrates the ceramic mass under normal atmospheric pressures to form an aluminum (or aluminum alloy) matrix composite. When the desired amount of filler material has been infiltrated with the molten aluminum alloy, the temperature is lowered to solidify the alloy, thereby forming a solid metal matrix structure that embeds the reinforcing filler material. Usually, and preferably, the supply of molten alloy delivered will be sufficient to permit the infiltration to proceed essentially to the boundaries of the mass of filler material. The amount of filler material in the aluminum matrix composites produced according to the White et al. invention may be exceedingly high. In this respect, filler to alloy volumetric ratios of greater than 1:1 may be achieved.

Under the process conditions in the aforesaid White et al. invention, aluminum nitride can form as a discontinuous phase dispersed throughout the aluminum matrix. The amount of nitride in the aluminum matrix may vary depending on such factors as temperature, alloy composition, gas composition and filler material. Thus, by controlling one or more such factors in the system, it is possible to tailor certain properties of the composite. For some end use applications, however, it may be desirable that the composite contain little or substantially no aluminum nitride.

It has been observed that higher temperatures favor infiltration but render the process more conducive to nitride formation. The White et al. invention allows the choice of a balance between infiltration kinetics and nitride formation.

An example of suitable barrier means for use with metal matrix composite formation is described in Commonly Owned U.S. Pat. No. 4,935,055, issued Jun. 19, 1990 (now abandoned), from U.S. patent application Ser. No. 141,642, filed Jan. 7, 1988 (now abandoned), in the names of Michael K. Aghajanian et al., and entitled "Method of Making Metal Matrix Composite with the use of a Barrier". According to the method of this Aghajanian et al. invention a barrier means (e.g., particulate titanium diboride or a graphite material such as a flexible graphite tape product sold by Union Carbide under the trade name Grafoil®) is disposed on a defined surface boundary of a filler material and matrix alloy infiltrates up to the boundary defined by the barrier means. The barrier means is used to inhibit, prevent, or terminate infiltration of the molten alloy, thereby providing net, or near net, shapes in the resultant metal matrix composite. Accordingly, the formed metal matrix composite bodies have an outer shape which substantially corresponds to the inner shape of the barrier means.

The method of U.S. Pat. No. 4,828,008 was improved upon by Commonly Owned and Copending U.S. patent application Ser. No. 07/517,541, filed Apr. 24, 1990, which is a continuation of U.S. Patent application Ser. No. 168,284, filed Mar. 15, 1988, in the names of Michael K. Aghajanian and Marc S. Newkirk and entitled "Metal Matrix Composites and Techniques for Making the Same." In accordance with the methods disclosed in this U.S. Patent Application, a matrix metal alloy is present as a first source of metal and as a reservoir of matrix metal alloy which communicates with the first source of molten metal due to, for example, gravity flow. Particularly, under the conditions described in this patent application, the first source of molten matrix alloy begins to infiltrate the mass of filler material under normal atmospheric pressures and thus begins the formation of a metal matrix composite. The first source of molten matrix metal alloy is consumed during its infiltration into the mass of filler material and, if desired, can be replenished, preferably by a continuous means, from the reservoir of molten matrix metal as the spontaneous infiltration continues. When a desired amount of permeable filler has been spontaneously infiltrated by the molten matrix alloy, the temperature is lowered to solidify the alloy, thereby forming a solid metal matrix structure that embeds the reinforcing filler material. It should be understood that the use of a reservoir of metal is simply one embodiment of the invention described in this patent application and it is not necessary to combine the reservoir embodiment with each of the alternate embodiments of the invention disclosed therein, some of which could also be beneficial to use in combination with the present invention.

The reservoir of metal can be present in an amount such that it provides for a sufficient amount of metal to infiltrate the permeable mass of filler material to a predetermined extent. Alternatively, an optional barrier means can contact the permeable mass of filler on at least one side thereof to define a surface boundary.

Moreover, while the supply of molten matrix alloy delivered should be at least sufficient to permit spontaneous infiltration to proceed essentially to the boundaries (e.g., barriers) of the permeable mass of filler material, the amount of alloy present in the reservoir could exceed such sufficient amount so that not only will there be a sufficient amount of alloy for complete infiltration, but excess molten metal alloy could remain and be attached to the metal matrix composite body. Thus, when excess molten alloy is present, the resulting body will be a complex composite body (e.g., a macrocomposite), wherein an infiltrated ceramic body having a metal matrix therein will be directly bonded to excess metal remaining in the reservoir.

Each of the above-discussed Commonly Owned Metal Matrix Patents and Patent Applications describes methods for the production of metal matrix composite bodies and novel metal matrix composite bodies which are produced therefrom. The entire disclosures of all of the foregoing Commonly Owned Metal Matrix Patents and Patent Applications are expressly incorporated herein by reference.

DISCLOSURE OF INVENTION

The present invention satisfies a long felt need in the electronic package or container art by supplying a simple, reliable and cost effective approach for making net or near-net shaped macrocomposite bodies for use as electronic packages or containers. The present invention permits the formation of complex-shaped or simple-shaped macrocomposite bodies, a portion of which comprises a metal matrix composite body, by a substantially single-step approach. Specifically, an electronic package or container is formed in a single step to include a sealable lip portion, any number of conduits or feedthroughs, any number and size of walls (both internal and external), mounting portions or areas for electronic components, etc. The single step formation process is achieved by spontaneously infiltrating molten matrix metal into a filler material or preform which contains, or is caused to contain, each of the structural features discussed above, thereby forming an integral macrocomposite body. Moreover, specific characteristics of the metal matrix composite portion of the macrocomposite body can be controlled. For example, the thermal expansion coefficient and the thermal conductivity of the metal matrix composite body can be appropriately tailored by reinforcing the matrix metal of the metal matrix composite body with appropriate compositions, sizes, amounts, etc., of a filler material or reinforcement. The flexibility offered by the method of the present invention permits a virtually infinite number of combinations of materials and shapes for use as electronic packages or containers heretofore believed to be difficult, if not impossible, to achieve.

A complex composite body which is to be formed into an electronic package or container is produced by first forming a metal matrix composite body which is contacted with and bonded to a second material. A metal matrix composite body is produced by spontaneously infiltrating a permeable mass of filler material or a preform with molten matrix metal. Specifically, an infiltration enhancer and/or infiltration enhancer precursor and/or an infiltrating atmosphere are in communication with the filler material or preform, at least at some point during the process, which permits molten matrix metal to spontaneously infiltrate the filler material or preform.

In a preferred embodiment of the invention, an infiltration enhancer may be supplied directly to at least one of the preform (or filler material) and/or matrix metal, and/or infiltrating atmosphere. Ultimately, at least during spontaneous infiltration, the infiltration enhancer should be located in at least a portion of the filler material or preform.

In a first preferred embodiment for forming a macrocomposite body, the quantity or amount of matrix metal supplied to spontaneously infiltrate the filler material or preform is provided in excess of that which is needed to achieve complete infiltration of the permeable material. Thus, residual or excess matrix metal (e.g., that matrix metal which was not utilized to infiltrate the filler material or preform) remains in contact with the infiltrated mass and becomes intimately bonded to the infiltrated mass. The amount, size, shape, and/or composition of the residual matrix metal can be controlled to produce a virtually limitless number of combinations. Moreover, the relative size of metal matrix composite to residual matrix metal can be controlled from one extreme of forming a metal matrix composite skin on a surface of residual matrix metal (e.g., only a small amount of spontaneous infiltration occurred) to another extreme of forming residual matrix metal as a skin on a surface of a metal matrix composite (e.g., only a small amount of excess matrix metal was provided).

In a second preferred embodiment, a filler material or preform is placed into, contact with at least a portion of another or second body (e.g., a ceramic body or a metal body) and molten matrix metal spontaneously infiltrates the filler material or preform at least up to a surface of the second body causing the metal matrix composite to become intimately bonded to the second body. The bonding of the metal matrix composite to the second body may be due to the matrix metal and/or the filler material or preform reacting with the second body. For example, the aforementioned another or second body could comprise a metal which is similar (or different) in composition to the matrix metal, thereby facilitating a bond between the formed metal matrix composite and the second body. This technology provides benefit to the electronic packages art wherein it is required for a ceramic chip to be hermetically sealed within a package or container. Specifically, the package or container can be formed by spontaneously infiltrating a filler material or preform having a desired configuration, a portion of which (e.g., the portion which is to be bonded to a lid) is in contact with the second body, said second body comprising a weldable or solderable material (e.g., a metal). Thus, the resulting macrocomposite body comprises a metal matrix composite package or container bonded to a lip (e.g., a metal lip) which is, for example, weldable or solderable, by conventional techniques, to an electronic package cover or lid. The material which is chosen as the lip should be selected based upon its ability to be attached, by conventional techniques, to a later applied lid. Acceptable materials for use as a lip include those materials which may have a relatively low thermal conductivity and a relatively high electrical conductivity. For example, some suitable materials for use as lips for electronic packages made by techniques according to the present invention include KOVAR® commercial alloys, NCONEL® commercial alloys, copper alloys and titanium alloys. Still further, it is possible that the lip could comprise a metal matrix composite body. For example, the lip could comprise an alumina reinforced aluminum composite integrally bonded to a metal matrix composite. The lip should also not be detachable from the metal matrix composite body during use of the body as an electronic package or container. Thus, the lip should be chemically and physically compatible with the metal matrix composite body.

Moreover, if the second body at least partially surrounds substantially completely surrounds, or is surrounded by, the formed metal matrix composite, a shrink or compression fit may occur. Such shrink fit may be the only means of bonding the metal matrix composite to the second body or it may exist in combination with another bonding mechanism between the metal matrix composite or second body. Moreover, the amount of shrink fit can be controlled by selecting appropriate combinations of matrix metals, filler materials or preforms (e.g., composition and volume percent of filler material relative to matrix metal) and/or second bodies to obtain a desirable match or select on thermal expansion coefficients. Thus, for example, a metal matrix composite could be produced such that it has a higher coefficient thermal expansion than a second body and the metal matrix composite surrounds, at least partially, a second body. In this example, the metal matrix composite would be bonded to the second body by at least a shrink fit. Thus, a wide spectrum of macrocomposite bodies for use as electronic packages or containers can be formed comprising a metal matrix composite bonded to a second body such as another ceramic metal. For example, in the electronic packages art, the second body could comprise an electrically insulating sheath (or sheaths) which sheath is disposed within at least one wall portion (e.g., serves as an insulating conduit through a wall) of a metal matrix composite package or container. The electrically insulating sheath or conduit may be substantially completely nonreactive or the sheath may be at least partially chemically reactive with the metal matrix composite during formation thereof (e.g., reactive with molten matrix metal). Electrical lead wires may be contained within the insulating sheath and may be attached to any electronic components (e.g., ceramic chip) contained within the electronic package. This arrangement provides for electrical connection between the ceramic chip within a hermetically sealable package and an external electronic circuit. Further, as discussed above, the thermal expansion coefficients of the metal matrix composite package and the electrically insulating sheath may be chosen to provide for at least a compression or shrink fit of the metal matrix composite with the electrically insulating sheath (e.g., the thermal expansion coefficient of the metal matrix composite body may be greater than the thermal expansion coefficient of the electrical insulating sheath). Thus, the present invention provides a method for hermetically bonding, in situ (i.e., during formation of the metal matrix composite electronic package), at least one insulating sheath or conduit within at least one wall of an electronic package or container. The bonding may occur due to: (1) a mechanical bond (e.g., a shrink or compression fit) between the metal matrix composite and the insulating sheath; (2) a physical bond (e.g., a wetting of the insulating sheath by the matrix metal during formation of the metal matrix composite body) between the metal matrix composite and the insulating sheath; (3) a chemical reaction between the metal matrix composite body and the insulating sheath (e.g., at least a partial reaction between molten matrix metal and the insulating sheath); and (4) some combination of the three aforementioned phenomena.

In a further preferred embodiment, excess or residual matrix metal is supplied to the above-discussed second preferred embodiment (e.g., the combination of metal matrix composite and second body). In this embodiment, similar to the first preferred embodiment discussed above herein, the quantity or amount of matrix metal supplied to spontaneously infiltrate the filler material or preform is provided in excess of that which is needed to achieve complete infiltration of the permeable material. Moreover, similar to the second preferred embodiment discussed above herein, a filler material or preform is placed into contact with at least a portion of another or second body (e.g., a ceramic body or metal body) and molten matrix metal spontaneously infiltrates the filler material or preform at least up to a surface of the second body causing the metal matrix composite to become intimately bonded to the second body. Thus, an even more complex macrocomposite body can be achieved than the macrocomposite discussed in the first two preferred embodiments. Specifically, by being able to select and combine a metal matrix composite with both a second body (e.g., a ceramic and/or a metal) and with excess or residual matrix metal, a virtually limitless number of permutations or combinations can be achieved. For example, if it was desired to produce a macrocomposite shaft or rod, an interior portion of the shaft could be a second body (e.g., a ceramic or a metal). The second body could be at least partially surrounded by a metal matrix composite. The metal matrix composite could then be at least partially surrounded by a second body or residual matrix metal. If the metal matrix composite was surrounded by residual matrix metal, another metal matrix composite could at least partially surround the residual matrix metal (e.g., the residual matrix metal could be supplied in a sufficient quantity such that it infiltrates both inward toward a filler material (or preform) which contacts an interior portion of a matrix metal and outward toward a filler material (or preform) which contacts an exterior portion of the matrix metal). Accordingly, significant engineering opportunities are provided by this third embodiment of the invention.

In a further preferred embodiment, a formed macrocomposite body may be subjected to further procedures comprising coating at least a portion, or substantially all, of a surface of a formed metal matrix composite body. The coating may bond with at least a portion of the metal matrix composite (e.g., a bond may form between metal and/or filler material contained in the metal matrix composite and the coating). A coating may be created by a number of traditional or conventional means including chemical, physical and/or mechanical means. More specifically, the coating may be provided by such methods as electroplating, electroless deposition, chemical vapor deposition, physical vapor deposition, sputtering, etc. The coating material may comprise, for example, a material (e.g., Al, Au, Cr, Cu, Ni, Sn, Ti, W, Zn), an organic metal (e.g., an epoxy or resin) or any other material(s) which impart(s) desired properties to the macrocomposite. With respect to the electronic packaging art, a coating or coatings may be provided on at least a portion of the surface of the metal matrix composite body to facilitate bonding of electrical leads directly to the electronic package; facilitate seam welding a lid to the electronic package; create a protective layer on the electronic package to enhance the corrosion resistance, erosion resistance, etc., of the package; and/or may function as an electric ground for the electronic chip, etc. Examples of coating materials include Al, Au, Cr, Cu, Ni, Sn, Ti, W, Zn, epoxy resin, etc., and mixtures thereof.

In a further preferred embodiment, it may be desirable for the formed metal matrix composite and/or the macrocomposite body to be machinable. For example, even though a metal matrix composite and/or macrocomposite body can be formed to net or near net shape, it may be desirable for at least a portion of the formed body to be machinable by conventional techniques. Specifically, it may be possible to machine, such as by drilling, grinding, thermoforming, etc., the formed body to meet a desired need. With respect to the electronic packaging art, at least a port,on of a metal matrix composite or macrocomposite body may be tailored by, e.g., drilling or thermoforming, to tailor the body to a specific application.

In each of the above-discussed preferred embodiments, a metal matrix composite body may be formed as either an exterior or interior surface, or both, on a substrate of matrix metal. Moreover, the metal matrix composite surface may be of a selected or predetermined thickness with respect to the size of the matrix metal substrate. The spontaneous infiltration techniques of the present invention enable the preparation of thick wall or thin wall metal matrix composite structures in which the relative volume of matrix metal providing the metal matrix composite surface is substantially greater than or less than the volume of metal substrate. Still further, the metal matrix composite body which may be either an exterior or interior surface or both, may be also bonded to a second material such as a ceramic or metal, thereby providing for a significant number of combinations of bonding between metal matrix composite, and/or excess matrix metal and/or a second body such as a ceramic or metal body.

In regard to the formation of the metal matrix composite body, it is noted that this application discusses primarily aluminum matrix metals which, at some point during the formation of the metal matrix composite body, are contacted with magnesium, which functions as the infiltration enhancer precursor, in the presence of nitrogen, which functions as the infiltrating atmosphere. Thus, the matrix metal/infiltration enhancer precursor/infiltrating atmosphere system of aluminum/magnesium/nitrogen exhibits spontaneous infiltration. However, other matrix metal/infiltration enhancer precursor/infiltrating atmosphere systems may also behave in a manner similar to the system aluminum/magnesium/nitrogen. For example, similar spontaneous infiltration behavior has been observed in the aluminum/strontium/nitrogen system; the aluminum/zinc/oxygen system; and the aluminum/calcium/nitrogen system. Accordingly, even though the aluminum/magnesium/nitrogen system is discussed primarily herein, it should be understood that other matrix metal/infiltration enhancer precursor/infiltrating atmosphere systems may behave in a similar manner.

When the matrix metal comprises an aluminum alloy, the aluminum alloy is contacted with a preform comprising a filler material (e.g., alumina or silicon carbide) or a filler material, said filler material or preform having admixed therewith, and/or at some point during the process being exposed to, magnesium. Moreover, in a preferred embodiment, the aluminum alloy and/or preform or filler material are contained in a nitrogen atmosphere for at least a portion of the process. The preform will be spontaneously infiltrated and the extent or rate of spontaneous infiltration and formation of metal matrix composite will vary with a given set of process conditions including, for example, the concentration of magnesium provided to the system (e.g., in the aluminum alloy and/or in the filler material or preform and/or in the infiltrating atmosphere), the size and/or composition of the particles in the preform or filler material, the concentration of nitrogen in the infiltrating atmosphere, the time permitted for infiltration, and/or the temperature at which infiltration occurs. Spontaneous infiltration typically occurs to an extent sufficient to embed substantially completely the preform or filler material.

BRIEF DESCRIPTION OF THE DRAWINGS

The following Figures are provided to assist in understanding the invention, but are not intended to limit the scope of the invention. Similar reference numerals have been used wherever possible in each of the Figures to denote like components, wherein:

FIG. 20C shows a photograph of the resultant metal matrix composite body of Example 29 which incorporates strip line feed-through.

BEST MODES FOR CARRYING OUT THE INVENTION

Figure 1:
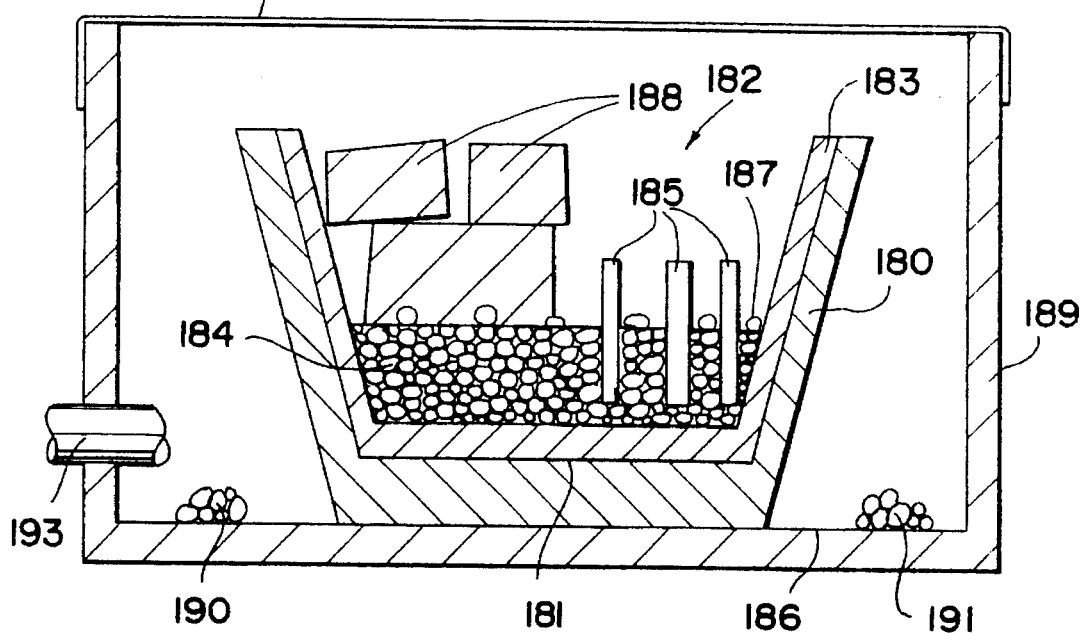
FIG. 1 is a cross-sectional view of the setup utilized to create the macrocomposite produced in Example 1.

As used in the Sections entitled: "Disclosure of Invention", "Best Modes for Carrying Out the Invention" and "Claims", the terms below are defined as follows:

"Aluminum", as used herein, means and includes essentially pure metal (e.g., a relatively pure, commercially available unalloyed aluminum) or other grades of metal and metal alloys such as the commercially available metals having impurities and/or alloying constituents such as iron, silicon, copper, magnesium, manganese, chromium, zinc, etc., therein. An aluminum alloy for purposes of this definition is an alloy or intermetallic compound in which aluminum is the major constituent.

"Balance Non-Oxidizing Gas", as used herein, means that any gas present in addition to the primary gas comprising the infiltrating atmosphere, is either an inert gas or a reducing gas which is substantially non-reactive with the matrix metal under the process conditions. Any oxidizing gas which may be present as an impurity in the gas(es) used should be insufficient to oxidize the matrix metal to any substantial extent under the process conditions.

"Barrier" or "barrier means", as used herein, means any suitable means which interferes, inhibits, prevents or terminates the migration, movement, or the like, of molten matrix metal beyond a surface boundary of a permeable mass of filler material or preform, where such surface boundary is defined by said barrier means. Suitable barrier means may be any such material, compound, element, composition, or the like, which, under the process conditions, maintains some integrity and is not substantially volatile (i.e., the barrier material does not volatilize to such an extent that it is rendered non-functional as a barrier).

Further, suitable "barrier means" includes materials which are substantially non-wettable by the migrating molten matrix metal under the process conditions employed. A barrier of this type appears to exhibit substantially little or no affinity for the molten matrix metal, and movement beyond the defined surface boundary of the mass of filler material or preform is prevented or inhibited by the barrier means. The barrier reduces any final machining or grinding that may be required and defines at least a portion of the surface of the resulting metal matrix composite product. The barrier may in certain cases be permeable or porous, or rendered permeable by, for example, drilling holes or puncturing the barrier, to permit gas to contact the molten matrix metal.

"Carcass" or "Carcass of Matrix Metal", as used herein, refers to any of the original body of matrix metal remaining which has not been consumed during formation of the metal matrix composite body, and typically, if allowed to cool, remains in at least partial contact with the metal matrix composite body which has been formed. It should be understood that the carcass may also include a second or foreign metal therein.

"Ceramic Chip" or "Electronic Chip", as used herein means electronic resistors, semiconductors, transistors, diodes or other semiconducting devices, integrated electronic devices, etc., that may perform a plurality of functions. The composition of such bodies may include: metals (e.g., aluminum, nickel, etc.), alloys (e.g., steel, INCONEL®, bronze, etc.), polymers (polypropylene, polyethylene, polymethyl methacrylate, etc.), ceramics (e.g., oxide, borides, nitrides, etc.), semiconducting compounds (e.g., copper oxide, cadmium selenide, etc.), semiconducting crystals (e.g., silicon, germanium, etc.), or amorphous semiconductors (e.g., hydrogenated amorphous silicon, etc.) and combinations thereof. Such bodies may be capable of being bonded (e.g., by an organic or inorganic means) to one or more surfaces of a metal matrix composite and/or macrocomposite body.

"Excess Matrix Metal" or "Residual Matrix Metal", as used herein, means that quantity or amount of matrix metal which remains after a desired amount of spontaneous infiltration into a filler material or preform has been achieved and which is intimately bonded to the formed metal matrix composite. The excess or residual matrix metal may have a composition which is the same as or different from the matrix metal which has spontaneously infiltrated the filler material or preform.

"Filler", as used herein, is intended to include either single constituents or mixtures of constituents which are substantially nonreactive with and/or of limited solubility in the matrix metal and may be single or multi-phase. Fillers may be provided in a wide variety of forms, such as powders, flakes, platelets, microspheres, whiskers, bubbles, etc., and may be either dense or porous. "Filler" may also include ceramic fillers, such as alumina or silicon carbide as fibers, chopped fibers, particulates, whiskers, bubbles, spheres, fiber mats, or the like, and ceramic-coated fillers such as carbon fibers coated with alumina or silicon carbide to protect the carbon from attack, for example, by a molten aluminum parent metal. Fillers may also include metals.

"Infiltrating Atmosphere", as used herein, means that atmosphere which is present which interacts with the matrix metal and/or preform (or filler material) and/or infiltration enhancer precursor and/or infiltration enhancer and permits or enhances spontaneous infiltration of the matrix metal to occur.

"Infiltration Enhancer", as used herein, means a material which promotes or assists in the spontaneous infiltration of a matrix metal into a filler material or preform. An infiltration enhancer may be formed from, for example, (1) a reaction of an infiltration enhancer precursor with an infiltrating atmosphere to form a gaseous species and/or (2) a reaction product of the infiltration enhancer precursor and the infiltrating atmosphere and/or (3) a reaction product of the infiltration enhancer precursor and the filler material or preform and/or (4) a reaction product of the infiltration enhancer precursor and the matrix metal. Moreover, the infiltration enhancer may be supplied directly to at least one of the preform, and/or matrix metal, and/or infiltrating atmosphere and function in a substantially similar manner to an infiltration enhancer which has formed as a reaction between an infiltration enhancer precursor and another species. Ultimately, at least during the spontaneous infiltration, the infiltration enhancer should be located in at least a portion of the filler material or preform to achieve spontaneous infiltration.

"Infiltration Enhancer Precursor" or "Precursor to the Infiltration Enhancer", as used herein, means a material which when used in combination with the matrix metal, preform and/or infiltrating atmosphere forms an infiltration enhancer which induces or assists the matrix metal to spontaneously infiltrate the filler material or preform. Without wishing to be bound by any particular theory or explanation, it appears as though it may be necessary for the precursor to the infiltration enhancer to be capable of being positioned, located or transportable to a location which permits the infiltration enhancer precursor to interact with the infiltrating atmosphere and/or the preform or filler material and/or metal. For example, in some matrix metal/infiltration enhancer precursor/infiltrating atmosphere systems, it is desirable for the infiltration enhancer precursor to volatilize at, near, or in some cases, even somewhat above the temperature at which the matrix metal becomes molten. Such volatilization may lead to: (1) a reaction of the infiltration enhancer precursor with the infiltrating atmosphere to form a gaseous species which enhances wetting of the filler material or preform by the matrix metal; and/or (2) a reaction of the infiltration enhancer precursor with the infiltrating atmosphere to form a solid, liquid or gaseous infiltration enhancer in at least a portion of the filler material or preform which enhances wetting; and/or (3) a reaction of the infiltration enhancer precursor within the filler material or preform which forms a solid, liquid or gaseous infiltration enhancer in at least a portion of the filler material or preform which enhances wetting; and/or (4) a reaction of the infiltration enhancer precursor with the matrix metal which forms a solid, liquid, or gaseous infiltration enhancer in at least a portion of the filler material or preform which enhances wetting.

"Macrocomposite", as used herein, means any combination of two or more materials in any configuration which are intimately bonded together by, for example, a chemical reaction and/or a pressure or shrink fit, wherein at least one of the materials comprises a metal matrix composite formed by the spontaneous infiltration of molten matrix metal into a permeable mass of filler material, a preform, or a finished ceramic or metal body containing at least some porosity. The metal matrix composite may be present as an exterior surface and/or as an interior surface. It should be understood that the order, number, and/or location of a metal matrix composite body or bodies relative to residual matrix metal and/or second bodies can be manipulated or controlled in an unlimited fashion.

"Matrix Metal" or "Matrix Metal Alloy", as used herein, means that metal which is utilized to form a metal matrix composite (e.g., before infiltration) and/or that metal which is intermingled with a filler material to form a metal matrix composite body (e.g., after infiltration). When a specified metal is mentioned as the matrix metal, it should be understood that such matrix metal includes that metal as an essentially pure metal, a commercially available metal having impurities and/or alloying constituents therein, an intermetallic compound or an alloy in which that metal is the major or predominant constituent.

"Matrix Metal/Infiltration Enhancer Precursor/Infiltrating Atmophere System" or "Spontaneous System", as used herein, refers to that combination of materials which exhibits spontaneous infiltration into a preform or filler material. It should be understood that whenever a "/" appears between an exemplary matrix metal, infiltration enhancer precursor and infiltrating atmosphere that, the "/" is used to designate a system or combination of materials which, when combined in a particular manner, exhibits spontaneous infiltration into a preform or filler material.

"Metal Matrix Composite" or "MMC", as used herein, means a material comprising a two- or three-dimensionally interconnected alloy or matrix metal which has embedded a preform or filler material. The matrix metal may include various alloying elements to provide specifically desired mechanical and physical properties in the resulting composite.

A Metal "Different" from the Matrix Metal means a metal which does not contain, as a primary constituent, the same metal as the matrix metal (e.g., if the primary constituent of the matrix metal is aluminum, the "different" metal could have a primary constituent of, for example, nickel).

"Nonreactive Vessel for Housing Matrix Metal" means any vessel which can house or contain molten matrix metal under the process conditions and not react with the matrix and/or the infiltrating atmosphere and/or infiltration enhancer precursor and/or filler material or preform in a manner which would be significantly detrimental to the spontaneous infiltration mechanism.

"Preform" or "Permeable Preform", as used herein, means a porous mass of filler or filler material which is finished (i.e., fully sintered or formed ceramic and metal bodies) with at least one surface boundary which essentially defines a boundary for infiltrating matrix metal, such mass retaining sufficient shape integrity and green strength to provide dimensional fidelity prior to being infiltrated by the matrix metal. The mass should be sufficiently porous to accommodate spontaneous infiltration of the matrix metal thereinto. A preform typically comprises a bonded array or arrangement of filler, either homogeneous or heterogeneous, and may be comprised of any suitable material (e.g., ceramic and/or metal particulates, powders, fibers, whiskers, etc.), and any combination thereof). A preform may exist either singularly or as an assemblage.

"Reservoir", as used herein, means a separate body of matrix metal positioned relative to a mass of filler or a preform so that, when the metal is molten, it may flow to replenish, or in some cases to initially provide and subsequently replenish, that portion, segment or source of matrix metal which is in contact with the filler or preform.

"Second Body" or "Additional Body", as used herein, means another body which is capable of being bonded to a metal matrix composite body by at least one of a chemical reaction and/or a mechanical or shrink fit. Such a body includes traditional ceramics such as sintered ceramics, hot pressed ceramics, extruded ceramics, etc., and also, non-traditional ceramic and ceramic composite bodies such as those produced by the methods described in Commonly Owned U.S. Pat. No. 4,713,360, which issued on Dec. 15, 1987, in the names of Marc S. Newkirk et al.; Commonly Owned U.S. Pat. No. 4,851,375, issued on Jul. 25, 1989, from U.S. patent application Ser. No. 819,397, filed Jan. 17, 1986 in the names of Marc S. Newkirk et al. and entitled "Composite Ceramic Articles and Methods of Making Same"; Commonly Owned U.S. patent application Ser. No. 07/338,471, filed Apr. 14, 1989, now allowed, which is a continuation of U.S. patent application Ser. No. 861,025, filed May 8, 1986 in the names of Marc S. Newkirk et al. and entitled "Shaped Ceramic Composites and Methods of Making the Same"; Commonly Owned U.S. Pat. No. 4,818,734, issued Apr. 4, 1989, from U.S. patent application Ser. No. 152,518 filed on Feb. 5, 1988 in the names of Robert C. Kantner et al. and entitled "Method For In Situ Tailoring the Metallic Component of Ceramic Articles and Articles Made Thereby"; Commonly Owned U.S. Pat. No. 4,940,679, issued Jul. 10, 1990, from U.S. patent application Ser. No. 137,044, filed Dec. 23, 1987 in the names of T. Dennis Claar et al. and entitled "Process for Preparing Self-Supporting Bodies and Products Made Thereby"; and variations and improvements on these processes contained in other Commonly Owned Allowed and Copending U.S. Applications. For the purpose of teaching the method of production and characteristics of the ceramic and ceramic composite bodies disclosed and claimed in these commonly owned applications, the entire disclosures of the above-mentioned applications are hereby incorporated by reference. Moreover, the second or additional body of the instant invention also includes metal matrix composites and structural bodies of metal such as high temperature metals, corrosion resistant metals, erosion resistant metals, weldable metals, solderable metals, etc. Accordingly, a second or additional body includes a virtually unlimited number of bodies.

"Spontaneous Infiltration", as used herein, means that the infiltration of matrix metal into the permeable mass of filler or preform occurs without requirement for the application of pressure or vacuum (whether externally applied or internally created).

The present invention relates to forming a macrocomposite body for use as an electronic package or container, a portion of which macrocomposite body comprises a metal matrix composite body which has been formed by spontaneously infiltrating a filler material or preform with molten matrix metal.

A complex composite body which is to be formed into an electronic package or container according to the invention is produced by forming a metal matrix composite in contact with at least one second or additional body. Specifically, a metal matrix composite body is produced by spontaneously infiltrating a permeable mass of filler material or a preform with molten matrix metal. An infiltration enhancer and/or infiltration enhancer precursor and/or an infiltrating atmosphere are in communication with the filler material or preform, at least at some point during the process, which permits molten matrix metal to spontaneously infiltrate the filler material or preform.

In a preferred embodiment of the invention, an infiltration enhancer may be supplied directly to at least one of the preform (or filler material) and/or matrix metal, and/or infiltrating atmosphere. Ultimately, at least during the spontaneous infiltration, the infiltration enhancer should be located in at least a portion of the filler material or preform.

In a first preferred embodiment for forming a macrocomposite body, the amount of matrix metal supplied to infiltrate is in excess of that needed to infiltrate. In other words, matrix metal is provided in a quantity which is greater than that which is needed to infiltrate completely the filler material or preform such that residual or excess matrix metal (e.g., that matrix metal which was not utilized to infiltrate the filler material or preform) is intimately bonded to the filler material or preform which has been infiltrated.

In another preferred embodiment, a filler material or p reform is placed into contact with another body such as a ceramic or metal (the metal having a composition which is similar to or different from the composition of the matrix metal, and, in a preferred embodiment, being solderable or weldable by conventional techniques), and molten matrix metal is induced to spontaneously infiltrate the filler material or preform up to the second body of, for example, ceramic or metal and becomes intimately bonded to the second body thus forming a macrocomposite comprising a metal matrix composite body bonded to a second body such as another ceramic or metal. For example, the aforementioned another or second body could comprise a metal which is similar (or different) in composition to the matrix metal, thereby facilitating a bond between the formed metal matrix composite and the second body. This technology provides benefit to the electronic packages art wherein it is required for a ceramic chip to be hermetically sealed within a package or container. Specifically, the package or container can be formed by spontaneously infiltrating a filler material or preform, a portion of which (e.g., the portion which is to be bonded to a lid) is in contact with the second body, said second body comprising a weldable or solderable material (e.g., a metal). Thus, the resulting macrocomposite body comprises a metal matrix composite package intimately bonded to a lip (e.g., a metal lip) which is, for example, weldable or solderable, by conventional techniques, to an electronic package cover or lid. The material which is chosen as the lip should be selected based upon its ability to be attached, by conventional techniques, to a later applied lid. Acceptable materials for use as a lip include those materials which may have a relatively low thermal conductivity and a relatively high electrical conductivity. For example, some suitable materials for use as lips for electronic packages made by techniques according to the present invention include KOVAR® commercial alloys, INCONEL® commercial alloys, copper alloys and titanium alloys. Still further, it is possible that the lip could comprise a metal matrix composite body. For example, the lip could comprise an alumina reinforced aluminum composite integrally bonded to a metal matrix composite. The lip should also not be detachable from the metal matrix composite body during use of the body as an electronic package or container. Thus, the lip should be chemically and physically compatible with the metal matrix composite body.

Still further, the second body could comprise an electrically insulating sheath (or sheaths) which is disposed within at least one wall portion (e.g., serves as an insulating conduit through a wall) of a metal matrix composite package or container. The electrically insulating sheath or conduit may be substantially completely nonreactive or the sheath may be at least partially chemically reactive with the metal matrix composite during formation thereof (e.g., reactive with molten matrix metal). Electrical lead wires may be contained within the insulating sheath and may be attached to any electronic components (e.g., a ceramic chip) contained within the electronic package. This arrangement provides for electrical connection between the ceramic chip within a hermetically sealable package and an external electronic circuit. Further, as discussed above, the thermal expansion coefficients of the metal matrix composite package and the electrically insulating sheath may be chosen to provide for at least a compression or shrink fit of the metal matrix composite with the electrically insulating sheath (e.g., the thermal expansion coefficient of the metal matrix composite body may be greater than the thermal expansion coefficient of the electrical insulating sheath). Thus, the present invention provides a method for hermetically bonding, in situ (i.e., during formation of the metal matrix composite electronic package), an insulating sheath or conduit within at least one wall of an electronic package or container. The bonding may occur due to: (1) a mechanical bond (e.g., a shrink or compression fit) between the metal matrix composite and the insulating sheath; (2) a physical bond (e.g., a wetting of the insulating sheath by the matrix metal during formation of the metal matrix composite body) between the metal matrix composite and the insulating sheath; (3) at least a partial chemical reaction between the metal matrix composite body and the insulating sheath (e.g., a reaction between molten matrix metal and the insulating sheath); and (4) some combination of the three aforementioned phenomena.

Still further, the above-discussed concepts of forming a weldable or solderable lip on a net or near-net shaped metal matrix composite package or container and forming an electrically insulating conduit which is integral with at least one wall of a metal matrix composite box or container, could be combined. The combination of these novel concepts results in a novel electronic package or container which has the capability of being hermetically sealed (i.e., isolating the contents of box or container from the external environment). Moreover, the spontaneous infiltration technique for forming the hermetically sealable box or container is a significant advancement in the art. Specifically, the ability to form a weldable lip which is integral with a metal matrix composite box and the ability to form an electrically insulating conduit, all in a single step during formation of the net or near-net shaped metal matrix composite box or container, has not heretofore been known in the art.

Further, it is possible for electrical wires or leads to be placed into the electrically insulating conduit prior to the metal matrix composite body being formed therearound. In this instance, the wires could be made of a material which, when heated to the temperature at which spontaneous infiltration occurs, would flow (e.g., be at least partially deformable) a sufficient amount so as to provide for a hermetic seal within at least a portion of the electrically insulating conduit. Alternatively, a second material in addition to the wire could be placed within the electrically insulating conduit. This second metal could be a material which, when heated to the temperature at which spontaneous infiltration occurs, flows, grows, etc., into any gap or space which exists between the wire and the electrically insulating conduit, thereby forming a hermetic seal within at least a portion of the electrically insulating conduit. Examples of such materials would be glasses, metals, polymers, etc. Moreover, such materials could be introduced into the electrically insulating conduit as, for example, a powder mixture, a coating on the conduit wall or on the wire, etc.

In a further preferred embodiment, a filler material or preform is placed into contact with a second body such as another ceramic body or metal, and molten matrix metal is induced to spontaneously infiltrate the filler material or preform up to a contact point between the filler material or preform and the second body. The formed metal matrix composite body will be intimately bonded to the second body. Moreover, additional matrix metal can be supplied such that it is present in a quantity which is greater than that required to spontaneously infiltrate the filler material or preform. Accordingly, a macrocomposite body is formed comprising excess matrix metal which is intimately bonded to a metal matrix composite body which is intimately bonded to a second body such as a ceramic or ceramic composite body.

In a further preferred embodiment, a macrocomposite body may be formed by coating at least a portion, or substantially all, of a surface of a formed metal matrix composite body. The coating may bond with at least a portion of the metal matrix composite (e.g., a bond may form between metal and/or filler material contained in the metal matrix composite and the coating). A coating may be created by a number of traditional or conventional means including chemical, physical and/or mechanical means. More specifically, the coating may be provided by such methods as electroplating, electroless deposition, chemical vapor deposition, physical vapor deposition, sputtering, etc. The coating material may comprise, for example, a metal (e.g., Al, Au, Cr, Cu, Ni, Sn, Ti, W, In), an organic metal (e.g., an epoxy or resin) or any other material(s) which impart(s) desired properties to the macrocomposite. With respect to the electronic packaging art, a coating or coatings may be provided on at least a portion of the surface of the metal matrix composite body to facilitate bonding of electrical leads directly to the electronic package (e.g., by welding or soldering); facilitate attaching a body to the electronic package; create a protective layer on the electronic package to enhance the corrosion resistance, erosion resistance, etc., of the package; and/or may function as an electric ground for the electronic chip, etc. Examples of coating materials are Al, Au, Cr, Cu, Ni, Sn, Ti, W, In, epoxy resin, etc., and mixtures thereof.

In a further preferred embodiment, it may be desirable for the formed metal matrix composite and/or the macrocomposite body to be machinable. For example, even though a metal matrix composite and/or macrocomposite body can be formed to net or near-net shape, it may be desirable for at least a portion of the formed body to be machinable by conventional techniques. Specifically, it may be possible to machine, such as by, e.g., drilling, grinding, thermoforming, etc., the formed body to meet a desired need. With respect to the electronic packaging art, at least a portion of a metal matrix composite or macrocomposite body may be tailored by, e.g., drilling or thermoforming, to tailor the body to a specific application.

In the above-discussed preferred embodiments, a metal matrix composite body may be formed as either an exterior or interior surface, or both, on a substrate of matrix metal. Moreover, the metal matrix composite surface may be of a selected or predetermined thickness with respect to the size of the matrix metal substrate. The techniques of the present invention enable the preparation of thick wall or thin wall metal matrix composite structures in which the relative volume of matrix metal providing the metal matrix composite surface is substantially greater than or less than the volume of metal substrate. Still further, the metal matrix composite body which may be either an exterior or interior surface or both, may be also bonded to a second material such as a ceramic or metal, thereby providing for a significant number of combinations of bonding between metal matrix composite, and/or excess matrix metal and/or a second body such a ceramic or metal body.

Accordingly, the present invention can be utilized to meet or satisfy a large number of industrial demands thereby proving the efficacy of the present invention.

In order to form the macrocomposites of the present invention, a metal matrix composite body must be formed by the spontaneous infiltration of a matrix metal into a mass of filler material or a preform. In order to effect spontaneous infiltration of the matrix metal into the filler material or preform, an infiltration enhancer should be provided to the spontaneous system. An infiltration enhancer could be formed from an infiltration enhancer precursor which could be provided (1) in the matrix metal; and/or (2) in the filler material or preform; and/or (3) from the infiltrating atmosphere and/or (4)from an external source into the spontaneous system. Moreover, rather than supplying an infiltration enhancer precursor, an infiltration enhancer may be supplied directly to at least one of the filler material or preform, and/or matrix metal, and/or infiltrating atmosphere. Ultimately, at least during the spontaneous infiltration, the infiltration enhancer should be located in at least a portion of the filler material or preform.

In a preferred embodiment, it is possible that the infiltration enhancer precursor can be at least partially reacted with the infiltrating atmosphere such that infiltration enhancer can be formed in at least a portion of the filler material or preform prior to or substantially simultaneously with contacting the preform with molten matrix metal (e.g., if magnesium was the infiltration enhancer precursor and nitrogen was the infiltrating atmosphere, the infiltration enhancer could be magnesium nitride which would be located in at least a portion of the filler material or preform).

An example of a matrix metal/infiltration enhancer precursor/infil-trating atmosphere system is the aluminum/magnesium/nitrogen system. Specifically, an aluminum matrix metal can be contained within a suitable refractory vessel which, under the process conditions, does not react with the aluminum matrix metal when the aluminum is made molten. A filler material containing or being exposed to magnesium, and being exposed to, at least at some point during the processing, a nitrogen atmosphere, can then be contacted with the molten aluminum matrix metal. The matrix metal will then spontaneously infiltrate the filler material or preform.

Moreover, rather than supplying an infiltration enhancer precursor, an infiltration enhancer may be supplied directly to at least one of the preform, and/or matrix metal, and/or infiltrating atmosphere. Ultimately, at least during the spontaneous infiltration, the infiltration enhancer should be located in at least a portion of the filler material or preform.

Under the conditions employed in the method of the present invention, in the case of an aluminum/magnesium/nitrogen spontaneous infiltration system, the filler material or preform should be sufficiently permeable to permit the nitrogen-containing gas to penetrate or permeate the filler material or preform at some point during the process and/or contact the molten matrix metal. Moreover, the permeable filler material or preform can accommodate infiltration of the molten matrix metal, thereby causing the nitrogen-permeated filler material or preform to be infiltrated spontaneously with molten matrix metal to form a metal matrix composite body and/or cause the nitrogen to react with an infiltration enhancer precursor to form infiltration enhancer in the filler material or preform and thereby resulting in spontaneous infiltration. The extent or rate of spontaneous infiltration and formation of the metal matrix composite will vary with a given set of process conditions, including magnesium content of the aluminum alloy, magnesium content of the filler material or preform, amount of magnesium nitride in the filler material or preform, the presence of additional alloying elements (e.g., silicon, iron, copper, manganese, chromium, zinc, and the like), average size of the filler material (e.g., particle diameter), surface condition and type of filler material, nitrogen concentration of the infiltrating atmosphere, time permitted for infiltration and temperature at which infiltration occurs. For example, for infiltration of the molten aluminum matrix metal to occur spontaneously, the aluminum can be alloyed with at least about 1% by weight, and preferably at least about 3% by weight, magnesium (which functions as the infiltration enhancer precursor), based on alloy weight. Auxiliary alloying elements, as discussed above, may also be included in the matrix metal to tailor specific properties thereof. (Additionally, the auxiliary alloying elements may affect the minimum amount of magnesium required in the matrix aluminum metal to result in spontaneous infil-tration of the filler material or preform.) Loss of magnesium from the spontaneous system due to, for example, volatilization should not occur to such an extent that no magnesium was present to form infiltration enhancer. Thus, it is desirable to utilize a sufficient amount of initial alloying elements to assure that spontaneous infiltration will not be adversely affected by volatilization. Still further, the presence of magnesium in both of the filler material or preform and matrix metal or the filler material or preform alone may result in a reduction in the required amount of magnesium to achieve spontaneous infiltration (discussed in greater detail later herein).

The volume percent of nitrogen in the nitrogen atmosphere also affects formation rates of the metal matrix composite body. Specifically, if less than about 10 volume percent of nitrogen is present in the atmosphere, very slow or little spontaneous infiltration will occur. It has been discovered that it is preferable for at least about 50 volume percent of nitrogen to be present in the atmosphere, thereby resulting in, for example, shorter infiltration times due to a much more rapid rate of infiltration. The infiltrating atmosphere (e.g., a nitrogen-containing gas) can be supplied directly to the filler material or preform and/or matrix metal, or it may be produced or result from a decomposition of a material.

The minimum magnesium content required for the molten matrix metal to infiltrate a filler material or preform depends on one or more variables such as the processing temperature, time, the presence of auxiliary alloying elements such as silicon or zinc, the nature of the filler material, the location of the magnesium in one or more components of the spontaneous system, the nitrogen content of the atmosphere, and the rate at which the nitrogen atmosphere flows. Lower temperatures or shorter heating times can be used to obtain complete infiltration as the magnesium content of the alloy and/or preform is increased. Also, for a given magnesium content, the addition of certain auxiliary alloying elements such as zinc permits the use of lower temperatures. For example, a magnesium content of the matrix metal at the lower end of the operable range, e.g., from about 1 to 10 weight percent, may be used in conjunction with at least one of the following: an above-minimum processing temperature, a high nitrogen concentration, or one or more auxiliary alloying elements. When no magnesium is added to the filler material or preform, alloys containing from about 3 to 10 weight percent magnesium are preferred on the basis of their general utility over a wide variety of process conditions, with at least about 5 percent being preferred when lower temperatures and shorter times are employed. Magnesium contents in excess of about 10 percent by weight of the aluminum alloy may be employed to moderate the temperature conditions required for infiltration. The magnesium content may be reduced when used in conjunction with an auxiliary alloying element, but these elements serve an auxiliary function only and are used together with at least the above-specified minimum amount of magnesium. For example, there was substantially no infiltration of nominally pure aluminum alloyed only with 10 percent silicon at 1000° C. into a bedding of 500 grit, 39 Crystolon (99 percent pure silicon carbide from Norton Co.). However, in the presence of magnesium, silicon has been found to promote the infiltration process. As a further example, the amount of magnesium varies if it is supplied exclusively to the preform or filler material. It has been discovered that spontaneous infiltration will occur with a lesser weight percent of magnesium supplied to the spontaneous system when at least some of the total amount of magnesium supplied is placed in the preform or filler material. It may be desirable for a lesser amount of magnesium to be provided in order to prevent the formation of undesirable intermetallics in the metal matrix composite body. In the case of a silicon carbide preform, it has been discovered that when the preform is contacted with an aluminum matrix metal, the preform containing at least about 1% by weight magnesium and being in the presence of a substantially pure nitrogen atmosphere, the matrix metal spontaneously infiltrates the preform. In the case of an alumina preform, the amount of magnesium required to achieve acceptable spontaneous infiltration is slightly higher. Specifically, it has been found that when an alumina preform is contacted with a similar aluminum matrix metal, at about the same temperature as the aluminum that infiltrated into the silicon carbide preform, and in the presence of the same nitrogen atmosphere, at least about 3% by weight magnesium may be required to achieve similar spontaneous infiltration to that achieved in the silicon carbide preform discussed immediately above.

It is also noted that it is possible to supply to the spontaneous system infiltration enhancer precursor and/or infiltration enhancer on a surface of the alloy and/or on a surface of the preform or filler material and/or within the preform or filler material prior to infiltrating the matrix metal into the filler material or preform (i.e., it may not be necessary for the supplied infiltration enhancer or infiltration enhancer precursor to be alloyed with the matrix metal, but rather, simply supplied to the spontaneous system). If the magnesium was applied to a surface of the matrix metal, it may be preferred that said surface should be the surface which is closest to, or preferably in contact with, the permeable mass of filler material or vice versa; or such magnesium could be mixed into at least a portion of the preform or filler material. Still further, it is possible that some combination of surface application, alloying and placement of magnesium into at least a portion of the preform could be used. Such combination of applying infiltration enhancer(s) and/or infiltration enhancer precursor(s) could result in a decrease in the total weight percent of magnesium needed to promote infiltration of the matrix aluminum metal into the preform, as well as achieving lower temperatures at which infiltration can occur. Moreover, the amount of undesirable intermetallics formed due to the presence of magnesium could also be minimized.

The use of one or more auxiliary alloying elements and the concentration of nitrogen in the surrounding gas also affects the extent of nitriding of the matrix metal at a given temperature. For example, auxiliary alloying elements such as zinc or iron included in the alloy, or placed on a surface of the alloy, may be used to reduce the infiltration temperature and thereby decrease the amount of nitride formation, whereas increasing the concentration of nitrogen in the gas may be used to promote nitride formation.

The concentration of magnesium in the alloy, and/or placed onto a surface of the alloy, and/or combined in the filler or preform material, also tends to affect the extent of infiltration at a given temperature. Consequently, in some cases where little or no magnesium is contacted directly with the preform or filler material, it may be preferred that at least about three weight percent magnesium be included in the alloy. Alloy contents of less than this amount, such as one weight percent magnesium, may require higher process temperatures or an auxiliary alloying element for infiltration. The temperature required to effect the spontaneous infiltration process of this invention may be lower: (1) when the magnesium content of the alloy alone is increased, e.g. to at least about 5 weight percent; and/or (2) when alloying constituents are mixed with the permeable mass of filler material or preform; and/or (3) when another element such as zinc or iron is present in the aluminum alloy. The temperature also may vary with different filler materials. In general, spontaneous and progressive infiltration will occur at a process temperature of at least about 675° C., and preferably a process temperature of at least about 750° C.–800° C. Temperatures generally in excess of 1200° C. do not appear to benefit the process, and a particularly useful temperature range has been found to be from about 675° C. to about 1200° C. However, as a general rule, the spontaneous infiltration temperature is a temperature which is above the melting point of the matrix metal but below the volatilization temperature of the matrix metal. Moreover, the spontaneous infiltration temperature should be below the melting point of the filler material or preform unless the filler material or preform is provided with a means of support which will maintain the porous geometry of the filler material or preform during the infiltration step. Such a support means could comprise a coating on the filler particles or preform passageways, or certain constituents of the mass of filler or preform could be non-molten at the infiltration temperature while other constituents were molten. In this latter embodiment, the non-molten constituents could support the molten constituents and maintain adequate porosity for spontaneous infiltration of the filler material or preform. Still further, as temperature is increased, the tendency to form a reaction product between the matrix metal and infiltrating atmosphere increases (e.g., in the case of aluminum matrix metal and a nitrogen infiltrating atmosphere, aluminum nitride may be formed). Such reaction product may be desirable or undesirable based upon the intended application of the metal matrix composite body. Additionally, electric resistance heating is typically used to achieve the infiltrating temperatures. However, any heating means which can cause the matrix metal to become molten and does not adversely affect spontaneous infiltration, is acceptable for use with the invention.

In the present method, for example, a permeable filler material or preform comes into contact with molten aluminum in the presence of, at least some time during the process, a nitrogen-containing gas. The nitrogen-containing gas may be supplied by maintaining a continuous flow of gas into contact with at least one of the filler material or the preform and/or molten aluminum matrix metal. Although the flow rate of the nitrogen-containing gas is not critical, it is preferred that the flow rate be sufficient to compensate for any nitrogen lost from the atmosphere due to nitride formation in the alloy matrix, and also to prevent or inhibit the incursion of air which can have an oxidizing effect on the molten metal.

The method of forming a metal matrix composite is applicable to a wide variety of filler materials, and the choice of filler materials will depend on such factors as the matrix alloy, the process conditions, the reactivity of the molten matrix alloy with the filler material, and the properties sought for the final composite product. For example, when aluminum is the matrix metal, suitable filler materials include (a) oxides, e.g. alumina; (b) carbides, e.g. silicon carbide; (c) borides, e.g. aluminum dodecaboride, and (d) nitrides, e.g. aluminum nitride. If there is a tendency for the filler material to react with the molten aluminum matrix metal, this might be accommodated by minimizing the infiltration time and temperature or by providing a non-reactive coating on the filler. The filler material may comprise a substrate, such as carbon or other non-ceramic material, bearing a ceramic coating to protect the substrate from attack or degradation. Suitable ceramic coatings include oxides, carbides, borides and nitrides. Ceramics which are preferred for use in the present method include alumina and silicon carbide in the form of particles, platelets, whiskers and fibers. The fibers can be discontinuous (in chopped form) or in the form of continuous filament, such as multifilament tows. Further, the filler material or preform may be homogeneous or heterogeneous.

It also has been discovered that certain filler materials exhibit enhanced infiltration relative to filler materials by having a similar chemical composition. For example, crushed alumina bodies made by the method disclosed in U.S. Pat. No. 4,713,360, entitled "Novel Ceramic Materials and Methods of Making Same", which issued on Dec. 15, 1987, in the names of Marc S. Newkirk et al., exhibit desirable infiltration properties relative to commercially available alumina products. Moreover, crushed alumina bodies made by the method disclosed in Commonly Owned U.S. Pat. No. 4,851,375, issued Jul. 25, 1989, from U.S. patent application Ser. No. 819,397 entitled "Composite Ceramic Articles and Methods of Making Same", in the names of Marc S. Newkirk et al, also exhibit desirable infiltration properties relative to commercially available alumina products. The subject matter of each of the issued Patent is herein expressly incorporated by reference. Thus, it has been discovered that complete infiltration of a permeable mass of ceramic material can occur at lower infiltration temperatures and/or lower infiltration times by utilizing a crushed or comminuted body produced by the method of the aforementioned U.S. Patents.

The size and shape of the filler material can be any that may be required to achieve the properties desired in the composite. Thus, the material may be in the form of particles, whiskers, platelets or fibers since infiltration is not restricted by the shape of the filler material. Other shapes such as spheres, tubules, pellets, refractory fiber cloth, and the like may be employed. In addition, the size of the material does not limit infiltration, although a higher temperature or longer time period may be needed for complete infiltration of a mass of smaller particles than for larger particles. Further, the mass of filler material (shaped into a preform) to be infiltrated should be permeable (i.e., permeable to molten matrix metal and to the infiltrating atmosphere). In the case of aluminum alloys, the infiltrating atmosphere may comprise a nitrogen-containing gas.

The method of forming metal matrix composites according to the present invention, not being dependent on the use of pressure to force or squeeze molten matrix metal into a preform or a mass of filler material, permits the production of substantially uniform metal matrix composites having a high volume fraction of filler material and low porosity. Higher volume fractions of filler material may be achieved by using a lower porosity initial mass of filler material. Higher volume fractions also may be achieved if the mass of filler is compacted or otherwise densified provided that the mass is not converted into either a compact with close cell porosity or into a fully dense structure that would prevent infiltration by the molten alloy (i.e., a structure having insufficient porosity for spontaneous infiltration to occur).

It has been observed that for aluminum infiltration and matrix formation around a ceramic filler, wetting of the ceramic filler by the aluminum matrix metal may be an important part of the infiltration mechanism. Moreover, at low processing temperatures, a negligible or minimal amount of metal nitriding occurs resulting in a minimal discontinuous phase of aluminum nitride dispersed in the metal matrix. However, as the upper end of the temperature range is approached, nitridation of the metal is more likely to occur. Thus, the amount of the nitride phase in the metal matrix can be controlled by varying the processing temperature at which infiltration occurs. The specific process temperature at which nitride formation becomes more pronounced also varies with such factors as the matrix aluminum alloy used and its quantity relative to the volume of filler or preform, the filler material to be infiltrated, and the nitrogen concentration of the infiltrating atmosphere. For example, the extent of aluminum nitride formation at a given process temperature is believed to increase as the ability of the alloy to wet the filler decreases and as the nitrogen concentration of the atmosphere increases.

It is therefore possible to tailor the constituency of the metal matrix during formation of the composite to impart certain characteristics to the resulting product. For a given system, the process conditions can be selected to control the nitride formation. A composite product containing an aluminum nitride phase will exhibit certain properties which can be favorable to, or improve the performance of, the product. Further, the temperature range for spontaneous infiltration with an aluminum alloy may vary with the ceramic material used. In the case of alumina as the filler material, the temperature for infiltration should preferably not exceed about 1000° C. if it is desired that the ductility of the matrix be not reduced by the significant formation of nitride. However, temperatures exceeding 1000° C. may be employed if it is desired to produce a composite with a less ductile and stiffer matrix. To infiltrate silicon carbide, higher temperatures of about 1200° C. may be employed since the aluminum alloy nitrides to a lesser extent, relative to the use of alumina as filler, when silicon carbide is employed as a filler material.

Moreover, it is possible to use a reservoir of matrix metal to assure complete infiltration of the filler material and/or to supply a second metal which has a different composition from the first source of matrix metal. Specifically, in some cases it may be desirable to utilize a matrix metal in the reservoir which differs in composition from the first source of matrix metal. For example, if an aluminum alloy is used as the first source of matrix metal, then virtually any other metal or metal alloy which was molten at the processing temperature could be used as the reservoir metal. Molten metals frequently are very miscible with each other which would result in the reservoir metal mixing with the first source of matrix metal so long as an adequate amount of time is given for the mixing to occur. Thus, by using a reservoir metal which is different in composition than the first source of matrix metal, it is possible to tailor the properties of the metal matrix to meet various operating requirements and thus tailor the properties of the metal matrix composite.

A barrier means may also be utilized in combination with the present invention. Specifically, the barrier means for use with this invention may be any suitable means which Interferes, inhibits, prevents or terminates the migration, movement, or the like, of molten matrix alloy (e.g., an aluminum alloy) beyond the defined surface boundary of the filler material. Suitable barrier means may be any material, compound, element, composition, or the like, which, under the process conditions of this invention, maintains some integrity, is not volatile and preferably is permeable to the gas used with the process as well as being capable of locally inhibiting, stopping, interfering with, preventing, or the like, continued infiltration or any other kind of movement beyond the defined surface boundary of the ceramic filler.

Suitable barrier means includes materials which are substantially non-wettable by the migrating molten matrix alloy under the process conditions employed. A barrier of this type appears to exhibit little or no affinity for the molten matrix alloy, and movement beyond the defined surface boundary of the filler material or preform is prevented or inhibited by the barrier means. The barrier reduces any final machining or grinding that may be required of the metal matrix composite product. As stated above, the barrier preferably should be permeable or porous, or rendered permeable by puncturing, to permit the gas to contact the molten matrix alloy.

Suitable barriers particularly useful for aluminum matrix alloys are those containing carbon, especially the crystalline allotropic form of carbon known as graphite. Graphite is essentially non-wettable by the molten aluminum alloy under the described process conditions. A particular preferred graphite is a graphite tape product that is sold under the trademark GRAFOZL®, registered to Union Carbide. This graphite tape exhibits sealing characteristics that prevent the migration of molten aluminum alloy beyond the defined surface boundary of the filler material. This graphite tape is also resistant to heat and is chemically inert. GRAFOZL® graphite material is flexible, compatible, conformable and resilient. It can be made into a variety of shapes to fit any barrier application. However, graphite barrier means may be employed as a slurry or paste or even as a paint film around and on the boundary of the filler material or preform. GRAFOZL® is particularly preferred because it is in the form of a flexible graphite sheet. In use, this paper-like graphite is simply formed around the filler material or preform.

Other preferred barrier(s) for aluminum metal matrix alloys nitrogen are the transition metal borides (e.g., titanium diboride ($TiB_2$)) which are generally non-wettable by the molten aluminum metal alloy under certain of the process conditions employed using this material. With a barrier of this type, the process temperature should not exceed about 875° C., for otherwise the barrier material becomes less efficacious and, in fact, with increased temperature infiltration into the barrier will occur. The transition metal borides are typically in a particulate form (1–30 microns). The barrier materials may be applied as a slurry or paste to the boundaries of the permeable mass of ceramic filler material which preferably is preshaped as a preform.

Other useful barriers for aluminum metal matrix alloys in nitrogen include low-volatility organic compounds applied as a film or layer onto the external surface of the filler material or preform. Upon firing in nitrogen, especially at the process conditions of this invention, the organic compound decomposes leaving a carbon soot film. The organic compound may be applied by conventional means such as painting, spraying, dipping, etc.

Moreover, finely ground particulate materials can function as a barrier so long as infiltration of the particulate material would occur at a rate which is slower than the rate of infiltration of the filler material.

Thus, the barrier means may be applied by any suitable means, such as by covering the defined surface boundary with a layer of the barrier means. Such a layer of barrier means may be applied by painting, dipping, silk screening, evaporating, or otherwise applying the barrier means in liquid, slurry, or paste form, or by sputtering a vaporizable barrier means, or by simply depositing a layer of a solid particulate barrier means, or by applying a solid thin sheet or film of barrier means onto the defined surface boundary. With the barrier means in place, spontaneous infiltration substantially terminates when the infiltrating matrix metal reaches the defined surface boundary and contacts the barrier means.

Through use of the techniques described above, the present invention provides a technique whereby a shaped metal matrix composite can be bonded or integrally attached to at least one second or additional body. This body may comprise: a ceramic matrix body; a ceramic matrix composite body, i.e., a ceramic matrix embedding filler material; a body of metal; a metal matrix composite; and/or any combination of the above listed materials. The final product produced by the present invention is a macrocomposite which comprises at least one metal matrix composite, formed by the spontaneous infiltration of a mass of filler material or a preform with a matrix metal, which is bonded or integrally attached to at least one body comprised of at least one of the materials listed above. Thus, the final product of the present invention can comprise a virtually limitless number of permutations and combinations of spontaneously infiltrated metal matrix composites which are bonded on one or more surfaces to at least one body comprised of at least one of the materials listed above.

In addition to forming a strong bond or integral attachment between the spontaneously infiltrated metal matrix composite and the second or additional body or bodies, the instant invention also provides a technique whereby the second or additional body or bodies may be placed in compression by the metal matrix composite. Alternatively, the metal matrix composite could be placed in compression by the second or additional body or bodies. Thus, the metal matrix composite may at least partially contain the other body and, if the coefficient of thermal expansion of the metal matrix composite is greater than the coefficient of thermal expansion of the second or additional body or bodies so contained, the metal matrix composite will place the contained body under compression upon cooling from infiltration temperature. Alternatively, the metal matrix composite body could be formed at least partially within a second or additional body having a higher coefficient of thermal expansion than the metal matrix composite body. Thus, upon cooling, the portion of the metal matrix composite which is contained within the second or additional body will be placed under compression by the second or additional body.

The technique of the instant invention can be adapted to produce a continuous macrocomposite chain of virtually any length. Specifically, the process of the instant invention could be adapted to a continuous production method where, for example, a continuous stream of raw materials may be passed through a furnace which heats the matrix metal to a temperature above its melting point; said matrix metal being in a molten state for a sufficient time for said molten matrix metal to infiltrate a predetermined volume of filler material or preform; and thereafter, as the infiltrated filler material is cooled (e.g., removed from the furnace) said matrix metal cools to solidification temperature, thereby having a metal matrix composite. Through the utilization of this continuous process, a metal matrix composite could be bonded to a second material which would be bonded to another metal matrix composite, which would be bonded to another second material, and so on. The molten matrix metal could be supplied in situ or could be continuously supplied to the furnace through a second stream which is supplied from, for example, a reservoir of matrix metal. In addition, a layer of barrier material, such as GRAFOIL® (described herein), could be interposed between predetermined segments of the macrocomposite chain, thereby terminating the chain at the barrier layer.

The integral attachment or bonding of the metal matrix composite to the second or additional body can be enhanced through the use of mechanical bonding techniques. Specifically, the surface of one or both of the metal matrix composite or the second or additional body can have notches, holes, slots, or any other surface irregularities which are matched with the corresponding inverse shape on the surface of the body to which the bond or attachment is to be made. These inversely matching irregularities can create a mechanical bond in addition to any chemical bond which may be produced between the metal matrix composite and the second or additional body. The combination of these bonds or attachment mechanisms can produce a much stronger bond or attachment than either bond or attachment mechanism separately.

The products produced by the technique of the instant invention will be useful for industrial applications requiring surfaces which must withstand high temperature, abrasion, corrosion, erosion, thermal stress, friction, and/or many other stresses. Thus, the process disclosed and claimed in the instant application will be useful in the production of virtually any industrial product which can have its performance enhanced through the use of surfaces comprised of metal matrix composites, ceramic matrix composites, metals, or combinations of the above. By providing techniques for creating macrocomposites having layers of materials which differ in their properties and characteristics, a wealth of industrial applications which heretofore were thought impractical or impossible to satisfy through the use of conventional materials, may now be satisfied through proper engineering of the macrocomposites produced by the process of the present invention. Particularly, industrial applications which require one section of a body to withstand a certain set of conditions and another part of the body to withstand a different set of conditions may now be satisfied through use of two or more different types of materials which are formed into a macrocomposite having the shape of the desired industrial piece. One exemplary use of macrocomposites produced according to the present invention is in the electronic packaging art, wherein it is required to hermetically seal a chip within a box or container. The box or container can be made to net or near-net shape from a metal matrix composite having: (1) a thermal expansion coefficient which is similar (e.g., close enough so is not to result in thermal fatigue, under normal operating conditions, of the bond between the ceramic chip and the box or container) to that of the ceramic chip; (2) an acceptable heat transfer so as to provide for the dissipation of any heat generated by the ceramic chip; (3) a relatively lowdensity; (4) a weldable lip or layer due to the presence of the layer or lip of metal on a section of the metal matrix composite body, thereby providing for a hermetic sealing of the chip within the box or container; (5) an electrically insulating sheath or conduit for housing electrical conductors or wires; and/or (6) a coating (e.g., a metal) on at least a portion of the surface of the metal matrix composite to enhance the properties of the electronic package.

Moreover, through the use of the preform and barrier techniques described herein, net or near net shape macrocomposites can be formed which require little or no final machining after the spontaneous infiltration step.

Thus, the products produced by the method of the present invention have a virtually limitless industrial potential and may help to satisfy many of the most challenging engineering requirements existing in the materials world today.

Various demonstrations of the present invention are included in the Examples immediately following. However, these Examples should be considered as being illustrative and should not be construed as limiting the scope of the invention as defined in the appended claims.

EXAMPLE 1

The following Example demonstrates that it is possible to produce by a spontaneous infiltration technique a macrocomposite comprising an electrically insulating ceramic structure embedded in a metal matrix composite and that said embedded structure might be arranged to conform to any specified pattern.

As shown in FIG. 1, a mold 180 having a trapezoidal cross-section with a closed end 181 measuring about 3 inches (76 mm)×3 inches (76 mm) and an open end 182 measuring about 3.75 inches (95 mm)×3.75 inches (95 mm)

and a height of about 2.5 inches (64 mm) was made from 14 gauge carbon steel. The inner surface of the mold 180 was coated with a graphite mixture comprising about 1.5 parts by volume ethanol from Pharmco Products, Inc., of Bayonne, N.J., and about 1 part by volume DAG®–154 colloidal graphite from Acheson Colloids, Port Huron, Mich. At least 3 coats of the graphite mixture were applied with an air brush onto the inner surface of the container to form a coating 183. Each coat of the graphite mixture was permitted to dry before a subsequent coat was applied. The mold was placed into a resistance heated air atmosphere furnace set at about 380° C. for about 2 hours to set the colloidal graphite coating.

A filler material mixture 184 was made by mixing in a plastic jar on a ball mill for approximately 1 hour, approximately 600 grams of a mixture consisting of about 19% by weight 500 grit silicon carbide designated 39 CRYSTOLON®, 78% by weight 220 grit silicon carbide designated 39 CRYSTOLON®, both from the Norton Co., Worcester, Mass., and about 3% by weight –325 mesh magnesium powder from Reade Manufacturing Co., Lakehurst, N.J. This mixing was supplemented by an additional 10 minutes of hand shaking the plastic jar.

The bores of 12 thermocouple insulating sheaths 185 having a length of about 1.5 inches (38 mm) were filled with –325 mesh calcium carbonate from Huber Corporation, Quincy, Ill. Specifically, the bores at both ends of five round double bore thermocouple insulating sheaths 185 or conduits having an outer diameter of about 0.062 inches (1.6 mm) and two inner diameters each about 0.016 inches (0.4 mm) and consisting of MV20 mullite from the McDanel Refractory Corp., Beaver Falls, Pa.; and the bores at both ends of two round double bore thermocouple insulating sheaths 185 or conduits having an outer diameter of about 0.94 inches (2.4 mm) and two inner diameters of about 0.025 inches (0.6 mm) and consisting of 998 alumina from the McDanel Refractory Co., Beaver Falls, Pa.; and the bores at both ends of five round single bore thermocouple insulating sheaths 185 or conduits having an outer diameter of about 0.03 inches (0.79 mm) and inner diameter of about 0.02 inches (0.51 mm) and consisting of about 998 alumina from the McDanel Refractory Co., Beaver Falls, Pa., were jabbed into loose –325 mesh calcium carbonate contained in a dish until about a ¼ inch (6.4 mm) of the bore or bores at each end of the thermocouple sheaths 185 were filled with the calcium carbonate.

A layer of filler material mixture 184 was poured into the bottom of the colloidal graphite coated mold 180 to the depth of about ¾ inch (19 mm). Each of the 12 thermocouple sheaths 185 comprising 5 mullite double bore thermocouple insulating sheaths, 2 alumina double bore insulating sheaths, and 5 single bore alumina insulating sheaths were placed individually into the filler material mixture 184 in a horizontal position. After each thermocouple sheath 185 was placed into the filler material mixture 184 horizontally, the colloidal graphite coated mold containing 180 the filler material mixture 184 was tapped at least twice to settle the filler material mixture 184 around the thermocouple sheath 185. Once all 12 thermocouple sheaths 185 were placed into the filler material mixture 184, the filler material mixture 184 was then partially covered with a layer of 50 mesh magnesium powder 187 from Alfa Products, Morton Thiokol, Inc., Danvets, Mass., which weighed about 0.3 grams. The matrix metal ingots 188 consisting of about 15% by weight silicon and the balance aluminum and weighing about 427 grams were placed on top of the filler material mixture 184 and the layer of magnesium powder 188 within the colloidal graphite coated steel mold 180. The mold 180 and its contents were then placed into an outer carbon steel container 189 measuring about 10 inches wide (254 mm)×12 inches (305 mm) long×10 inches (254 mm) high. A piece of graphite tape product 186, designated PF-25-H and sold under the trade name Perma-Foil from TT America, Portland, Oreg., and measuring about 10 inches (254 mm) by about 12 inches (305 mm) with a thickness of about 0.010 inch (0.25 mm), covered the bottom of the inner cavity of the outer carbon steel container 189. A titanium sponge material 190 weighing about 15 grams from Chemalloy Co., Inc., Bryn Mawr, Pa., and 50 mesh magnesium powder 191, weighing about 4 grams from Alfa Products, Morton Thiokol, Danvets, Mass., were sprinkled into the outer carbon steel container 189 around the colloidal graphite coated steel mold 180 and on the graphite tape product 186. A sheet of copper foil 192 was placed over the exposed surface of the outer carbon steel container 189. A nitrogen purge tube 193 was provided in a side wall of the carbon steel outer container 189. The copper foil 192 covered outer carbon steel container 189 and its contents were placed into a Lindberg resistance heated utility furnace. The furnace was ramped from room temperature to about 600° C. at a rate of about 800° C. per hour with a nitrogen flow rate of about 10 liters per minute, then from about 600° C. to about 800° C. at a rate of about 600° C. per hour with a nitrogen flow rate of about 3 liters per minute. The furnace was held at about 800° C. for about 2 hours with a nitrogen flow rate of about 3 liters per minute. The outer carbon steel container 189 and its contents were removed from the furnace and the colloidal graphite coated steel mold 180 was removed from the outer carbon steel container 189 and then the colloidal graphite coated steel mold 180 and its contents were placed on a room temperature copper chill plate measuring about 6 inches (152 mm)×6 inches (152 mm)×1.5 inches (38 mm) high to directionally solidify the composite.

Figure 2A:
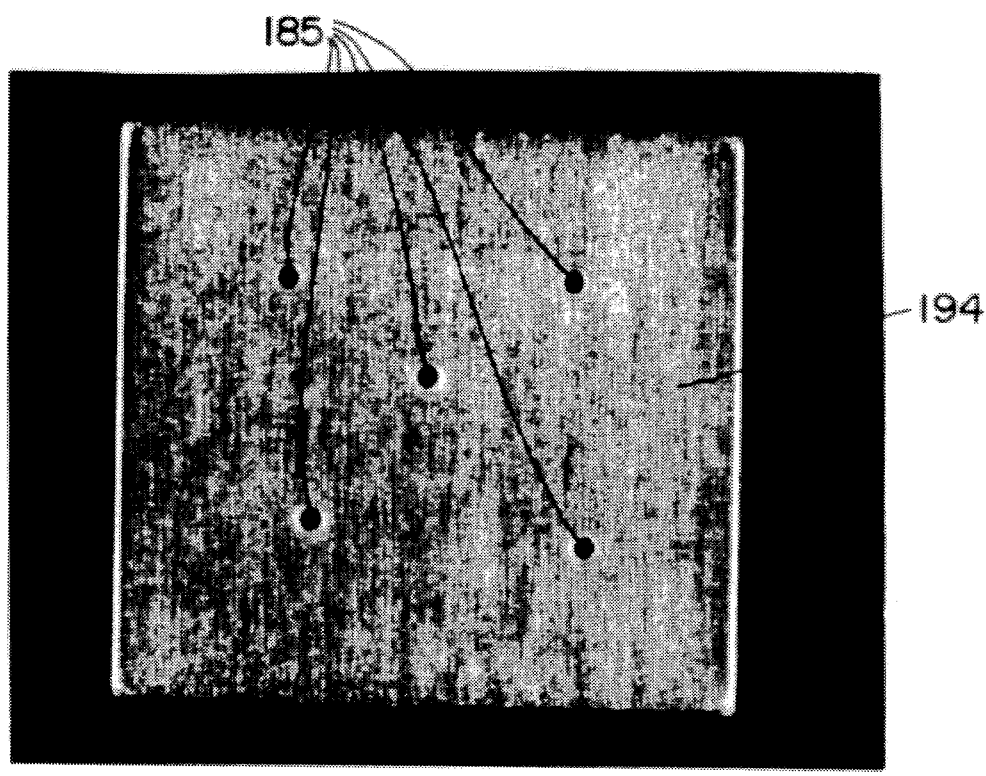
FIG. 2A is a photograph taken at 10× magnification of the macrocomposite produced in accordance with Example 1.
Figure 2B:
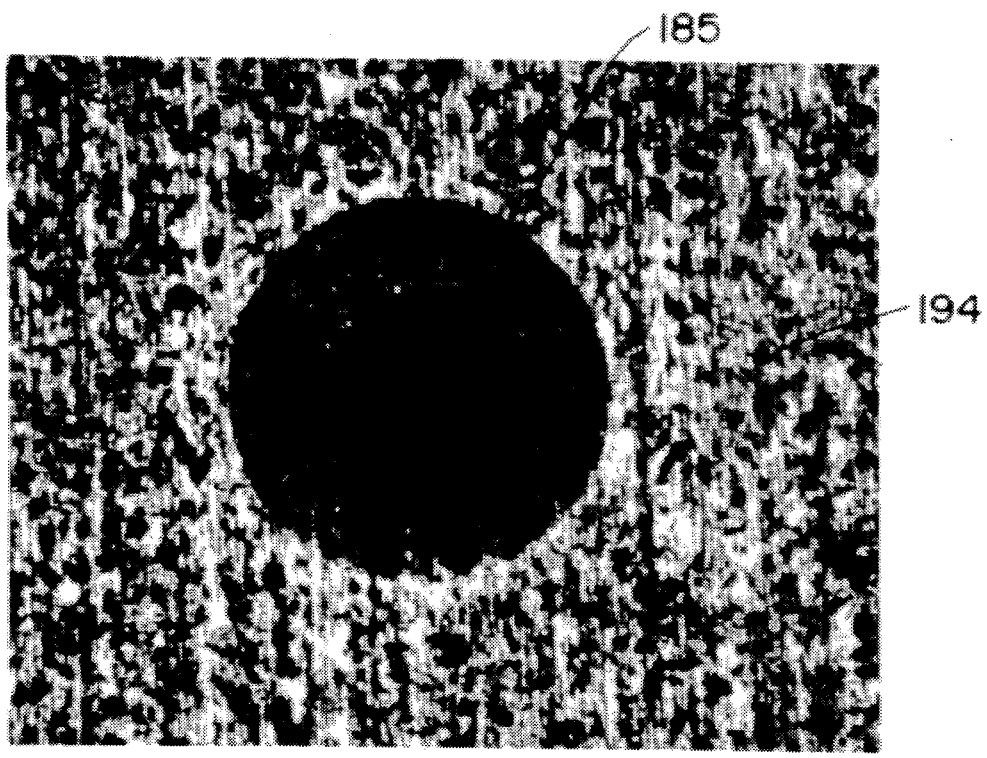
FIG. 2B is a photograph taken at 50× magnification of a portion of the macrocomposite produced in accordance with Example 1.

A macrocomposite was recovered from the colloidal graphite coated steel mold, the macrocomposite comprising a metal matrix composite plate with 12 thermocouple insulating sheaths 185 and integrally bonded and embedded in the metal matrix composite body. Specifically, FIG. 2A shows a photograph taken at about 10× magnification of 5 alumina thermocouple sheaths 185 embedded in the metal matrix composite body 194. Moreover, FIG. 2B shows a photograph taken at about 50× of a single alumina thermocouple sheath 185 embedded in the metal matrix composite body 194. Thus, the alumina sheath may be bonded to the metal matrix composite by one or more of a chemical bond (e.g., shrink or compressor fit) and/or for physical bond (e.g., a wetting of the matrix metal from the metal matrix composite) and the embedded structure may be arranged to conform to any specified pattern.

EXAMPLE 2

The following Example further demonstrates that it is possible to produce by a spontaneous infiltration technique a macrocomposite body comprising a metal matrix composite box with an aluminum rich edge around perimeter thereof.

A rectangular mold having a wall thickness of about 0.25 inches (6.4 mm) and an inner cavity measuring about 2 inches (51 mm) in length, about 1 inch (25 mm) in width and about 0.875 inches (22 mm) deep, was made from a solid piece of ATJ Graphite from Union Carbide Corp. A graphite insert measuring about 1.875 inches (48 mm) long, about 0.85 inches (22 mm) wide and about 0.312 inches (7.9 mm)

high was placed into the bottom of the rectangular mold such that an about 0.312 inch (7.9 mm) deep, and about 0.063 inch (1.6 mm) wide channel was created along the perimeter of the insert and the inside wall of the rectangular mold 120. The mold and the insert were then sprayed with 2 coats of a mixture consisting of 1.5 parts by weight alcohol and 1 part by weight DAG®–154 colloidal graphite from Atcheson Colloids, Port Huron, Mich. The spray coated mold was then placed into an air atmosphere oven set at about 380° C. for about 2 hours. A gasket was electrical discharge machined From an ingot of 6061 aluminum alloy to the dimensions of about 1.99 inches (51 mm) by 0.99 inch (23 mm) by about 0.40 inch (10 mm) thick having a wall thickness of about 0.05 inch (1.3 mm) such that it substantially completely surrounded the graphite insert.

A filler material was made by mixing in a plastic jar on a ball-mill for approximately 1 hour approximately 600 grams of 220 grit 39 CRYSTOLON® silicon carbide from Norton Co., Worcester, Mass. and about 3 percent by weight –325 mesh magnesium powder from Atlantic Equipment Engineers, Bergenfield, N.J. This mixing was supplemented by an additional 10 minutes of hand shaking in the plastic jar.

About 16 grams of filler mixture were poured into the bottom of the graphite mold and into the channel, thereby covering the aluminum gasket and the graphite insert. The filler material mixture was thereafter leveled within the mold. The filler material mixture was then partially covered with a layer of 50 mesh magnesium powder from Alpha Products, Morton Thiokol, Inc., Danvets, Mass., weighing about 2 grams. Matrix metal ingots consisting of about 15 percent by weight silicon and the balance aluminum and weighing about 39.7 grams, were placed on top of the filler material mixture and the layer of magnesium powder within the graphite mold. The mold and its contents were then placed onto an approximately 2 inch (51 mm) by 5 inch (127 mm) by 1 inch (25 mm) fire brick inside a stainless steel container measuring approximately 7 inches (178 mm) wide, 3.5 inches (83 mm) long, and 5 inches (127 mm) high. A piece of graphite tape product, designated PF-25-H and sold under the trade name Perma-foil from TT America, Portland, Oreg., and measuring about 7 inches (178 mm) by about 3.25 inches (8.3 mm) with a thickness of about 0.010 inch (0.25 mm), covered the bottom of the inner cavity of the stainless steel container. A titanium sponge material weighing about 2 grams from Chemalloy Co., Inc., Bryn Mawr, Pa., and 50 mesh magnesium powder, weighing about 2 grams from Alpha Products, Morton Thiokol, Inc., Danvets, Mass. were sprinkled into the bottom of the stainless steel container around the fire brick and onto the graphite tape product. A sheet of copper foil was placed over the opening of the stainless steel container so as to form an isolated chamber. A nitrogen purge tube was provided into the sidewall of the stainless steel container. The stainless steel container and its contents were placed into a Unique brand air atmosphere resistance heated utility furnace. The furnace was ramped from room temperature to about 600° C. at a rate of about 400° C. per hour with a nitrogen flow rate of about 3 liters per minute. Thereafter, the furnace was heated from about 600° C. to about 800° C. at a rate of about 400° C. per hour with a nitrogen flow rate of about 1 liter per minute. The furnace was held at about 800° C. for about 3 hours with the nitrogen flow rate of about 1 liter per minute. The stainless steel container and its contents were removed from the furnace and the graphite mold and its contents were placed upon a water cooled aluminum chill plate, which was at room temperature to directionally solidify the composite.

Figure 3A:
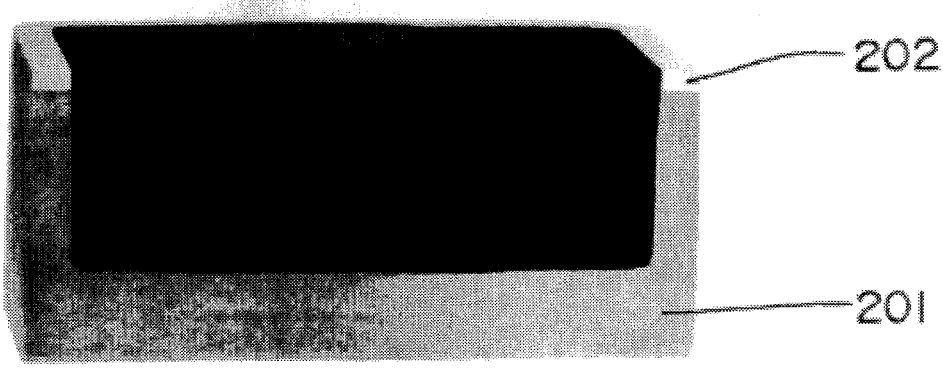
FIG. 3A is a photograph of a cross-section of the macrocomposite produced according to Example 2.
Figure 3B:
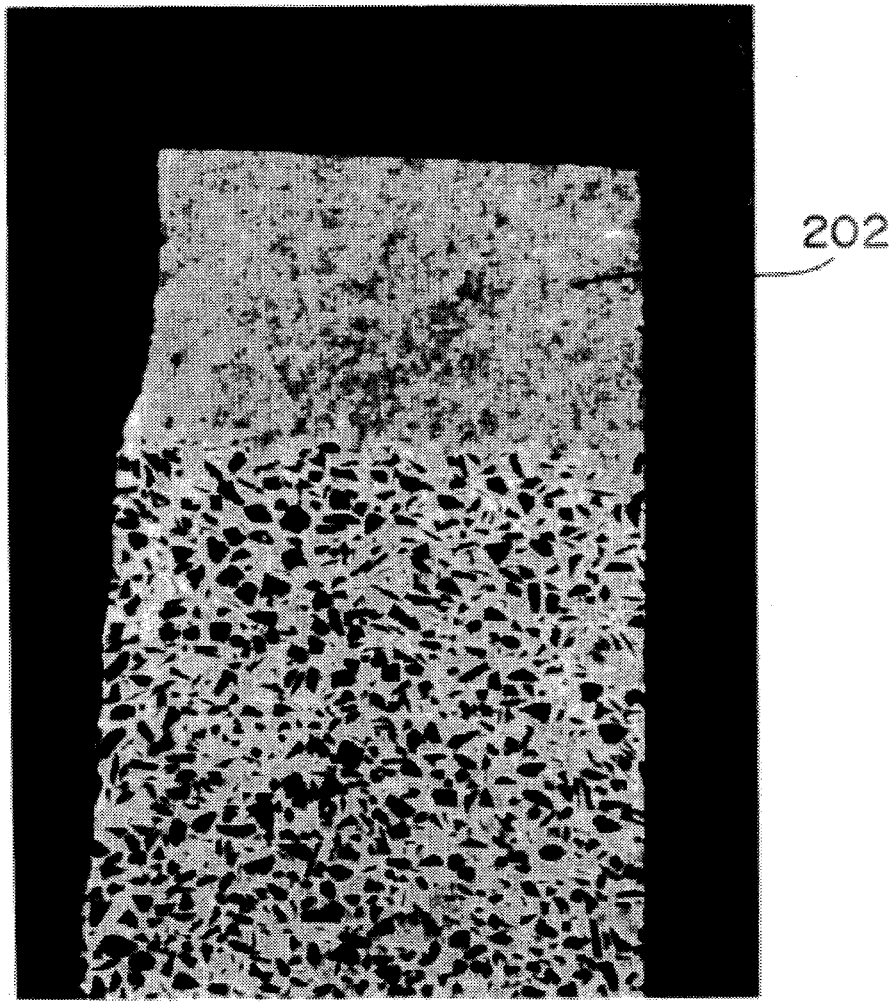
FIG. 3B is a photograph taken at 50× of a portion of the macrocomposite formed in accordance with Example 2.

A macrocomposite was recovered from the graphite mold, the macrocomposite comprising a thin walled metal matrix composite box with an intregally bonded aluminum lip located around the perimeter of the top edge of the box. Specifically, FIG. 3A, taken at about 1.5×, shows a cross-section of the macrocomposite box 201 with the metal lip 202 located at the top of the box. Further, FIG. 3B taken at about 50×, shows a higher magnification of the metal lip 202 bonded to the top of the box.

EXAMPLE 3

The following Example demonstrates that it is possible to produce by the spontaneous infiltration technique a macrocomposite comprising a metal matrix composite box with an electrically insulating ceramic structure embedded in the metal matrix composite box.

A rectangular mold having a wall thickness of about 0.25 inches (6.4 mm) and an inner cavity measuring about 2 inches (51 mm) in length and about 1 inch (25 mm) in width and about 0.750 inches (19 mm) deep was made from a solid piece of Grade ATJ Graphite from Union Carbide Corp., having a cavity into which a graphite insert could be emplaced. A graphite insert measuring approximately 1.8 inches (46 mm) long, 0.88 inches (22 mm) wide, and 0.31 inches (7.9 mm) high was placed into the bottom of the graphite mold such that an approximately 0.31 inch deep (7.9 mm) and about 0.063 inch (1.6 mm) wide channel was created along the perimeter of the insert and the inside wall of the rectangular mold. The mold and the insert were then sprayed with 2 coats of a mixture consisting of about 1.5 parts by weight of DAG® 154 Colloidal Graphite from Atcheson Colloids Co., Port Huron, Mich. The mold was heated to about 380° C. for about 2 hours in an air oven to set spray-coated mixture on the mold.

The holes of a round double-bore thermocouple insulating sheath were closed with DAG® 154 colloidal graphite. Specifically, a round double bore thermocouple insulating sheath or conduit, having an outer diameter of about 0.094 inches (24 mm) and two inner diameters each of about 0.025 inches (0.64 mm) and consisting of 998 alumina from McDanel Refractory Co., Beaver Falls, Pa., was packed with the DAG® 154 colloidal graphite. The packed rod was fired at about 380° C. for about 2 hours. Then the graphite packed round double bore insulating sheath was inserted into a hole in one side of the graphite insert within the graphite mold.

A filler material was made by mixing in a plastic jar on a ball-mill for approximately 1 hour approximately 600 grams of a mixture consisting of about 19 percent by weight 500 grit 39 CRYSTOLON® silica carbide, about 78 percent by weight 220 grit 39 CRYSTOLON® silicon carbide both from the Norton Co. and about 3 percent by weight –325 mesh magnesium powder from Atlantic Equipment Engineers, Bergenfield, N.J. The mixing was supplemented by an additional 10 minutes of hand shaking in the plastic jar.

About 13.7 grams of the filler material were poured into the bottom of the graphite mold and into the channel, thereby covering the round double bore thermocouple insulating sheath or conduit, and the graphite insert. The filler material mixture was thereafter leveled within the mold. The filler material mixture was then partially covered with a layer of 50 mesh magnesium powder from Alpha Products, Morton Thiokol, Inc., Danvers, Mass., weighing about 0.12 gram. Matrix metal ingots consisting of about 15 percent by weight silicon and the balance aluminum and weighing about 24.7 grams were placed on top of the filler material mixture and the layer of the magnesium powder within the graphite mold. The mold and its contents were then placed onto an approximately 2 inch (31 mm) by 5 inch (127 mm) by 1 inch (25 mm) fire brick inside a stainless steel container measuring approximately 7 inches (178 mm) wide, 3.25 inches (8.3 mm) long, and 5 inches (127 mm) high. A piece of graphite tape product, designated PF-25-H and sold under the trade name Perma-foil from TT America, Portland, Oreg., and measuring about 7 inches (178 mm) by about 3.25 inches (8.3 mm) with a thickness of about 0.010 inch (0.25 mm), covered the bottom of the inner cavity of the inner cavity of the stainless steel container. A titanium sponge material weighing about 2 grams from Chemalloy Co., Inc., Bryn Mawr, Pa., and 50 mesh magnesium powder, weighing about 2 grams from Alpha Products, Morton Thiokol, Inc., Danvers, Mass., were sprinkled into the stainless steel can around the fire brick onto the graphite tape product. A sheet of copper foil was placed over the opening of the stainless steel container so as to form an isolated chamber. A nitrogen purge tube was provided in a sidewall of the stainless steel container. The stainless steel container and its contents were placed into a Unique brand air-atmosphere resistance heated utility furnace. The furnace was ramped from room temperature to about 600° C. at a rate of about 400° C. per hour with a nitrogen flow rate of about 3 liters per minute. Thereafter, the furnace was heated from about 600° C. to about 800° C. at a rate of about 400° C. per hour with a nitrogen flow rate of about 1 liter per minute. The furnace was held at about 800° C. for about 2 hours with a nitrogen flow rate of about 1 liter per minute. The stainless steel container and its contents were removed from the furnace and the graphite mold and its contents were placed upon a water cooled aluminum chill plate which was at room temperature, to directionally solidify the composite.

A macrocomposite was recovered from the graphite mold, the macrocomposite comprising a thin walled metal matrix composite box with a integrally bonded round double bore thermocouple sheath or conduit at one end and through the wall of the box. The residual matrix metal from the spontaneous infiltration was removed in a cutting operation with a diamond saw, and the bottom portion of the metal matrix composite box was machined in preparation for plating.

To prepare the metal matrix composite box for plating, the box was degreased in an acetone bath and then an ultrasonic bath of ethanol. The macrocomposite box was zinc plated according to ASTM Method B 253-83, "Standard Practice for Preparation of Aluminum Alloys for Electroplating". This process included conditioning the metal matrix composite in a 2.5 percent sodium hydroxide solution at about 20° C. for about 30 seconds followed by a tap water rinse, cleaned for about 15 seconds in a 75 percent by volume HNO$_3$ bath containing about 120 grams per liter ammonium difluoride held at about 20° C., deoxidizing for about 3 seconds in a 75:25 solution of concentrated sodium hydroxide:sodium fluoride at about 20° C. The metal matrix composite box was then rinsed with tap water, dipped into a zincate bath at about 20° C. for about 1 minute, rinsed with tap water, dipped into a zincate coating in a 50 volume percent nitric acid at about 20° C. for about 30 seconds, rinsed with tap water, and again dipped into a zincate bath for about 1 minute at about 20° C. The macrocomposite box was rinsed with deionized water, and air dried, thus resulting in a zinc coating.

The macrocomposite box was then nickel plated in a plating bath sold under the trademark Barret SN® sulfamate nickel plating process from Witco Corporation Product, Hel rose Park, Ill. Two nickel plates having dimensions of about 12 inches (305 mm) long, 1 inch (25 mm) wide, and 0.25 inch (6.4 mm) thick were connected to the positive terminal of a direct current powder supply and placed on opposite sides of the bath to become the collective anode of the electrical circuit. The metal matrix composite box was connected to the negative terminal of the direct current power supply to become the cathode of the electrical circuit. Before the metal matrix composite box cathode was placed into the plating both, the current and voltage of the power supply were set and the power supply were energized. The bath conditions were a temperature of about 55° C., a current density of about 50 amps per square foot and mechanical stirring. The plating time was approximately 1 hour and the rack supporting the macrocomposite box was turned after about 30 minutes. Following the 1 hour treatment, the metal matrix composite box was first rinsed with tap water, then deionized water and air dried, to result in a nickel coating.

Figure 4:
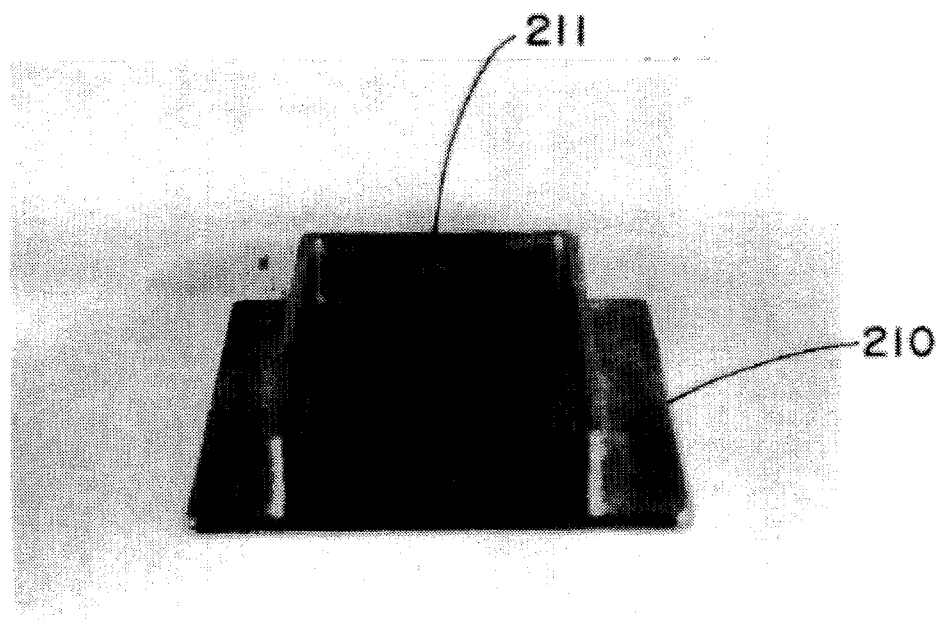
FIG. 4 is a photograph of a top view of the macrocomposite produced according to Example 3.

In a final step, the metal matrix composite box was gold plated in a plating bath from Sel-Rex Company sold under the trademark Pure-A-Gold 125. The bath conditions were a temperature of about 60° C., a plating current of about 1 amp per square foot and mechanical stirring. The anode in the bath was a platinum clad niobium. The plating time was about 20 minutes and the rack supporting the component was turned after about 10 minutes. Once removed from the bath, the gold plated metal matrix composite box was rinsed with deionized water and rinsed in an ethanol. Finally, the component was hung to dry in a static air oven set at about 110° C. This produced a substantially flawless macrocomposite box. Specifically, FIG. 4, taken about 1.7× shows the macrocomposite box 210 with the round double bore insulating conduits 211 in the side of the box.

EXAMPLE 4

The following Example demonstrates that it is possible to machine a metal matrix composite box produced by a spontaneous infiltration technique.

A rectangular shaped mold was formed from substantially the same material and with substantially the same dimensions as the mold in Example 12.

A filler material was made by mixing in a plastic jar on a ball-mill for approximately 1 hour approximately 600 grams of a mixture consisting of about 19 percent by weight of 500 grit 39 CRYSTOLON® silicon carbide and about 78 percent by weight 220 grit 39 CRYSTOLON® silicon carbide both from the Norton Co., Worcester, Mass., and about 3 percent by weight −325 mesh powder from Atlantic Equipment Engineers, Bergenfield, N.J. This mixing was supplemented by an additional 10 minutes of hand shaking of the plastic jar.

About 14 grams of the filler material was poured into the bottom of the graphite mold and into the channel, thereby covering the graphite insert. The filler material mixture was thereafter leveled within the mold. The filler material mixture was then partially covered with a layer of 50 mesh magnesium powder from ALFA® Products, Morton Thiokol, Inc., Danvets, Mass., weighing about 2 grams. Matrix metal ingots comprised of about 15 percent by weight silicon and the balance aluminum and weighing about 25 grams were placed on top of the filler material mixture and the layer of the magnesium powder within the graphite mold. The mold and its contents were then placed onto about a 2 inch (51 mm) by about 5 inch (127 mm) by about 1 inch (25 mm) fire brick inside. a stainless steel container measuring approximately 7 inches (178 mm) wide, 3.25 inches (8.3 mm) long, and 5 inches (127 mm) high. A piece of graphite tape product, designated PF-25-H and sold under the trade name Perma-foil from TT America, Portland, Oreg., and measuring about 7 inches (178 mm) by about 3.25 inches (8.3 mm) with a thickness of about 0.010 inch (0.25 mm), covered the bottom of the inner cavity of the inner cavity of the stainless steel container. A titanium sponge material weighing about 2 grams from Chemalloy Co., Inc., Bryn Mawr, Pa., and 50 mesh magnesium powder, weighing about 2 grams from Alpha Products, Morton Thiokol, Inc., Danvets, Mass., were sprinkled into the stainless steel container around the fire brick onto the graphite tape product. A sheet of copper foil was placed over the opening of the stainless steel container so as to form an isolated chamber. A nitrogen purge tube was provided in a wall of the stainless steel container. The stainless steel container and its contents were placed into a Unique brand air atmosphere resistance heated utility furnace. The furnace was ramped from room temperature to about 600° C. at a rate of about 400° C. per hour with a nitrogen flow rate of about 3 liters per minute. Thereafter, the furnace was heated from about 600° C. to about 800° C. at a rate of about 400° C. per hour with a nitrogen flow rate of about 1 liter per minute. The furnace was held at about 800° C. for about 2 hours with a nitrogen flow rate of about 1 liter per minute. The stainless steel container and its contents were removed from the furnace and the graphite mold and its contents were placed upon a water cooled aluminum chill plate which was at room temperature, to directionally solidify the composite.

A metal matrix composite box was recovered from the graphite mold, with residual matrix metal attached to it. The residual matrix metal was cut from the metal matrix composite box and new surface machined to prepare the box for plating. Prior to plating, two holes were drilled into the sidewall of the metal matrix composite box. Holes were also drilled into the two flanges on opposite ends of the metal matrix composite box that formed a means of mounting the box to a substrate. The metal matrix composite box was then plated by the method described above in Example 3.

Figure 5:
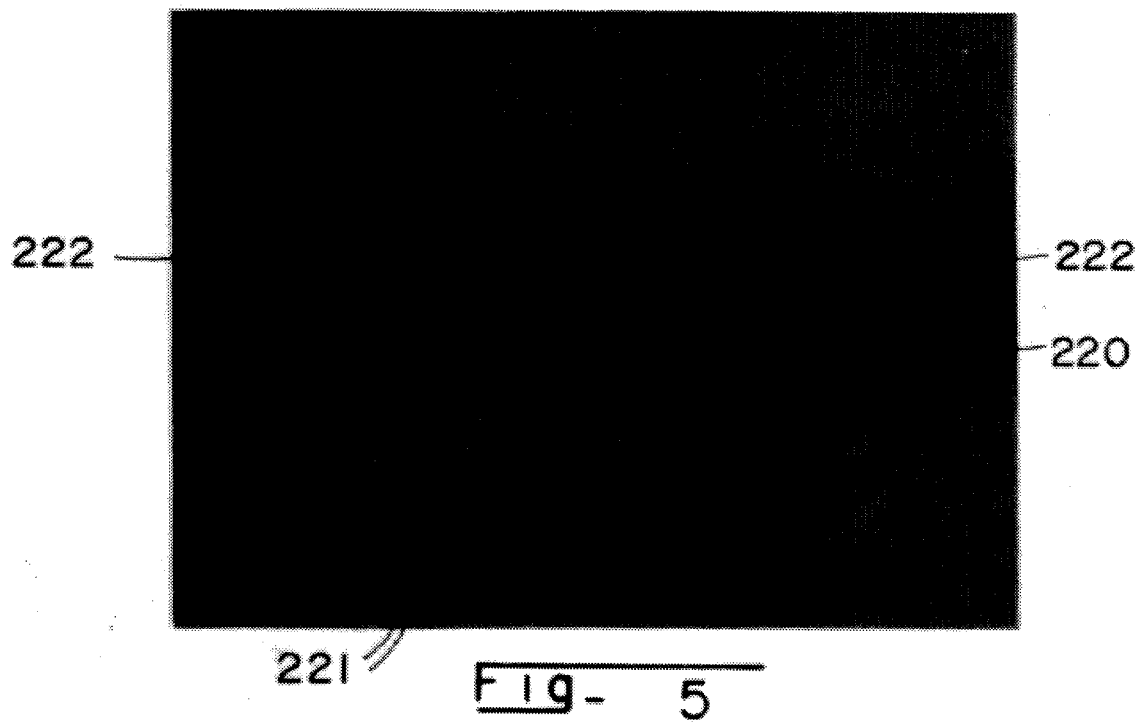
FIG. 5 is a photograph of the macrocomposite produced according to Example 3.

Specifically, FIG. 5 is a photograph which shows the metal matrix composite formed box in accordance with this Example. The Figure shows machined holes 221 located in the sidewall of the macrocomposite box 220 and machined holes 222 in the flanges located at the base of the box 220 for fastening the box to a substrate.

EXAMPLE 5

The following Example demonstrates that it is possible to produce by a spontaneous infiltration technique a metal matrix composite box having a plurality of chambers.

An electronic package prototype was machined from an aluminum block to final dimensions of about 1 inch (25 mm) high, 2.2 inches (25 mm) long, and 1 inch (25 mm) wide with two adjacent chambers measuring about 0.26 inches (6.6 mm) deep and having dimensions of about 0.65 by 0.9 inches (16.5 by 23 mm) and 1.2 inches by 0.9 inches (31 by 23 mm). The electronic package prototype was set into a clay base and surrounded by a cylindrical plastic frame. Approximately 100 grams of GI 1000 rubber molding compound from Plastic Tooling Supply Co. were mixed, vacuum degassed and poured over the pattern to fill the outer frame. Once the rubber mold had set (about 12 hours), the aluminum pattern was removed from the rubber mold and ready for remolding.

To obtain a wax pattern of the electronic package, molten green wax (at about 110° C.) manufactured by Yates Co. was poured into a rubber mold which had been preheated for about 1 hour to about 75° C. The rubber mold was vibrated during the pouring of the molten wax so as to aid in the infiltration of the 0.05 inch (1.3 mm) channels. At the same time, a hot air gun was used to keep the wax molten and to blow it into the cavities. Following solidification, the wax pattern was removed from the rubber mold and was attached to one end of a wax reservoir. A steel threaded rod was attached to the wax reservoir on the end opposite the wax pattern.

The wax pattern was used to form a investment shell by immersing it into a primary slurry comprising 1 part water, 1.2 parts NYACOL® 1430 AT colloidal silica (Nyacol Products Inc., Ashland, Mass.) and 4.2 parts –325 calcium carbonate. After dipping, the part was allowed to drain for approximately 15 seconds and a 90 grit silica sand stucco designated RANCO-SIL™ A from Ransom and Randolph was applied thereto. This stucco was allowed to dry for approximately 2 to 3 hours after which the stucco part was dipped into NYACOL® 1430 AT colloidal silica for about 60 seconds to bind the 90 grit silica sand stucco. A second slurry comprising 1 part colloidal silica and 1.8 parts RANCO-SIL™ 2 powder was used to form the remaining 7 investment shell secondary layers, which were built-up by dipping, stuccoing and drying. A re-dip indicator supplied by Ransom and Randolph changed from green-yellow to bright orange when each investment shell secondary layer was dry. The investment shell was frozen at –18° C. for about 2 hours. The shell was steam autoclaved at about 166° C. at about 90 psi for about 4 minutes. The shell was then prefired in a Lindbergh side by side resistance heated air atmosphere furnace for about 6 hours at about 800° C. to burn off residual wax and drive off any residual water in the calcium carbonate shell. The shell was allowed to cool to room temperature.

A filler material was made by mixing in a plastic jar on a ball-mill for approximately 1 hour approximately 600 grams of a mixture consisting of about 78 percent 220 grit silicon carbide designated 39 CRYSTOLON® from the Norton Co., about 19 percent 39 CRYSTOLON® 500 grit silicon carbide, again from the Norton Co., and 3 weight percent –325 mesh magnesium powder from Reade Manufacturing Co. This mixing was supplemented by an additional 10 minutes of hand shaking the plastic jar.

About 15.1 grams of filler material was poured into the bottom of the investment shell and into the channel. The filler material mixture was thereafter leveled within the shell. The filler material mixture was then partially covered with a layer of 50 mesh magnesium powder from Aesar, Johnson Matthey Co., Seabrook, N.H., weighing about 0.04 grams. Matrix metal ingots consisting of about 15 percent by weight silicon and the balance aluminum and weighing about 83 grams were placed on top of the filler material mixture and on the layer of magnesium powder, within the shell. The shell and its contents were then placed into a stainless steel container measuring about 12 inches (305 mm) wide by 10 inches (254 mm) long by 8 inches (203 mm) high. A piece of graphite tape product, designated PF-25-H and sold under the trade name Perma-foil from TT America, Portland, Oreg., and measuring about 12 inches (305 mm) by about 10 inches (254 mm) with a thickness of about 0.01 inch (0.25 mm) covered the bottom of the inner cavity of the stainless steel container. A titanium sponge material, weighing about 2 grams from Chemalloy Inc., Bryn Mawr, Pa., and 50 mesh magnesium powder, weighing about 2 grams, from Alpha Products, Morton Thiokol, Danvets, Mass., were sprinkled into the stainless steel container around the shell onto the graphite tape product. A copper sheet foil was placed over the opening of the stainless steel container so as to form an isolated chamber. A nitrogen purge tube was placed in a sidewall of the stainless steel container. The stainless container and its contents were placed into a air atmosphere resisted heated utility furnace. The furnace was ramped from room temperature to about 600° C. at a rate of about 600° C. per hour with a nitrogen flow rate of about 10 liters per minute. Thereafter, the furnace was heated from about 600° C. to about 780° C. at a rate of about 600° C. per hour with a nitrogen flow rate of about 3 liters per minute. The furnace was held at about 780° C. for about 3 hours with a nitrogen flow rate of about 3 liters per minute. The stainless steel container and its contents were removed from the furnace and the shell and its contents were placed on a water cooled aluminum chill plate which was at room temperature to directionally solidify the composite. Ceramic fiber blanket (a amorphous alumina silicate) was placed on the top of the about 2 inches (51 mm) thick shell in order to assist in the directional solidification process.

Figure 6:
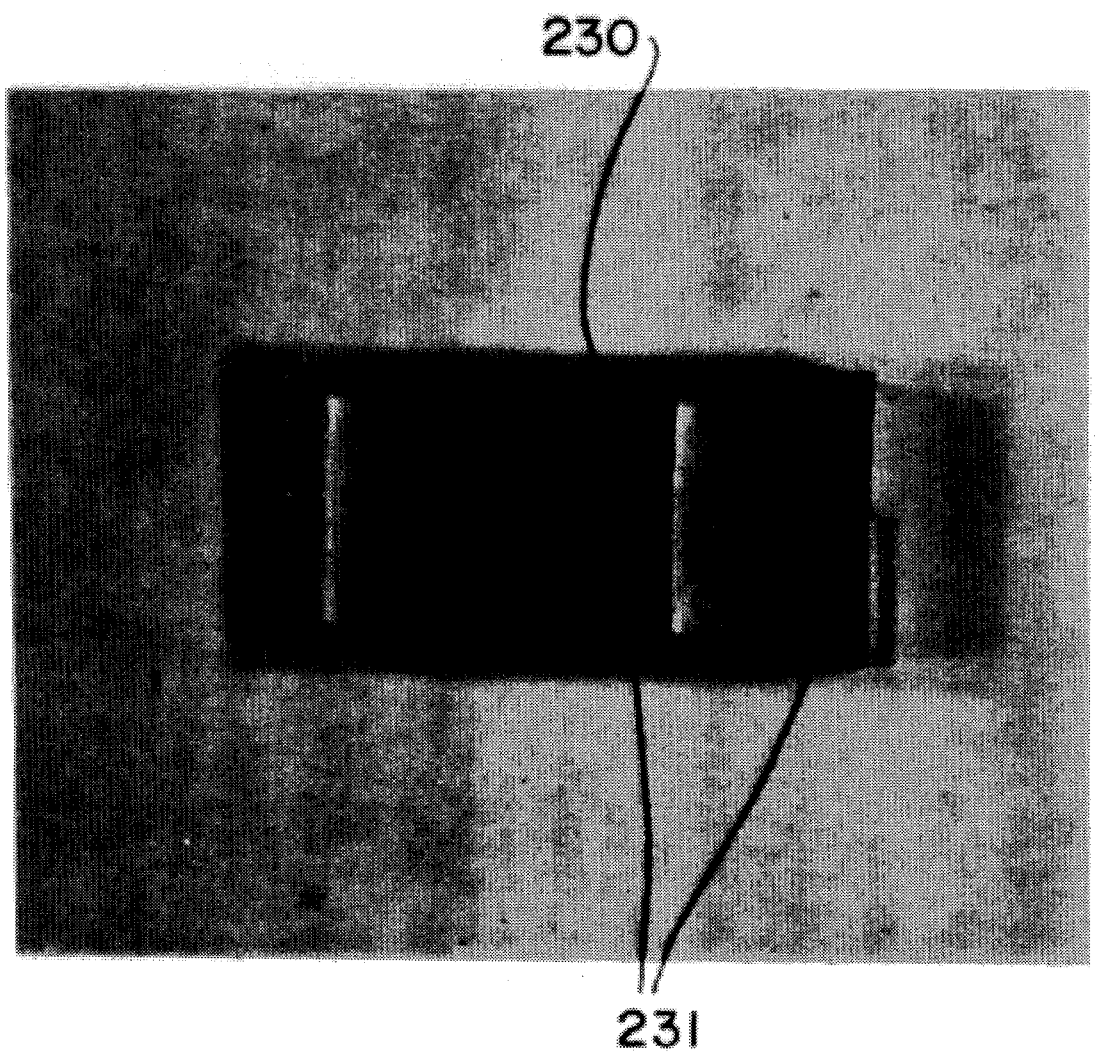
FIG. 6 is a photograph of the macrocomposite produced in accordance with Example 5.

The shell was sandblasted away to reveal a metal matrix composite box with a plurality of chambers. The residual matrix metal was diamond machined from the metal matrix box and the box was diamond machined in preparation for plating. The procedure described in Example 3 was followed in order to plate the metal matrix composite box. FIG. 6 shows a metal matrix composite box 230 with a plurality of chambers 231 that was gold plated by the procedure in Example 3.

EXAMPLE 6

The following example demonstrates that it is possible to produce by the spontaneous infiltration technique a macro-composite comprising a metal matrix composite plate with a deposited metallic coating on its surface. A metal matrix composite body measuring about 5 inches long by about 5 inches wide by about 0.5 inch thick (127 mm×127 mm×12.7 mm) was made substantially by the method of Example 3, except that no thermocouple sheaths were incorporated within the metal matrix composite body, the filler material was dried in a vacuum oven at about 150° C. for about 12 hours prior to placing in the colloidal graphite coated mold, the graphite mold had been coated three times with the colloidal graphite spary, and the matrix metal comprised by weight of about 12.0 percent silicon, 2.0 percent nickel, 1.0 percent copper and the balance aluminum.

The metal matrix composite body was cut with a diamond saw and surface ground to produce a plate measuring about 3 inches long by about 2 inches wide by about 0.04 inch thick (76 mm×51 mm×1.0 mm) and having at each of the corners of the plate a hole measuring about 0.125 inch (3.2 mm) in diameter located about 0.125 inch (3.2 mm) from both ends at the corner.

The metal matrix composite plate was submerged and degreased in an ultrasonically agitated acetone bath ranging in temperature from about 20° C. to about 30° C. for about 10 minutes, then in an ultrasonically agitated ethanol bath ranging in temperature from about 25° C. to about 30° C. for about 10 minutes. The plate was removed from the ethanol bath and dried with clean compressed air.

The metal matrix composite plate was then conditioned in an approximately 15 volume percent $H_2SO_4$-aqueous bath at about 80° C. for about 3 minutes. After about 3 minutes, the plate was removed to cascading tap water to rinse any residual $H_2SO_4$ solution from the plate and cool the plate. The metal matrix composite plate was subsequently conditioned in a bath comprising about 100 grams of NIKLAD™ multi-prep 502 (Witco Chemical Corporation, Melrose Park, Ill.) acid pickle, descaler and desmutter per liter of concentrated HNO3 at a temperature about 22° C. to about 30° C. for about 30 seconds and immediately rinsing in cool cascading tap water.

The metal matrix composite plate was then submerged in an about 10% by volume NIKLAD™ 261 pre-catalyst sensitizer-aqueous bath at a temperature from about 22° C. to about 30° C. for about 1 minute and immediately rinsed in cool cascading tap water and then submerged in an ultrasonically agitated deionized water bath for about 5 minutes and again rinsed in cool cascading tap water.

The metal matrix composite plate was then dipped in a 10% by volume NIKLAD™ 262 catalyst-aqueous bath at a temperature from about 45° C. to about 50° C. for about 3 minutes and rinsed in cool cascading tap water and then submerged in an ultrasonically agitated deionized water bath for about 5 minutes and again rinsed in cool cascading tap water.

An electroless nickel plating was then formed on the metal matrix plate by submerging the plate in a bath comprising by volume about 8.5% NIKLAD™ 1000A nickel source/replenisher about 15% NIKLAD™ 1000B complexer/buffer and the balance deionized water at about 90° C. for about 25 minutes to produce a nickel plating thickness of about 340 micro inches (measured with a beta-backscatter thickness meter, model TC2600, Twin City International, Inc., Tonawanda, N.Y.). The nickel plated metal matrix plate was dried with cleaned compressed air.

In a final step, the nickel plated metal matrix plate was gold plated in a plating bath from SEL-REX® Corporation, Nutley, N.J. sold under the trade name SEL-REX® NUTRONICS® 309 gold electroplating process. The bath was at a temperature of about 55° C. to about 65° C., a plating current density of about 3 amperes per square foot and mechanical stirring. The anode in the bath was platinum clad neobium. The plating time was about 24 minutes and the rack supporting the component was turned after about 12 minutes. Once removed from the bath, the gold-nickel plated metal matrix composite plate was rinsed with deionized water and then with ethanol. This revealed that a macro-composite had been formed comprising a metal matrix plate coated with an about 340 micro inch ($8.6 \times 10^{-3}$ mm) coating of electroless nickel and about 109 micro inch ($2.8 \times 10^{-3}$ mm) coating of gold.

EXAMPLE 7

The following example demonstrates that it is possible to produce by the spontaneous infiltration technique a macro-composite comprising a metal matrix composite box having a metal lip along the perimeter of the box opening and a deposited metallic coating.

The method of Example 3 was substantially repeated to produce a metal matrix composite box having outer dimension of about 3.5 inches long by about 0.88 inch wide by about 0.25 inches deep (89 mm×22 mm×6.4 mm) with an inner chamber of about 3.0 inches long by about 0.81 inches wide by about 0.06 inches deep (76 mm×15 mm×1.5 mm), except that the matrix metal was comprised by weight of about 12.0 percent silicon, 2.0 percent nickel, 1.0 percent copper, and the balance aluminumm, the graphite mold was coated five times with the colloidal graphite spray, no thermocouple sheaths were incorporated into the metal matrix box, the filler material was dried in a vacuum oven for about 12 hours at about 150° C. and −325 mesh alumina alloy powder comprised by weight of about 7.5–8.5% Si, 3.0–4.0% Cu, 2.7–3.5% In, 0.20–0.30% Mg, 0.7–1.0% Fe, ≦0.5% Ni, ≦0.5% Mn, ≦0.35% Sn, ≦0.01 Cu, ≦0.10% Ti, ≦0.15% Pb and the balance aluminum was placed in a channel defined by the graphite insert and the graphite mold to form a metal lip around the perimeter of the metal matrix composite box opening.

The plating method of Example 6 was substantially repeated to form a metal deposited coating on the metal matrix composite box, except that the gold plating step was replaced with a tin plating step essentially consisting of submerging the nickel-plated metal matrix box in a bath comprising by volume about 0.88% CEIL-MATTE Sn make-up (Witco Chemical Corporation, Melrose Park, Ill.), 2.2% CEIL-MATTE Sn PRIMIS, 8.8% chemical purity $H_2SO_4$, 88.0% deionized water, and stannous sulfate in an amount of about 0.112 kg stannous sulfate per liter of mixture. A tin plate having dimensions of about 12 inches (305 mm) long, 1 inch (25 mm) wide, and about 0.5 inch (13 mm) thick was connected to the positive terminal of a direct current power supply and placed in the bath to become the anode of the electrical circuit. The nickel plated metal matrix composite box was connected to the negative terminal of the direct current power supply to become the cathode of the electrical circuit. Before the nickel plated composite box was placed into the plating bath, the current and voltage of the power supply were set and the power supply was energized. The bath was operated at a temperature from about 20° C. to about 35° C. with a current density of about 10 amps per square foot for about 30 minutes. A tin nickel plated metal matrix composite box with a metal lip at the perimeter of the box opening was recovered from the bath.

EXAMPLE 8

The following example further demonstrates that it is possible to produce by a spontaneous infiltration technique a macrocomposite comprising a metal matrix composite box with a deposited metallic coating on the surface.

The method of Example 7 was substantially repeated to form a metal matrix composite box having an outer dimensions of about 2 inches long by about 1 inch wide by about 0.37 inches deep (51 mm×25 mm×9 mm) and an inner cavity having dimensions of about 1.8 inches long by about 0.88 inches wide by about 0.31 deep (46 mm×22 mm×8 mm).

The plating method of Example 6 was substantially repeated to plate the metal matrix composite box with nickel and gold, except that after the electroless-nickel plating step, the nickel plated metal matrix composite box was further plated with an electro-nickel plating process using a bath of Barret SN® sulfamate nickel plating solution. Specifically, two nickel plates having dimensions of about 12 inches (305 mm) long, 1 inch (25 mm) wide, and 0.25 inch (6.4 mm) thick were connected to the positive terminal of a direct current powder supply and placed on opposite sides of the bath of solution to become the collective anode of the electrical circuit. The metal matrix composite box was connected to the negative terminal of the direct current power supply to become the cathode of the electrical circuit. Before the metal matrix composite box cathode was placed in the plating bath, a current was supplied to create a current density of about 10 amperes per square foot. The plating process was performed for about 15 minutes at about 60° C. Mechanical stirring was supplied during the plating procedure. After the metal matrix composite box was rinsed in cool cascading tap water, the metal matrix composite was again nickel plated in the eletroless-nickel plating bath for about 10 minutes, as described in Example 6.

The nickel plated metal matrix composite box was subsequently gold plated in a manner substantially the same as the plating technique in Example 6.

The above steps produced a macrocomposite body comprising a metal matrix composite box having thereon a series of layers comprising electroless-nickel, electro-nickel, electroless-nickel and gold.

EXAMPLE 9

The following Example further demonstrates that it is possible to produce by a spontaneous infiltration technique a macrocomposite body comprising an open-ended metal matrix composite box with electrical feed-throughs incorporated therein.

Figure 7A:
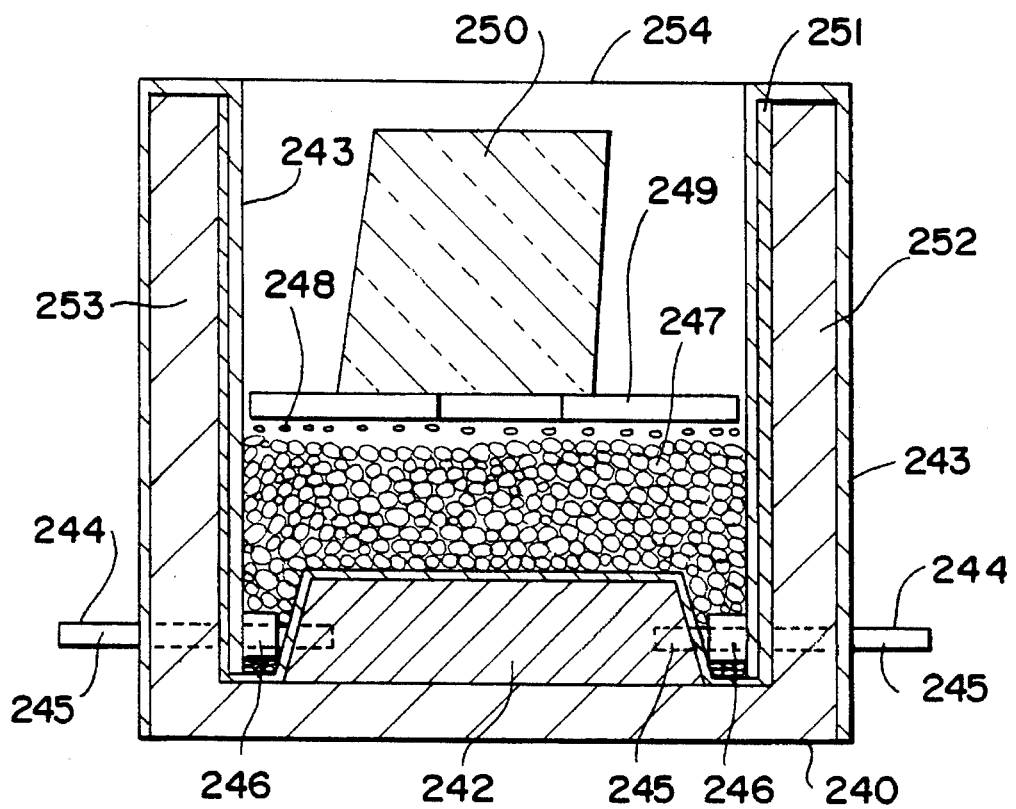
FIG. 7A is a cross-sectional schematic of the setup used to produce the macrocomposite body in accordance with Example 9.
Figure 7B:
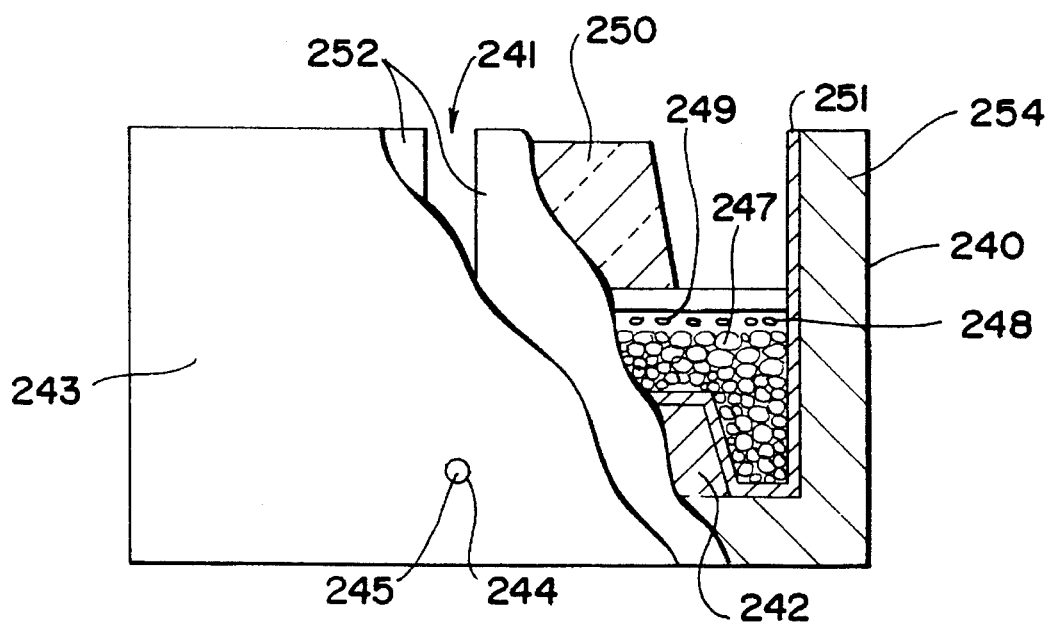
FIG. 7B is a partial cross-sectional schematic of the setup used to produce the macrocomposite body in accordance with Example 9.

FIG. 7A is a cross-sectional schematic of the setup used to produce the macrocomposite body of this Example while FIG. 7B is a partial cut-away of the setup used to produce the macrocomposite body, FIG. 7B is a side view of FIG. 7A, A rectangular mold 240 having a wail thickness of about 0.25 inches (6.4 mm) and an inner cavity measuring about 2 inches (51 mm) long, about 1 inch (25 mm) wide, about 1 inch (25 mm) deep was machined from a solid piece of Grade ATJ graphite (Union Carbide Corporation, Carbon Products Division, Cleveland, Ohio). A slot 241 measuring about 0.063 inch (1.6 mm) wide by about 1 inch (25 mm) long was cut through the graphite mold at about the midpoint of each of the side walls which measured about 2 inches (51 mm) long (side walls 252 and 253). Each of these vertical slots extended from the top of the wall to about the bottom of the wall. A graphite insert 242 measuring about 1.875 inches (48 mm) long, about 0.874 inch (22 mm) wide, and about 0.312 inch (7.9 mm) high was placed into the bottom of the graphite mold 240 such that an about 0.312 inch (7.9 mm) deep by about 0.063 inch (1.6 mm) wide channel was created along the perimeter of the graphite insert 242 and the inside wall of the graphite mold 240. An extended section measuring about 1.5 inches (38 mm) long, about 0.38 inch (9.6 mm) wide, and about 0.13 inch (3.3 mm) high protruded from the bottom portion of the graphite insert 242. This extended section engaged a hole in the bottom of the graphite mold 240 so as to affix the graphite insert 242 to the graphite mold 240. A piece of GRAFOIL® graphite foil 243 (Union Carbide Corporation, Carbon Products Division, Cleveland, Ohio), measuring about 2.25 inches (57 mm) long, about 2 inches (51 mm) wide, and about 0.005 inch (0.127 mm) thick was provided to each side wall 252 and 253 containing the slot 241. The graphite foil 243 was placed onto the interior portion of the cavity such that the graphite foil 243 covered each wall with a slot. The graphite foil 243 was then folded over the top of each wall to cover the exterior portion of each wall containing a slot (side walls 252 and 253).

Electrical feed-throughs 244 (Frenchtown Ceramic Company, Frenchtown, N.J.) were passed from the exterior of side walls 252 and 253 to the interior of the rectangular mold 240 by piercing the exterior and interior layers of the graphite foil 243 with the electrical feed-throughs so that the electrical feed-throughs passed through the slots 241 and contacted the graphite insert 242 in such a manner so as to leave marks on the graphite insert 242. Each electrical feed-through 244 comprised a coated copper pin 245 which measured about 0.692 inch (18 mm) long, and had a diameter of about 0.040 inch (1.0 mm). An alumina disk 246 having an outer diameter of about 0.156 inch (3.96 mm) and an inner diameter of about 0.70 inch (1.78 mm) was coaxially bonded to the coated copper pin so that an approximately 0.51 inch (13 mm) long portion (the long portion) of the coated copper wire extended from one side of the alumina disk 246, and an approximately 0.12 inch (3 mm) portion (the short portion) of the coated copper wire extended from the other side of the alumina disk 246. The long portions of the feed-throughs were used to puncture holes through the graphite foil 243 covering side walls 252 and 253 of the graphite mold 240 and to mark the graphite insert 245 contained within the graphite mold 240, as described above.

After the graphite insert 242 had been appropriately marked, the graphite foil 243, electrical feed-through 244, graphite insert 242, and graphite mold 240 were disassembled. After the disassembly step, the graphite insert 242 was drilled to contain two holes that would accept the short portions of the electrical feed-throughs at the points which had been previously marked by the electrical feed-throughs. In addition, the interior surfaces of the graphite mold 240 and the exterior surfaces of the graphite insert 242 were spray coated (using an air brush) with a mixture comprising by volume about 50% DAG® 154 colloidal graphite (Acheson Colloids, Port Huron, Mich.) and about 50% ethanol (Fisher Scientific, Pittsburgh, Pa.). The coating was then allowed to dry. The above-described coating procedure was repeated two times so that a total of three coatings were applied to the interior surfaces of the graphite mold 240 and the exterior surfaces of the graphite insert 242. Once the third coating of colloidal graphite-ethanol mixture had sufficiently dried, the inner and outer surfaces of side walls 252 and 253 of the graphite mold 240 were brush coated with a thin layer of RIGIDLOCK® graphite cement (Polycarbon Corporation, Valencia, Calif.).

All surfaces of a first electrical feed-through 244, except the circumferential edge of the alumina disk 246, were dip-coated with a mixture comprising by weight about 15% $B_2O_3$ (Fisher Scientific, Pittsburgh, Pa.) and the balance A-1000 alumina powder (Alcoa, Pittsburgh, Pa.) having a mean diameter of about 0.5 µm. The circumferential edge of the alumina disk 246 was then cleaned with a brush dipped in ethanol. Once the coating had sufficiently dried, the short portion of the feed-through was inserted into one of the two holes within the graphite insert 242 and the long portion of the feed-through was inserted into the earlier formed holes in one of the sheets of graphite foil 243.

All surfaces of a second electrical feed-through 244, except the circumferential edge of the alumina disk, were spray coated with a mixture comprising by volume about 50% DAG® 154 colloidal graphite (Acheson Colloid, Port Huron, Mich.) and about 50% ethanol. The circumferential edge of the alumina disk 246 was then cleaned with a brush dipped in ethanol. Once the coating had sufficiently dried, the short portion of the feed-through was inserted in the remaining hole within the graphite insert 245 and the longer portion of the feed-through was inserted through the earlier formed holes in the remaining piece of graphite foil 243.

The assembly comprising the two feed-throughs 244 with their short portions inserted into the graphite insert 242 and their long portions inserted through the two pieces of graphite foil 243 was then positioned so that the graphite insert 242 was on the bottom of the graphite mold 240 and the sheets of graphite foil 243 straddled side walls 252 and 253 with the long portion of the feed-throughs passing through the slots 241 in side walls 252 and 253 of the graphite mold 240, as shown in FIG. 7A. The graphite insert was attached securely to the bottom of the graphite mold by engaging the extended section on the bottom of the graphite insert 242 with the hole in the bottom of the graphite mold 240. The graphite foil 243 was pressed against the graphite cement located along both the inner and outer portions of each side wall 252 and 253 of the graphite mold 240. In addition, the feed-throughs 244 were securely fastened within the graphite mold 240 by the graphite foil 243 and the graphite insert 242. The alumina disks 246 were suspended within the channel defined by the outer perimeter of the graphite insert 242 and the inner perimeter of the graphite mold 240.

The setup comprising the graphite mold 240 with walls covered by graphite foil 243 and containing a graphite insert 242 containing two feed-throughs 244 was placed into a resistance heated air atmosphere furnace held at about 400° C. After about two hours at about 400° C., during which time the colloidal graphite-ethanol coating and the graphite cement set and formed a graphite layer 251 on the graphite mold 240 and graphite insert 242, the setup was removed from the resistance heated air atmosphere furnace and allowed to cool to about room temperature. A paintable mixture comprising −325 mesh (particle diameter less than about 45 µm) magnesium powder (Reade Manufacturing Company, Lakehurst, N.J.) and ethanol was applied to the graphite foil to form a thin layer just above the alumina disks of the feed-throughs. The coating is not shown in either FIGS. 7A or 78.

A filler material mixture 247 comprising by weight about 67.3% 39 CRYSTOLON® 220 grit (average particle diameter of about 66 µm) silicon carbide (Norton Company, Worcester, Mass.), about 28.9% 39 CRYSTOLON® 500 grit (average particle diameter of about 17 µm) silicon carbide (Norton Company, Worcester, Mass.) and about 3.8% −325 mesh (particle diameter less than about 45 µm) magnesium powder (Reade Manufacturing Company, Lakehurst, N.J.) was placed into the setup to a level that substantially covered the graphite insert 242 and embedded the portions of the two feed-throughs 244 which were within the channel defined by the outer perimeter of the graphite insert 242 and the inner perimeter of the graphite mold 240. After the surface of the filler material mixture 247 had been leveled, a thin coating 248 of −100 mesh (particle diameter less than about 150 µm) magnesium powder (Hart Corporation, Tamaqua, Pa.) was placed onto the surface of the filler material mixture 247. A third piece of graphite foil 249 measuring about 2 inches (51 mm) long, about 1 inch (25 mm) wide, about 0.005 inch (0.127 mm) thick and having a hole measuring about 0.5 inch (13 mm) in diameter in the center thereof, was placed on top of the magnesium powder coating 248.

An approximately 39 gram body of matrix metal 250 designated aluminum alloy 336 and nominally comprising by weight about 11.0–13.0% Si, ≦1.2% Fe, 0.05–1.5% Cu, ≦0.35% Mn, 0.7–1.3% Mg, 2.0–3.0% Ni, ≦0.35% In, ≦0.25% Ti, and the balance aluminum, was placed onto the graphite foil sheet 249. The assembly, comprising the graphite mold 240 and its contents and attachments, was placed within a graphite boat, not shown in FIGS. 7A or 78, having an inner cavity measuring about 13 inches (330 mm) long, about 9.7 inches (246 mm) wide, and about 1 inch (25 mm) deep and having a wall thickness of about 0.375 inch (9.5 mm) thick, to form a lay-up.

The lay-up, comprising the graphite boat and its contents, was then placed within a retort contained within a resistance heated furnace and the retort door was closed. The retort chamber was evacuated to about 30 inches (762 mm) of mercury vacuum and then backfilled with a nitrogen atmosphere flowing at a rate of about 5 liters per minute. The about 5 liters per minute nitrogen gas flow rate was maintained as the furnace was heated to about 200° C. in about one hour. After about 7 hours at about 200° C., the furnace and its contents were heated to about 810° C. at about 200° C. per hour while maintaining the nitrogen flow rate of about 5 liters per minute. After about 5 hours at about 810° C. with a nitrogen flow rate of about 5 liters per minute, both the nitrogen flow rate and the power to the furnace were terminated and the lay-up was removed from the furnace at about 810° C. and placed in contact with a water cooled copper chill plate to directionally solidify the molten metal contained within the lay-up.

Figure 8:
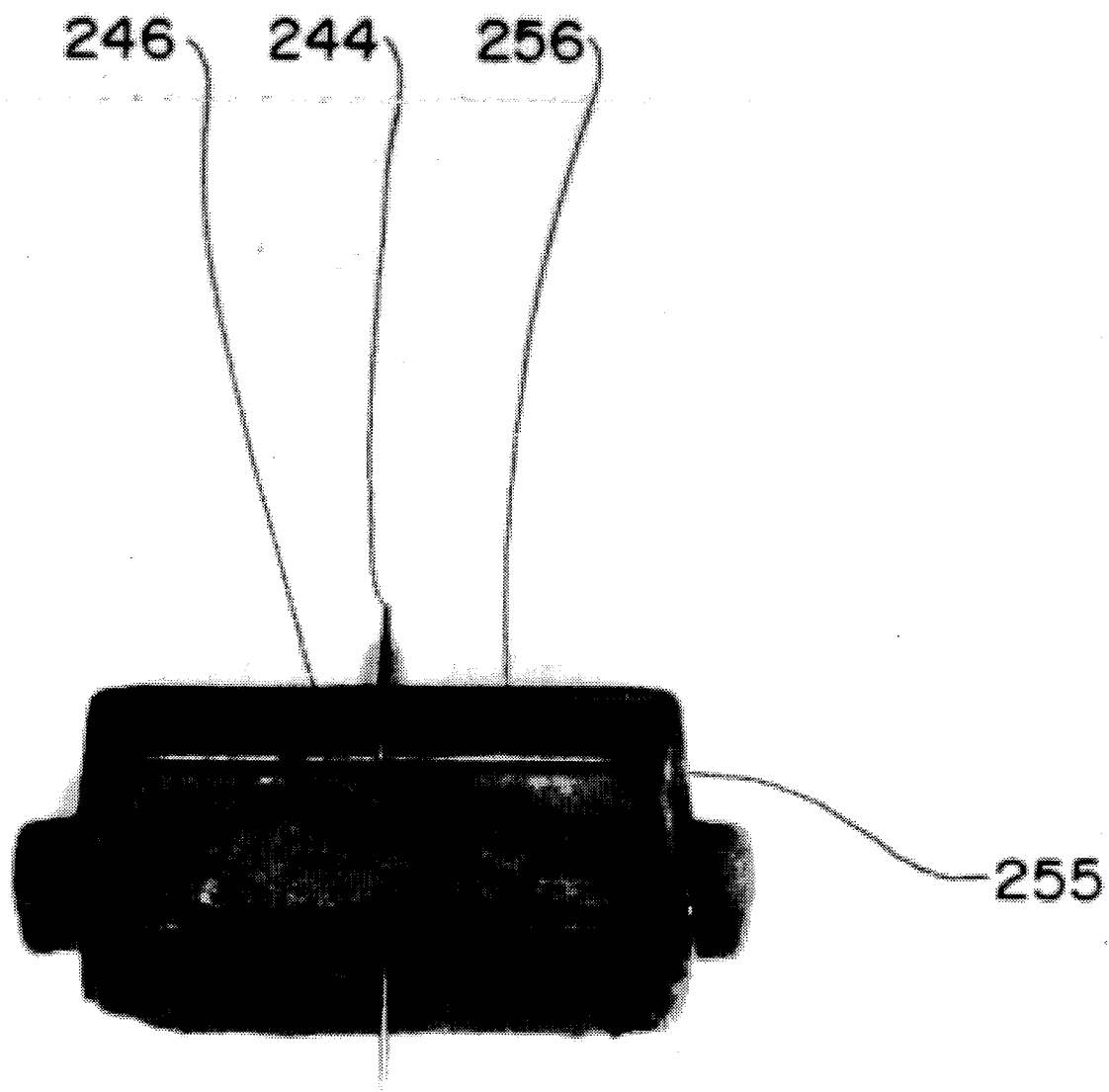
FIG. 8 is a photograph of the macrocomposite body produced in accordance with Example 9.

After the lay-up had cooled to room temperature, the lay-up was disassembled to reveal that the matrix metal 250 had infiltrated the filler material mixture 247 and embedded the alumina disks 246 of the electrical feed-throughs 244 contained within the filler material mixture 247 to result in a macrocomposite body comprising an open-ended metal matrix composite box with electrical feed-throughs 244 intimately bonded to and electrically insulated from the metal matrix composite box by the alumina disks 246 of the electrical feed-throughs 244. Specifically, FIG. 8 is a photograph showing the open-ended metal matrix composite box 255 with the electrical feed-through 244 in the side wall 256. The electrical feed-through 244 is electrically insulated from the metal matrix composite box 255 by the alumina disk 246 which is intimately bonded to the open-ended metal matrix composite box 255.

EXAMPLE 10

The following Example demonstrates that a spontaneous infiltration technique may be used to produce a macrocomposite body comprising stainless steel tubes embedded in a metal matrix composite body. The embedded stainless steel tubes may be used to provide a means for attaching the macrocomposite body to a second structure.

Figure 9:
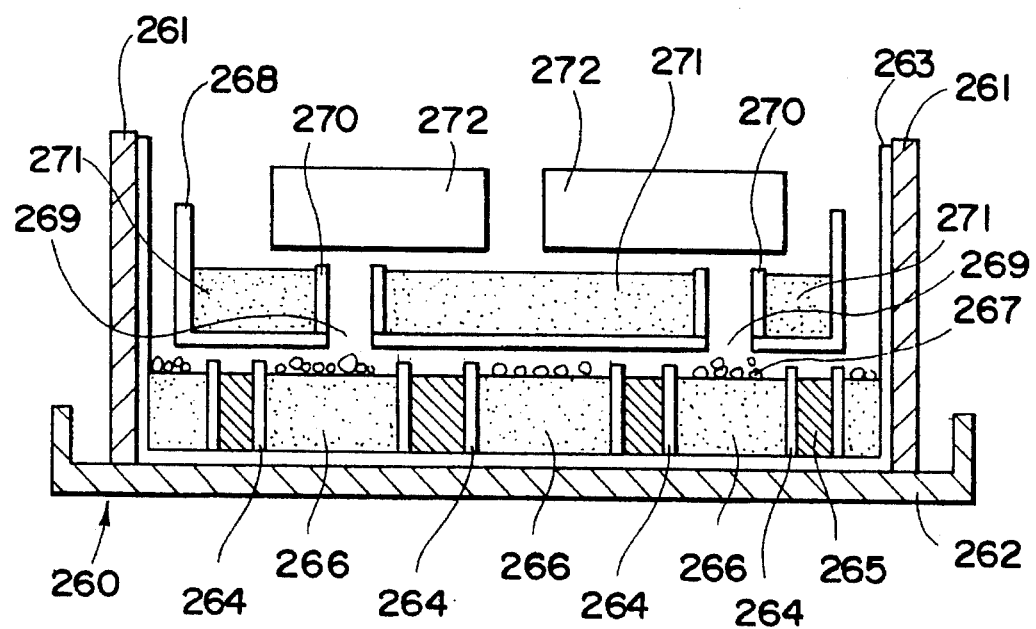
FIG. 9 is a cross-sectional schematic of the setup used to produce the macrocomposite body in accordance with Example 10.

As illustrated in FIG. 9, a rectangular shaped graphite mold 260 having a wall thickness of about 0.5 inch (13 mm) and an inner cavity measuring about 18 inches (457 mm) long, about 12 inches (305 mm) wide, and about 4 inches (102 mm) in height, was made by clamping four plates 261 of Grade ATJ graphite together (Union Carbide Corporation, Carbon Product Division, Cleveland, Ohio) and placing the clamped pieces 261 of graphite on a graphite fixture 262 having an inner-cavity measuring about 35 inches (889 mm) long, about 22 inches (559 mm) wide, and about 2 inches (51 mm) tall. Two of the plates 261 were about 13 inches (330 mm) long, about 4 inches (102 mm) wide and about 0.5 inch (13 mm) thick, and the remaining two plates were about 18 inches (457 mm) long, about 4 inches (102 mm) wide, and about 0.5 inch (13 mm) thick.

A graphite foil box 263 was fabricated by cutting and folding a piece of GRAFOIL® graphite foil (Union Carbide Corporation, Carbon Product Division, Cleveland, Ohio) which was about 26 inches (660 mm) long, about 20 inches (508 mm) wide, and about 0.015 inch (0.38 mm) thick. The final graphite foil box 263, which was about 18 inches (457 mm) long, about 12 inches (305 mm) wide, and about 4 inches (102 mm) in height, was inserted into the graphite mold 260.

Twelve stainless steel tubes 264 having an outer diameter of about 0.5 inch (13 mm) and an inner diameter of about 0.38 inch (9.6 mm), were placed into the bottom of the graphite foil box 263 such that the longitudinal axis of the tubes were perpendicular to the plane of the bottom of the graphite foil box 263. The stainless steel tubes 264 were arranged in three rows, each row having four uniformly spaced tubes. The rows were parallel to one another and to the 18 inch (457 mm) long wall of the graphite foil box 263. The interior of the stainless steel tubes 265 was filled with DAG® 154 colloidal graphite (Acheson Colloids, Port Huron, Mich.).

A filler material mixture 266 comprising by weight about 98% 39 CRYSTOLON® 220 grit (average particle diameter of about 66 μm) silicon carbide, (Norton Company, Worcester, Mass.) and about 2% −325 mesh (particle diameter less than about 45 μm) magnesium powder (Reade Manufacturing Company, Lakehurst, N.J.) was prepared by combining the materials in a plastic jar and placing the plastic jar on a ball mill for about two hours. After the mixing step, the filler material mixture 266 was poured into the graphite foil box 263 to a depth of about 1 inch (25 mm), and the box was tapped lightly to level the surface of the filler material mixture 266. The surface of the filler material mixture 266 was then evenly coated with a layer of −100 mesh (particle diameter less than about 150 μm) magnesium powder 267 (Hart Corporation, Tamaqua, Pa.). A second graphite foil box 268 having an inner-cavity measuring about 17.9 inches (455 mm) long, about 11.9 inches (302 mm) wide, and about 4 inches (102 mm) tall, was placed on the layer of magnesium powder 267 covering the filler material mixture 266. The bottom of the second graphite foil box 268 contained two holes 269. The second graphite foil box 268 was made by substantially the same method as the first graphite foil box 263 except for the addition of the two holes 269 in the bottom of the second graphite foil box 268. Each of the holes 269 was about 2.5 inches (64 mm) in diameter and was positioned in the bottom of the second graphite foil box 268 so that the center of each hole was equidistant from the 17.9 inch (455 mm) long sides of the second graphite foil box 268, and about 5.55 inches (141 mm) from one of the 11.9 inch (302 mm) wide ends of the second graphite foil box 268. Two graphite tubes 270 having inner diameters of about 2.125 inches (54 mm) and having outer diameters of about 2.5 inches (64 mm) and a height of about 0.5 inch (13 mm) were placed into the second graphite foil box 268 to coincide with the holes 269 in the second graphite foil box 268. These tubes 270 were secured to the second graphite foil box 268 with RIGIDLOCK® graphite cement (Polycarbon Corporation, Valencia, Calif.). 38 ALUNDUM® 90 grit (average particle diameter of about 216 μm) alumina powder 271 (Norton Company, Worcester, Mass.) was placed into the second graphite foil box 268 and around the graphite tubes 270 until the level of alumina powder 271 was substantially equal to the top of the graphite tubes 270. After the RIGIDLOCK® graphite cement set, additional −100 mesh (particle diameter less than about 150 μm) magnesium powder 267 (Hart Corporation, Tamaqua, Pa.) was sifted into the graphite tubes 270 to provide additional magnesium powder to the surface of the filler lnaterial mixture 266, which was visible at the bottom of the graphite tubes 270.

An approximately 20.1 pound (9.1 kilogram) body of matrix metal 272 designated aluminum alloy 413 and nominally comprising by weight about 11.0–13.0% Si; ≦2.0% Fe; ≦1.0% Cu; ≦0.35% Mn; ≦0.10% Mg; ≦0.50% Ni; ≦0.50% Zn; ≦0.15% Sn and the balance aluminum, was placed onto the alumina powder 271 contained within the second graphite foil box 268. The graphite mold 260 and its contents comprised a lay-up to be used for the formation of a macrocomposite body comprising a metal matrix composite body with the stainless steel tubes 264 incorporated therein.

The lay-up comprising the graphite mold 260 and its contents was placed into a retort contained within a resistance heated furnace and the retort door was closed, The retort chamber was evacuated to about 30 inches (762 mm) of mercury vacuum and then backfilled with nitrogen gas flowing at a rate of about 12 liters per minute. A nitrogen gas flow rate of about 12 liters per minute was maintained while the furnace was heated to about 200° C. in about one hour. After about 2 hours at about 200° C., the furnace and its contents were heated to about 550° C. in about 3 hours. After about 2 hours at about 550° C., the furnace and its contents were heated to about 790° C. in about 3 hours, After about 12 hours at about 790° C., with the nitrogen gas continuously flowing at a rate of about 12 liters per minute, the furnace and its contents were cooled to about 670° C. in about 3 hours. At about 670° C., both the supply of nitrogen gas and the power to the furnace were terminated and the lay-up was removed from the furnace at 670° C. and contacted with a graphite plate measuring about 36 inches (914 mm) long, about 24 inches (610 mm) wide, and about 4 inches (102 mm) thick, at room temperature, to directionally solidify the molten metal contained within the lay-up.

After the lay-up had cooled to room temperature, the lay-up was disassembled to reveal that the matrix metal had infiltrated the filler material mixture 266 and embedded the stainless steel tubes 264 to make a metal matrix composite plate with stainless steel tubes 264 intimately bonded to the metal matrix plate, thereby forming a macrocomposite body. The DAG® 154 colloidal graphite was then removed from the interior of the stainless steel tubes 265 to form throughholes in the macrocomposite body.

EXAMPLE 11

The following Example demonstrates the utilization of a spontaneous infiltration technique to form a macrocomposite body comprising an open-ended metal matrix composite box with a metallic lip around the perimeter of the open-end of the box.

Figure 10:
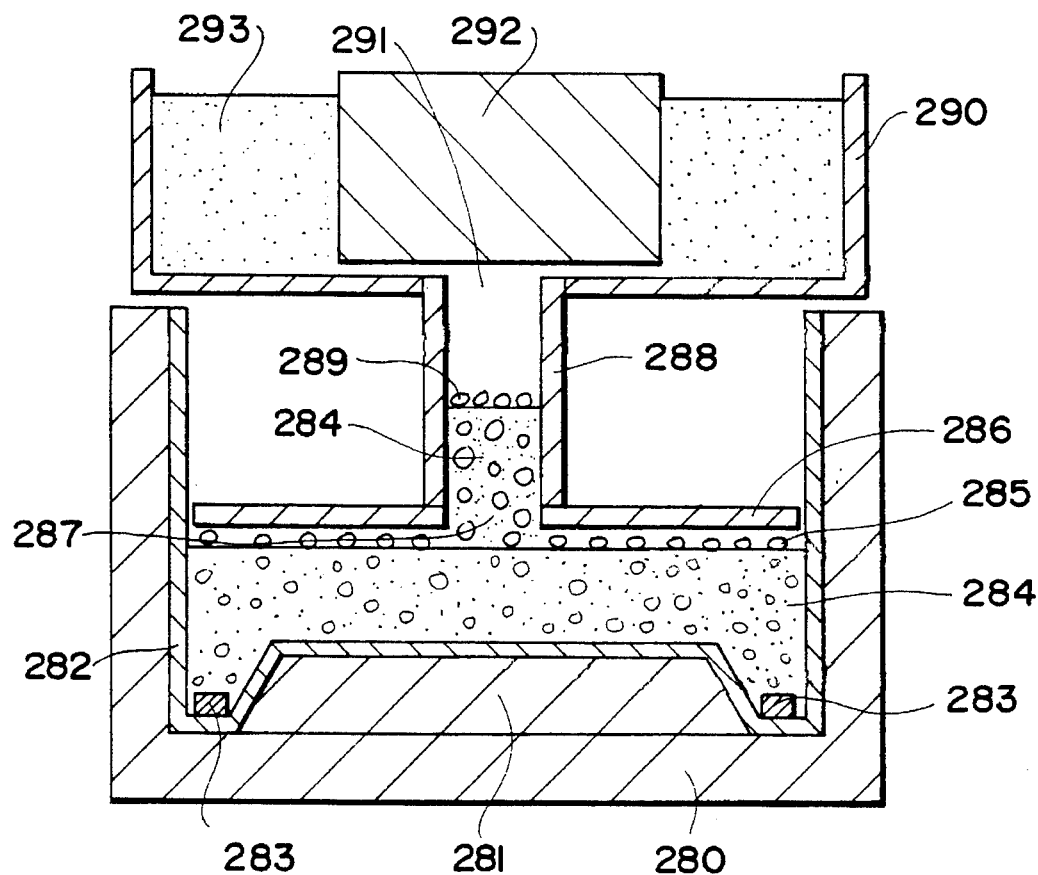
FIG. 10 is a cross-sectional schematic of the setup used to produce the macrocomposite body in accordance with Example 11.

FIG. 10 is a cross-sectional schematic of the setup used to provide the macrocomposite body of this Example. Specifically, a rectangular graphite mold 280 having a wall thickness of about 0.25 inch (6.4 mm) and an inner cavity measuring about 2 inches (51 mm) long, about 1 inch (25 mm) wide, and about 1 inch (25 mm) deep, was machined from a solid piece of Grade ATJ graphite (Union Carbide Corporation, Graphite Products Division, Cleveland, Ohio). A graphite insert 281 measuring about 1.875 inches (48 mm) long, about 0.874 inch (22 mm) wide, and about 0.312 inch (7.9 mm) high was placed into the bottom of the graphite mold 280 so that an about 0.312 inch (7.9 mm) deep and about 0.63 inch (1.6 mm) wide channel was created between the perimeter of the graphite insert 281 and the inside wall of the rectangular graphite mold 280. The graphite mold 280 and the graphite insert 281 were then spray coated with five applications of a mixture comprising by volume about 50% DAG® 154 colloidal graphite (Acheson Colloids, Port Huron, Mich.) and about 50% ethanol. Each coating was allowed to dry before the subsequent coating was applied. The spray coated graphite mold and the spray coated graphite insert 281 were placed into an air atmosphere oven at about 450° C. for about 3 hours to cure the graphite coating 282. A metal gasket 283 was electrical discharge discharge machined from an about 0.04 inch (1 mm) thick sheet of KOVAR® alloy having a nominal composition comprising by weight ≦0.02% C; ≦0.30% Mn; ≦0.20% Si; 29.0% Ni; 17.0% Co and the balance iron. The metal gasket 283 had dimensions of about 1.99 inches (51 mm) for its long sides, about 0.9 inch (23 mm) for its short sides, about 0.40 inch (10 mm) thick from top surface to bottom surface, and about 0.50 inch (1.30 mm) in wall width so that it substantially completely covered the exposed surfaces of the bottom of the rectangular mold 280 which were not covered by the graphite insert 281.

A filler material mixture 284 was made by mixing in a plastic jar on a ball mill for about 24 hours a mixture comprising by weight about 77.7% 39 CRYSTOLON® 220 grit (average particle diameter of about 66 μm) silicon carbide (Norton Company, Worcester, Mass.), 19.4% 39 CRYSTOLON® 500 grit (average particle diameter of about 17 μm) silicon carbide (Norton Company, Worcester, Mass.) and about 2.9% −325 mesh (particle diameter less than about 45 μm) magnesium powder (Reade Manufacturing Company, Lakehurst, N.J.).

A sufficient amount of filler material mixture 284 was poured into the bottom of the graphite mold 280 to cover the KOVAR® alloy gasket 283 and the graphite insert 281. The filler material mixture 284 was thereafter leveled within the graphite mold 280 and covered with a layer 285 of −100 mesh (particle diameter less than about 150 lm) magnesium powder (Hart Corporation, Tamaqua, Pa.). The layer 285 of magnesium powder was then substantially covered with a piece of graphite foil 286 measuring about 2 inches (51 mm) long, about 1 inch (25 mm) wide, and about 0.015 inch (0.38 mm) thick. A hole 287 having a diameter of about 0.5 inch (13 mm) was located in the center of the piece of graphite foil. A graphite tube 288 having an inner diameter of about 0.5 inch (13 mm), an outer diameter of about 0.75 inch (19 mm) and a height of about 0.75 inch (19 mm) was placed onto the graphite foil 286 so that the opening 287 in the graphite foil 286 and the inner diameter of the graphite tube 288 were aligned. An additional amount of filler material mixture 284 was disposed within the graphite tube 288 so that the tube was about half-filled. Approximately 0.10 grams of −100 mesh (particle diameter less than about 150 μm) magnesium powder 289 was placed on the surface of the filler material mixture 284 contained within the graphite tube 288. A graphite foil box 290 measuring about 3 inches (76 mm) long, about 1.5 inches (38 mm) wide, about 1.5 inches (38 mm) tall and having a hole 291 in the center of its bottom measuring about 0.75 inch (19 mm) in diameter was placed onto the top edges of the graphite mold 280 so that the outer surface of the graphite tube 288 fit within the hole 291 in the bottom of the graphite foil box 290.

An approximately 90 gram body of matrix metal 292 designated aluminum alloy 336 and nominally comprising by weight 11.0–13.0% Si; ≦1.2% Fe; 0.05–1.5% Cu; ≦0.35% Hn; 0.7–1.3% Hg; 2.0–3.0% Ni; ≦0.35% Zn; ≦0.25% Ti and the balance aluminum, was placed into the graphite foil box 290 and on top of the opening 291 in the bottom of the graphite foil box 290. A mixture of 39 CRYSTOLON® 90 grit and finer (particle diameter less than about 180 lm) silicon carbide powder was poured into the remaining volume of the graphite foil box 290 until the surface of the silicon carbide powder bed 293 was substantially level with the top of the body of matrix metal 292.

The lay-up comprising the graphite mold 280, the graphite foil box 290, and their contents, was placed into a retort contained within a resistance heated furnace and the retort door was closed. The retort chamber was then evacuated to about 30 inches (762 mm) of mercury vacuum and backfilled with nitrogen gas flowing at a rate of about 2.5 liters per minute. The about 2.5 liters per minute nitrogen gas flow rate was maintained as the furnace was heated to about 200° C. in about one hour. After about 3 hours at about 200° C., the furnace and its contents were heated to about 790° C. at about 200° C. per hour. After about 12 hours at about 790° C. with a nitrogen gas flow rate of about 2.5 liters per minute, the furnace and its contents were cooled to about 670° C. at about 200° C. per hour. At about 670° C., both the continuous flow of nitrogen gas and the power to the furnace were terminated. The lay-up was removed from the furnace at about 670° C. and placed on top of a water cooled aluminum chill plate. In addition, shortly after the lay-up was placed on top of the chill plate, the surface of the excess molten metal contained within the graphite foil box 290 was covered with FEEDOL® No. 9 hot-topping material (Foseco, Cleveland, Ohio) to cause an exothermic reaction which supplied heat to the surface of the excess molten metal. The combination of a heat source on the upper end of the lay-up and a heat sink on the bottom of the lay-up resulted in the directional solidification of the molten metal contained within the lay-up.

After the lay-up had cooled to room temperature, the lay-up was disassembled to reveal that the KOVAR® alloy gasket 283 was attached to an open-ended metal matrix composite box comprising the filler material mixture 284 embedded within the matrix metal. Further inspection revealed that there had been extensive interaction between the KOVAR® alloy gasket and the aluminum matrix metal resulting in some alloying of the matrix metal with the KOVAR® alloy gasket. Thus, the final macrocomposite body produced by the instant example comprised an open-ended metal matrix composite box having a metal lip attached to the perimeter of the open-end of the box.

EXAMPLE 12

The following Example demonstrates that a spontaneous infiltration technique may be utilized to form a macrocomposite body comprising an open-ended metal matrix composite box with a metallic lip around the perimeter of the open-end of the box. The method of Example 11 was substantially repeated, except that in place of the KOVAR® alloy gasket, an INCONEL® 600 alloy gasket nominally comprising by weight about 14.0–17.0% Cr; 6.0–10.0% Fe; ≦1.5% C; ≦1.0% Mn; ≦0.015% S; ≦0.50% Si; ≦0.50% Cu and a minimum of about 72% Ni, was used. As with the KOVAR® alloy gasket, the INCONEL® 600 alloy gasket interacted with the aluminum matrix metal resulting in an open-ended metal matrix composite box attached to a metallic lip that was comprised of aluminum, nickel, chromium, iron, magnesium, and silicon.

EXAMPLE 13

The following Example demonstrates the utilization of a spontaneous infiltration technique to form a macrocomposite body comprising an open-ended metal matrix composite box with a metallic lip around the perimeter of the open-end of the box. The method of Example 11 was substantially repeated, except that in place of the KOVAR® alloy gasket, a substantially pure copper gasket was used. As with the KOVAR® alloy gasket, the copper gasket interacted with the aluminum matrix metal resulting in an open-ended metal matrix composite box attached to a metallic lip that was comprised of aluminum, copper, magnesium, and silicon.

EXAMPLE 14

The following Example demonstrates the utilization of a spontaneous infiltration technique to form a macrocomposite body comprising an open-ended metal matrix composite box with a metallic lip around the perimeter of the open-end of the box. The method of Example 11 was substantially repeated, except that in place of the KOVAR® alloy gasket, a substantially pure commercially available titanium gasket was used. Other differences between the method of the instant Example and the method of Example 11 were that the infiltration of the matrix metal into the filler material was performed at about 800° C. for about 5 hours with a nitrogen flow rate of about 4 liters per minute, and the removal of the setup to the water cooled aluminum chill plate was performed at about 700° C. As with the KOVAR® alloy gasket, the titanium gasket interacted with the aluminum matrix metal resulting in an open-ended metal matrix composite box attached to a metallic lip that was comprised of aluminum, tiotanium, magnesium, and silicon.

EXAMPLE 15

The following Example demonstrates the utilization of a spontaneous infiltration technique to form a macrocomposite body comprising an open-ended metal matrix composite box with an aluminum rich edge around the perimeter of the open-end of the box.

A rectangular graphite mold having a wall thickness of about 0.25 inch (6.4 mm) and an inner-cavity measuring about 2.3 inches (58 mm) long, about 0.45 inch (11 mm) wide, and about 1 inch (25 mm) deep was machined from a solid piece of Grade ATJ graphite (Union Carbide Corporation, Carbon Products Division, Cleveland, Ohio). A graphite insert measuring about 2 inches (51 mm) long, about 0.4 inch (9.8 mm) wide, and about 0.10 inch (2.5 mm) high was placed into the bottom of the graphite mold such that an about 0.14 inch (3.5 mm) deep, and about 0.04 inch (1 mm) wide channel was created between the outer perimeter of the graphite insert and the inside wall of the rectangular graphite mold. The interior surfaces of the graphite mold and the exterior surfaces of the graphite insert were then sprayed (using an air brush) with a mixture comprising by volume about 50% of DAG® 154 colloidal graphite (Acheson Colloids, Port Huron, Mich.) and about 50% ethanol. After the coating had substantially dried, the coating procedure was repeated until a total of four coatings had been applied. The spray coated graphite mold and graphite insert were then placed into an air atmosphere oven for about 2 hours at a temperature of about 380° C.

An admixture comprising by weight about 98% −325 mesh (particle diameter less than about 45 μm) aluminum alloy powder comprising by weight about 7.5–8.5% Si; 3.0–4.0% Cu; 2.7–3.5% Zn; 0.2–0.3% Mg; ≦0.01% Ca; ≦0.01% Ti; 0.7–1.0% Fe; ≦0.5% Ni; ≦0.5% Mn; ≦0.35% Sn; ≦0.001% Be; ≦0.15% Pb; and the balance aluminum, and about 2% −325 mesh (particle diameter less than about 45 μm) magnesium powder (Reade Manufacturing Company, Lakehurst, N.J.) was mixed with ethanol and poured into a syringe. The mixture was then injected into the channel defined by the outer perimeter of the graphite insert and the inside wall of the rectangular graphite mold. The ethanol evaporated from the mixture leaving a dense layer of metal powder in the channel. A thin layer of −325 mesh (particle diameter less than about 45 μm) magnesium powder was then placed onto the surface of the dense layer of metal powder contained within the channel.

A filler material mixture was made by combining by weight about 79.7% 39 CRYSTOLON® 220 grit (average particle diameter of about 66 μm) silicon carbide (Norton Company, Worcester, Mass.), about 19.4% 39 CRYSTOLON® 500 grit (average particle diameter of about 17 μm) silicon carbide (Norton Company, Worcester, Mass.), and about 2.9% −325 mesh (particle diameter less than about 45 μm) magnesium powder (Reade Manufacturing Company, Lakehurst, N.J.) in a plastic jar and placing the jar on a ball mill for approximately 1 hour. The filler material mixture was then poured into the graphite mold and over the graphite insert to cover both the layer of metal powder in the channel and the graphite insert. The graphite mold was then placed on a vibrator to level the filler material mixture. The surface of the leveled filler material mixture was about 0.3 gram (9.5 mm) above the upper surface of the graphite insert. The leveled filler material mixture was covered with an approximately 0.04 gram per square inch ($6.2 \times 10^{-5}$ gram per square millimeter) thick layer of −50 mesh (particle diameter less than about 300 μm) magnesium powder (ALFA®, Johnson Matthey, Ward Hill, Mass.). An approximately 24 gram body of matrix metal designated aluminum alloy 336 and nominally comprising by weight about 11.0–13.0% Si; ≦1.2% Fe; 0.5–1.5% Cu; ≦0.35% Mn; 0.7–1.3% Mg; 2.0–3.0% Ni; ≦0.35% Zn; ≦0.25% Ti; and the balance aluminum, was placed on top of the layer of magnesium powder.

The setup comprising the graphite mold and its contents was placed into a retort contained within a resistance heated furnace and the retort door was closed. The retort chamber was then evacuated to about 30 inches (762 mm) of mercury vacuum. After the vacuum had been reached, nitrogen gas flowing at a rate of about 5 liters per minute was introduced into the retort. While maintaining the nitrogen gas flow rate, the furnace and its contents were heated to about 200° C. at about 90° C. per hour. After about 2 hours at about 200° C., the furnace and its contents were heated at about 90° C. per hour to about 815° C. while maintaining the nitrogen gas flow rate. After about 3 hours at about 815° C. with the nitrogen gas flow rate maintained at about 5 liters per minute, the graphite mold and its contents were removed from the retort at about 815° C. and placed on a copper chill plate at about room temperature. The copper chill plate measured about 16 inches (406 mm) long, about 16 inches (406 mm) wide, and about 2.4 inches (61 mm) thick. An insulating ceramic blanket was placed over the top of the setup to prevent the excess molten matrix metal from cooling too rapidly. Thus, by maintaining the high temperature at the top of the setup and providing a heat sink at the bottom of the setup, directional solidification of the molten metal within the setup was effected.

After the setup had cooled to room temperature, the setup was disassembled to reveal that the matrix metal had infiltrated the filler material mixture to form a macrocomposite body comprising an open-ended metal matrix composite box with an aluminum alloy metal lip attached to the perimeter of the open-end of the box.

EXAMPLE 16

The following Example demonstrates the utilization of a spontaneous infiltration technique to form a macrocomposite body comprising an open-ended metal matrix composite box with an aluminum alloy lip around the perimeter of the open-end of the box.

The method of Example 15 was substantially repeated, except that a metal gasket made from an alloy comprising by weight about 15.0% silicon and the balance aluminum was placed into the channel between the outer perimeter of the graphite insert and the inside wall of the rectangular graphite mold prior to injecting the mixture of metal powder and ethanol into the channel. Other differences between the method of the present Example and the method of Example 15 were that: (1) the aluminum alloy gasket had been cut into two pieces prior to insertion into the channel to prevent the warping of the metal gasket during the heating of the setup to the infiltration temperature; and (2) the filler material mixture had been dried in a vacuum oven at about 150° C. for about 1 hour prior to being disposed within the graphite mold.

After the setup had cooled to room temperature, the setup was disassembled to reveal that the matrix metal had infiltrated the filler material mixture to form a macrocomposite body comprising an open-ended metal matrix composite box with an aluminum alloy lip attached to the perimeter of the open-end of the box.

EXAMPLE 17

The following Example demonstrates the utilization of a spontaneous infiltration technique to form a macrocomposite body comprising an open-ended metal matrix composite box with a silicon-aluminum alloy lip around the perimeter of the open-end of the box.

The method of Example 15 was substantially repeated, except that the mixture that was injected into the channel comprised −325 mesh (particle diameter less than about 45 μm) silicon powder and ethanol. In addition, the filler material mixture had been dried in a vacuum oven at about 150° C. for about 1 hour prior to being disposed within the graphite mold. After the setup had cooled to room temperature, the setup was disassembled to reveal that the matrix metal had infiltrated the filler material mixture to form a macrocomposite body comprising an open-ended metal matrix composite box with a silicon-aluminum alloy lip attached to the perimeter of the open-end of the box.

EXAMPLE 18

The following Example demonstrates the utilization of a spontaneous infiltration technique to form a macrocomposite body comprising an open-ended metal matrix composite box with an aluminum alloy lip attached to the perimeter of the open-end of the box.

A rectangular graphite mold having an inner cavity measuring about 2 inches (51 mm) long, about 1 inch (25 mm) wide, and about 1 inch (25 mm) deep, was machined from a solid piece of Grade ATJ graphite (Union Carbide Corporation, Graphite Products Division, Cleveland, Ohio). A graphite insert measuring about 1.875 inches (48 mm) long, about 0.874 inch (25 mm) wide, and about 0.312 inch (7.9 mm) high was placed into the bottom of the graphite mold so that an about 0.312 inch (7.9 mm) deep and about 0.063 inch (1.6 mm) wide channel was created between the perimeter of the graphite insert and the inside wall of the rectangular graphite mold. The interior surfaces of the graphite mold and the exterior surfaces of the graphite insert were then spray coated with the same material, and by the same procedure, described in Example 11. In addition, after the graphite mold and the graphite insert had been coated and dried, the interior of the graphite mold and the surface of the graphite insert were wiped with a clean cloth to remove residue within the graphite mold and on the graphite insert. The interior of the graphite mold and the surface of the graphite insert were then lightly coated with −325 mesh (particle diameter less than about 45 μm) magnesium powder (Reade Manufacturing Company, Lakehurst, N.J.). The light coating was effected by holding a cotton-tipped applicator covered with magnesium powder above the graphite mold and the graphite insert, and tapping the cotton-tipped applicator with a finger to cause the magnesium powder to fall from the cotton-tipped applicator and onto the surfaces of the graphite mold and graphite insert. About 30 grams of a −325 mesh (particle diameter less than about 45 μm) aluminum alloy powder comprising by weight about 7.5–8.5% Si; 3.0–4.0% Cu; 2.7–3.5% Zn; 0.2–0.3% Mg; ≦0.01% Ca; ≦0.01% Ti; 0.7–1.0% Fe; ≦0.50% Ni; ≦0.50% Mn; ≦0.35% Sn; ≦0.01% Be; ≦0.15% Pb; and the balance aluminum was placed into the channel defined by the perimeter of the graphite insert and the inside wall of the rectangular graphite mold. The aluminum alloy powder was leveled by gently shaking the graphite mold in a side-to-side motion. After the aluminum alloy powder had been leveled, a light coating (applied as described above) of −325 mesh (particle diameter less than about 45 μm) magnesium powder (Reade Manufacturing Company, Lakehurst, N.J.) was placed on top of the −325 mesh (particle diameter less than about 45 μm) aluminum alloy powder.

A filler material mixture comprising by weight about 79.7% 39 CRYSTOLON® 220 grit (average particle diameter of about 66 μm) silicon carbide (Norton Company, Worcester, Mass.), about 19.4% 39 CRYSTOLON® 500 grit (average particle diameter of about 17 μm) silicon carbide, and about 2.9% −325 mesh (particle diameter less than about 45 μm) magnesium powder (Reade Manufacturing Company, Lakehurst, N.J.) was made by placing the three materials into a plastic jar and gently shaking the plastic jar to effect mixing. About 20 grams of the filler material mixture were then placed on top of the −325 mesh (particle diameter less than about 45 μm) magnesium powder covering the −325 mesh (particle diameter less than about 45 μm) aluminum powder. The filler material mixture covered the graphite insert contained within the graphite mold. The filler material mixture was leveled by gently shaking the graphite mold in a side-to-side motion. The level surface of the filler material mixture was about 0.38 inch (9.5 mm) above the upper surface of the graphite insert. About 0.15 grams of −50 mesh (particle diameter less than about 300 μm) magnesium powder (ALFA® Johnson Matthey, Ward Hill, N.J.) was then sprinkled evenly on the level surface of the filler material mixture. Copper foil strips were then placed over the opening of the graphite mold to provide a support means for a body of matrix metal. Thereafter, −50 mesh (particle diameter less than about 300 μm) magnesium powder was sprinkled over the surface of the clean copper strips. A gap existed between the copper strips so that the matrix metal, after melting, could gain access to the filler material mixture contained within the graphite mold.

An approximately 38 gram body of matrix metal designated aluminum alloy 336 and nominally comprising by weight about 11.0–13.0% Si; ≦1.2% Fe; 0.5–1.5% Cu; ≦0.35% Mn; 0.7–1.3% Mg; 2.0–3.0% Ni; ≦0.35% Zn; ≦0.25% Ti; and the balance aluminum was placed on top of the magnesium powder coated copper strips located over the opening of the graphite mold, to form a setup.

The setup was then placed into a stainless steel container measuring about 10 inches (254 mm) wide, about 12 inches (305 mm) long, and about 3 inches (76 mm) high. Prior to disposing the setup within the stainless steel container, a piece of Grade PF-25-H PERMA FOIL graphite foil (TTAmerica, Portland, Oreg.) measuring about 12 inches (305 mm) long, about 10 inches (254 mm) wide and about 0.01 inch (0.25 mm) thick, was placed on the bottom of the inner cavity of the stainless steel container. About 10 grams of a titanium sponge material (Chemalloy Company, Incorporated, Bryn Mawr, Pa.) and about 2 grams of −50 mesh (particle diameter less than about 300 μm) magnesium powder (Reade Manufacturing Company, Lakehurst, N.J.) were sprinkled into the bottom of the stainless steel container around the outer edges of the graphite mold and on top of the graphite foil sheet. Both the titanium sponge material and the magnesium powder were utilized as oxygen-getters. A second piece of graphite foil was placed over the top of the setup and pressed against the outer walls of the setup.

The lay-up, comprising the stainless steel container and its contents, was placed into a retort contained within a resistance heated furnace and the retort door was closed. The retort chamber was evacuated to about 30 inches (762 mm) of mercury vacuum and then backfilled with nitrogen gas at a flow rate of about 10 liters per minute. The nitrogen gas flow rate was maintained as the furnace and its contents were heated from room temperature to about 815° C. at about 400° C. per hour. After about 15 hours at about 815° C. with a nitrogen gas flow rate of about 10 liters per minute, the stainless steel container and its contents were removed from the furnace and excess matrix metal was poured out of the graphite mold. The graphite mold and its contents, which were at a temperature of about 815° C., were then placed onto a water cooled aluminum chill plate, which was at about room temperature, and the top of the graphite mold was covered with an insulating ceramic blanket. By maintaining the high temperature at the top of the setup and contacting a heat sink with the bottom at the setup, directional solidification of the molten metal contained within the setup was achieved.

After the setup had cooled to room temperature, the setup was disassembled to reveal that the matrix metal had infiltrated the filler material mixture to form a macrocomposite body comprising a thin walled metal matrix composite box with an aluminum alloy lip attached to the perimeter of the open-end of the box.

EXAMPLE 19

The following Example demonstrates the utilization of a spontaneous infiltration technique in combination with several coating techniques to form a macrocomposite comprising an open-ended metal matrix composite box with an aluminum alloy metal lip along the perimeter of the open-end of the box and a metal coating deposited uniformly on all surfaces of the open-ended metal matrix composite box.

The method of Example 15 was substantially repeated to produce a metal matrix composite box having dimensions of about 2.3 inches (58 mm) long, about 0.45 inch (11 mm) wide, about 0.13 inch (3.3 mm) deep and with an inner chamber having dimensions of about 2.0 inches (51 mm) long, about 0.38 inch (9.5 mm) wide, and about 0.09 inch (2.3 mm) deep. The metal matrix composite box was degreased by submerging the box for about 10 minutes in an ultrasonically agitated acetone bath (ranging in temperature from about 20° C.–30° C.) and then submerging the box in an ultrasonically agitated ethanol bath for about 10 minutes (ranging in temperature from about 25° C.–35° C.). The metal matrix composite box was removed from the ethanol bath and dried with several blasts of clean compressed air.

The metal matrix composite box was then conditioned in a bath comprising approximately 15 volume percent $H_2SO_4$ in water at about 80° C. for about 4 minutes. After this conditioning, the metal matrix composite box was rinsed under cascading tap water to remove any residual $H_2SO_4$ solution from the metal matrix composite box and to cool the box. The metal matrix composite box was subsequently conditioned in a bath comprising about 100 grams of NIKLAD™ multiprep 502 (Witco Corporation, Melrose Park, Ill.) acid pickle, descaler, and desmutter per liter of concentrated $HNO_3$ at a temperature of about 22° C. to about 32° C. for about 1 minute and then immediately rinsed in cool cascading tap water.

The metal matrix composite box was then submerged in an about 10 percent by volume NIKLAD™ 261 (Witco Corporation, Melrose Park, Ill.) precatalyst sensitizer aqueous bath at a temperature of about 22° C. to about 32° C. for about 1.5 minutes and immediately rinsed in cool cascading tap water before being submerged in an ultrasonically agitated deionized water bath at about room temperature for about 5 minutes and again rinsed in cool cascading tap water.

The metal matrix composite box was then dipped in a 10 percent by volume NIKLAD™ 262 (Witco Corporation, Melrose Park, Ill.) catalystaqueous bath at a temperature of about 45° C.–50° C. for about 5 minutes and rinsed in cool cascading tap water before being submerged in an ultrasonically agitated deionized water bath at about room temperature for about 5 minutes and again rinsed in cool cascading tap water.

An electroless nickel plating was then formed on the metal matrix composite box by submerging the box in a bath comprising by volume about 8.5% NIKLAD™ 1000A (Witco Corporation, Melrose Park, Ill.) nickel source/replenisher, about 15.7 NIKLAD™ 1000B (Witco Corporation, Melrose Park, Ill.) complexor/buffer, and the balance deionized water at about 90° C. for about 25 minutes to produce a nickel plate on the metal matrix composite box.

The nickel plated metal matrix composite box was further plated with an electro-nickel plating process which utilized a bath of SN® (Witco Corporation, Melrose Park, Ill.) sulfamate nickel plating solution. Two nickel plates having dimensions of about 12 inches (305 mm) long, 1 inch (25 mm) wide, and 0.25 inch (6.4 mm) thick were connected to the positive terminal of a direct current power supply and placed on opposite sides of the bath to become the collective anode of the electfical circuit. The metal matrix composite box was connected to the negative terminal of the direct current power supply to become the cathode of the electrical circuit. Before the metal matrix composite box cathode was placed in the plating bath, a current was supplied to create a current density of about 30 amperes per square foot. The plating process was performed for about 30 minutes at about 60° C. Mechanical stirring was supplied during the plating procedure.

In a final coating step, the nickel plated metal matrix composite box was gold plated in a plating bath from SEL-REX® Corporation, Neutly, N.J. sold under the trade name SEL-REX® Neutronics 300 gold electroplating solution. The anode in the bath was platinum clad niobium mesh. The cathode in the bath was the nickel plated metal matrix composite box. The original plating bath conditions were a temperature of about 50° C.–55° C. a plating current density of about 16 amperes per square foot, and mechanical stirring. The plating time at the original plating bath conditions was about 30 seconds. Thereafter, the plating current density was changed to about 2 amperes per square foot. The plating time at the lower plating current density was about 27 minutes and the nickel plated metal matrix composite box was inverted in the plating bath after about 13.5 minutes. After the gold plating step was complete, the plated metal matrix composite box was removed from the bath, and rinsed first in deionized water and then in ethanol. A final examination revealed that a macrocomposite body had been formed comprising an open-ended metal matrix composite box with an aluminum alloy metal lip attached to the perimeter of the open-end of the box, and with an about 50–100 microinch coating of gold on top of an about 200–300 microinch coating of nickel. Both the nickel and gold coatings were well bonded to all surfaces of the metal matrix composite box, including the aluminum alloy metal lip.

EXAMPLE 20

The following Example demonstrates the utilization of a spontaneous infiltration technique to form a macrocomposite body comprising an open-ended metal matrix composite box with alloy rich sections in the bottom thereof.

A setup similar to that described in Example 2 was utilized, except for the following differences: (1) no alloy gasket was inserted into the channel created along the perimeter of the graphite insert and the inside wall of the rectangular graphite mold; (2) six holes having a diameter of about 0.065 inch (1.6 mm) and two holes having a diameter of about 0.16 inch (3.9 mm) were drilled perpendicular to the plane of the graphite insert and toward its center and two about 0.5 inch (13 mm) long segments of each of the metal wires listed in the following paragraph were inserted into the holes, with about 0.375 inch (9.5 mm) segments of each wire protruding from the top of the graphite insert.

The first pair of wires comprised a commercially available pure 99.99% aluminum (California Fine Wire Co., Groven City, Calif.) and had a diameter of about 0.064 inch (1.6 mm). The second pair of wires comprised by weight about 12.0% silicon and the balance aluminum and had been electrical discharge machined from an ingot to a cross-section measuring about 0.06 inch (1.5 mm) long and about 0.03 inch (0.76 mm) wide. The third pair of wires comprised commercially pure nickel and had a diameter of about 0.066 inch (1.7 mm). The fourth pair of wires comprised by weight about 4.0% copper and the balance silicon and had been electrical discharge machined from an ingot to a cross-section measuring about 0.06 inch (1.5 mm) long and about 0.06 inch (1.5 mm) wide.

The setup was processed into a metal matrix composite box by the same technique as described in Example 11, except that the matrix metal was coated with −325 mesh (particle diameter less than about 45 μm) magnesium powder prior to being placed on the filler material mixture. Further, deviations from the procedure set forth in Example 11 include the following: the graphite mold was placed on top of a bed of AlN powder contained within a stainless steel container measuring about 6 inches (152 mm) long, about 6 inches (152 mm) wide, and about 4.5 inches (114 mm) deep; the retort chamber and its contents were heated at a rate of about 400° C. per hour to about 815° C. while a nitrogen gas flow rate of about 5 liters per minute was maintained; and after about 3 hours at about 815° C., the flow of nitrogen gas was terminated and the furnace and its contents were cooled to about room temperature at a rate of about 400° C. per hour.

After the lay-up had reached room temperature, the lay-up was disassembled to reveal that the alloy wires had produced metal rich regions within the bottom of the metal matrix composite box. Further analysis showed that the metal wire segments had interacted with the matrix metal and formed alloys in the metal rich regions in the bottom of the metal matrix composite box. Specifically, FIG. 11A, 11B, 11C, and 11D show micrographs (taken at about 50× magnification) of the metal rich regions in the bottom of the metal matrix composite box corresponding respectively to the pure aluminum wire, the 12% silicon and balance aluminum wire, the 4.0% copper and balance silicon wire, and the pure nickel wire.

EXAMPLE 21

The following Example demonstrates the utilization of a spontaneous infiltration technique to form a macrocomposite body comprising a metal matrix composite body with an aluminum alloy region bonded to the surface of the metal matrix composite body.

Figure 12:
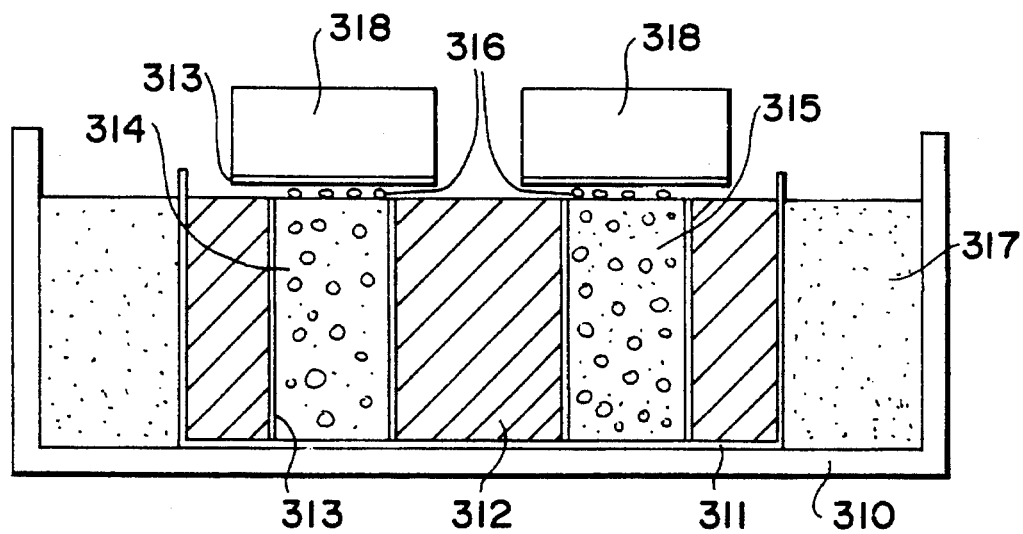
FIG. 12 is a cross-sectional schematic of the setup used to produce the macrocomposite body in accordance with Example 21.
Figure 11A:
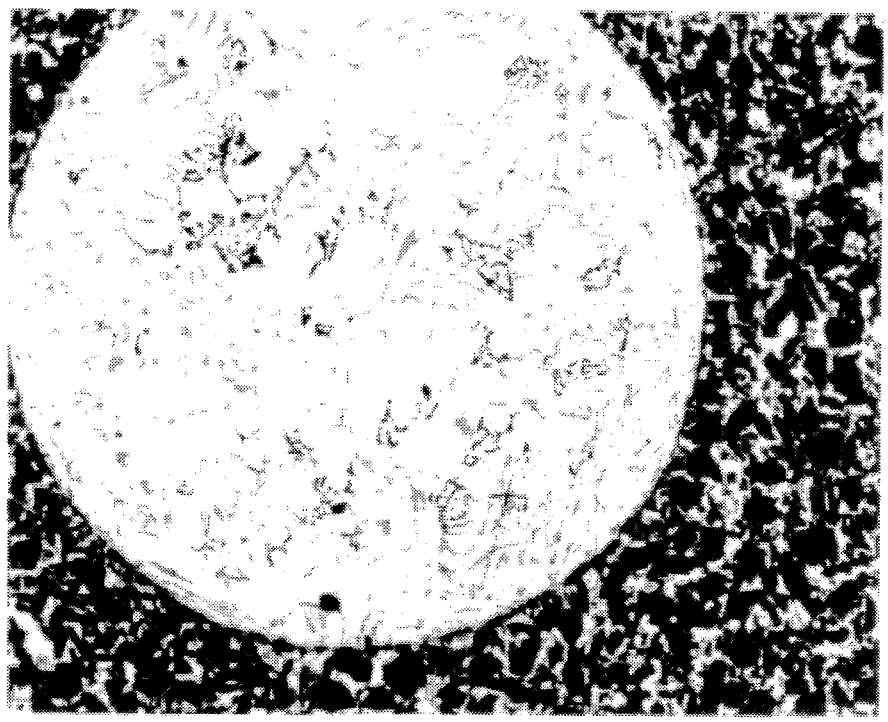
FIGS. 11A, 11B, 11C and 11D are microstructures taken at about 50× magnification of the metal rich areas of the macrocomposite body as produced in Example 20.
Figure 11B:
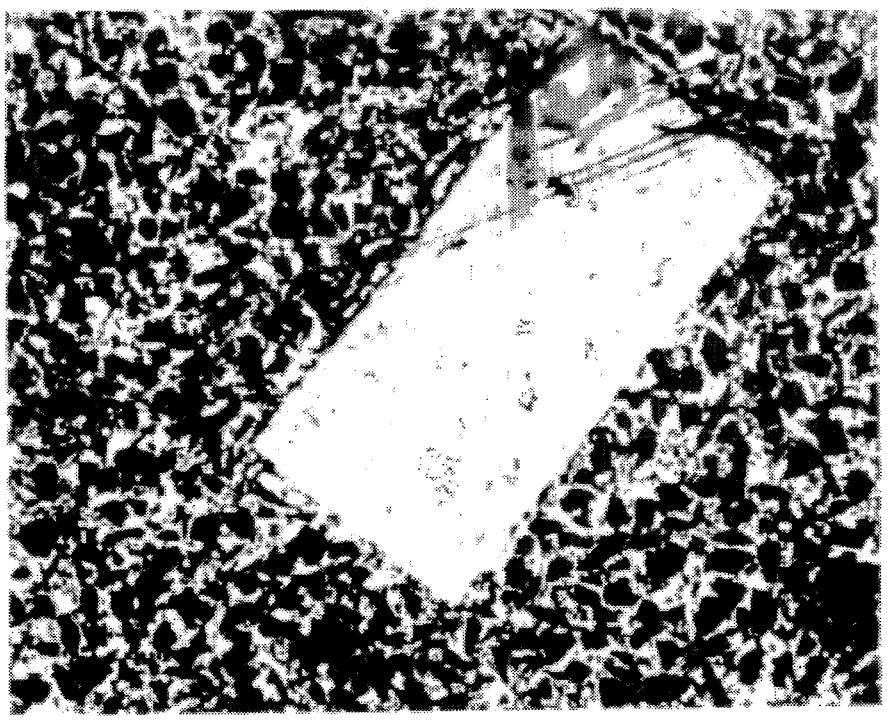
Figure 11C:
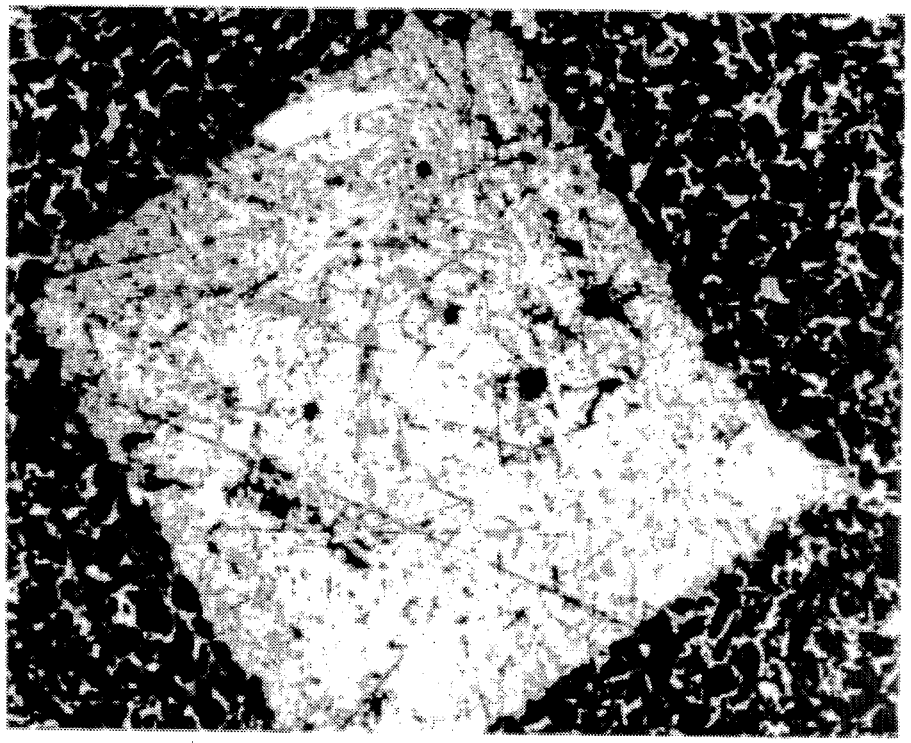
Figure 11D:
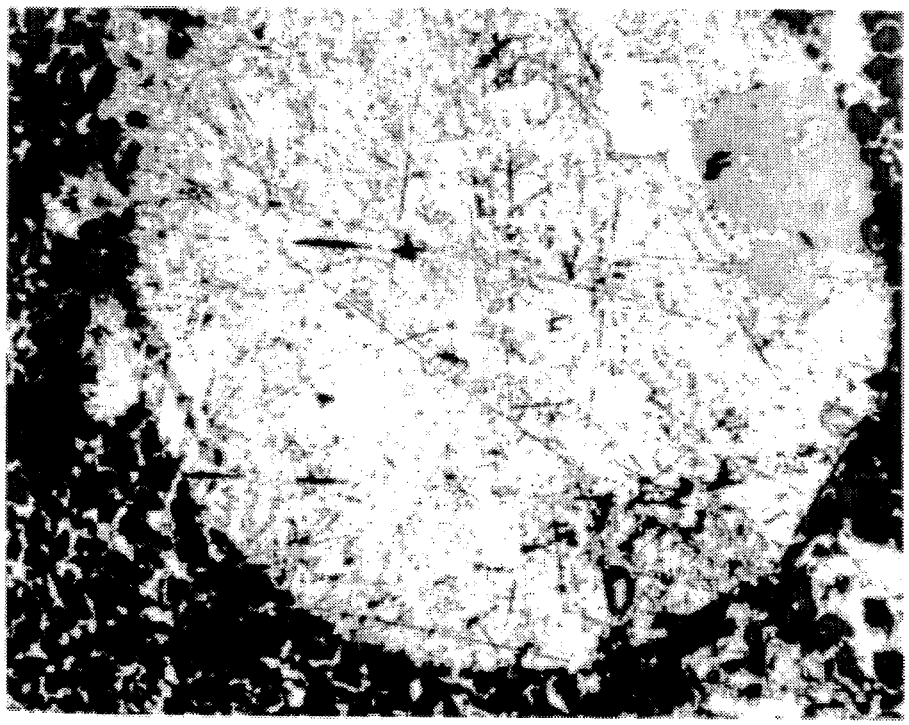

FIG. 12 shows the lay-up cross-section that was used to form the macrocomposite body by spontaneous infiltration. Specifically, a matrix metal ingot comprising about 12% by weight silicon and the balance aluminum and measuring about 4.5 inches (114 mm) long, about 2 inches (51 mm) wide, and about 1 inch (25 mm) thick was subjected to electrical discharge machining to form two holes measuring about 1.97 inches (50 mm) long, about 0.319 inch (8.1 mm) wide, and extending through the ingot. The inner surfaces of the holes were coated with a mixture comprising −325 mesh (particle diameter less than about 45 μm) magnesium powder and ethanol to produce a surface density of magnesium of about 0.05 grams per square inch (7.75×10−5 grams per square millimeter). After the magnesium powder coating 313 had substantially dried, the matrix metal ingot was placed into a graphite foil box 311. The graphite foil box 311 was made from a piece of GRAFOIL® (Union Carbide, Carbon Products Division,.Cleveland, Ohio) measuring about 6.5 inches (165 mm) long, about 4 inches (102 mm) wide, and about 0.015 inch (0.4 mm) thick. Two parallel cuts about 1 inch (25 mm) long were made in the graphite foil on each 6.5 inch (165 mm) long side about 1 inch (25 mm) from each 4 inch (102 mm) wide end. The cut graphite foil was then folded to form the graphite foil box 311 which was about 4.5 inches (114 mm) long, about 2 inches (51 mm) wide, and about 1 inch (25 mm) high.

The graphite foil box 311 containing the matrix metal ingot 312 was placed within a stainless steel container 310 having an inner cavity measuring about 6 inches (152 mm) long, about 6 inches (152 mm) wide, and about 4.5 inches (114 mm) deep. The holes within the matrix metal ingot. were then filled with a filler material mixture 314 comprising by weight about 97% 39 CRYSTOLON® 220 grit (average particle diameter of 66 μm) silicon carbide (Norton Co., Worcester, Mass.) and about 3% −325 mesh (particle diameter less than 45 μm) magnesium powder. 39 CRYSTOLON® 220 grit (average particle diameter of about 66 μm) silicon carbide was then poured into the cavity between the outer surface of the graphite foil box and the inner wall of the stainless steel container to support the graphite foil box during the infiltration process. The surface of the filler material mixture contained within the holes in the matrix metal ingot was covered with a thin layer of −50 mesh (particle diameter less than about 300 μm) magnesium powder (ALFA®, Johnson Matthey, Ward Hill, Mass.). A second matrix metal ingot designated as aluminum alloy 336 and nominally comprising by weight about 11.0–13.0% Si, <1.2% Fe, 0.5–1.5% Cu, <0.35% Mn, 0.7–1.3% Mg, 2.0–3.0% Ni, <0.35% Zn, <0.25% Ti, and the balance aluminum, was placed over the filler material mixture filled openings in the first matrix metal ingot to substantially cover those openings.

The lay-up comprising the stainless steel container 310 and its contents was placed into a retort contained within a resistance heated furnace and the retort door was closed. The retort was then evacuated to about 30 inches (762 mm) of mercury vacuum and heated to about 200° C. at about 300° C. per hour. After about 2 hours, at about 200° C., nitrogen gas was introduced into the retort at a flow rate of about 5 liters per minute and the furnace and its contents were heated to about 815° C. at about 300° C. per hour. After about 3.5 hours at about 815° C., the furnace and its contents were cooled to about 700° C. at about 400° C. per hour while maintaining the nitrogen flow rate at about 5 liters per hour. After about 10 hours at about 700° C., with a nitrogen flow rate of about liters per hour, the flow of nitrogen and the power to the furnace were terminated and the lay-up was removed from the furnace at about 700° C. and placed onto a water cooled copper chill plate at about room temperature. Immediately after placing the lay-up onto the copper chill plate, the top of the lay-up was covered with a ceramic insulating blanket to maintain the high temperature at the top of the lay-up. By maintaining the high temperature at the top of the lay-up and providing a heat-sink at the bottom of the lay-up, directional solidification of the molten metal contained within the lay-up was effected.

Figure 13:
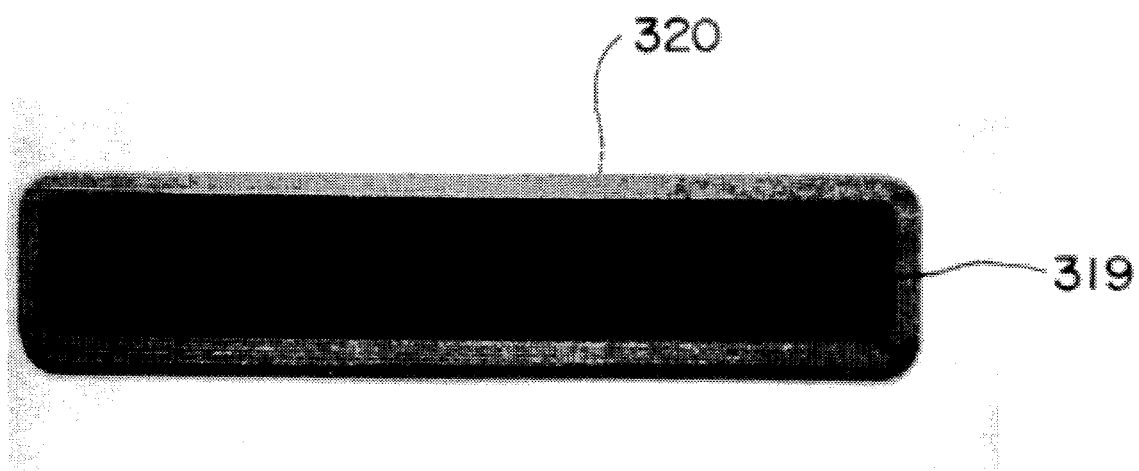
FIG. 13 is a photograph of the macrocomposite body produced in accordance with Example 21.

After the lay-up had cooled to room temperature, the lay-up was disassembled to reveal that the matrix metals had infiltrated the filler material mixtures 314 and 315 to form a macrocomposite body comprising two metal matrix composite bodies surrounded, and attached to, a body of aluminum alloy. The macrocomposite body was then cut in half so that each of the matrix metal infiltrated bodies of filler material mixture (314 and 315) were separate. Each of the separate matrix metal infiltrated bodies of filler material mixture was surrounded by and attached to a body of aluminum alloy. The above-described bodies were then further subjected to electro-discharge machining to form wafers measuring about 2.09 inches (53 mm) long, about 0.439 inches (11 mm) wide, and about 0.060 inch (1.5 mm) thick. These macrocomposite wafers comprised a metal matrix composite body with an aluminum alloy band attached to the perimeter thereof that is suitable for laser welding to a macrocomposite box formed by the technique described in Example 15. Specifically, FIG. 13 shows a photograph of the macrocomposite wafer with the metal matrix portion 319 surrounded by an aluminum alloy lip 320.

EXAMPLE 22

The following Example demonstrates the utilization of a spontaneous infiltration technique to form a macrocomposite body comprising a metal and a metal matrix composite, wherein the metal is pre-reacted in order to minimize the reaction of the matrix metal of the metal matrix composite body and the metal incorporated therein.

Figure 14:
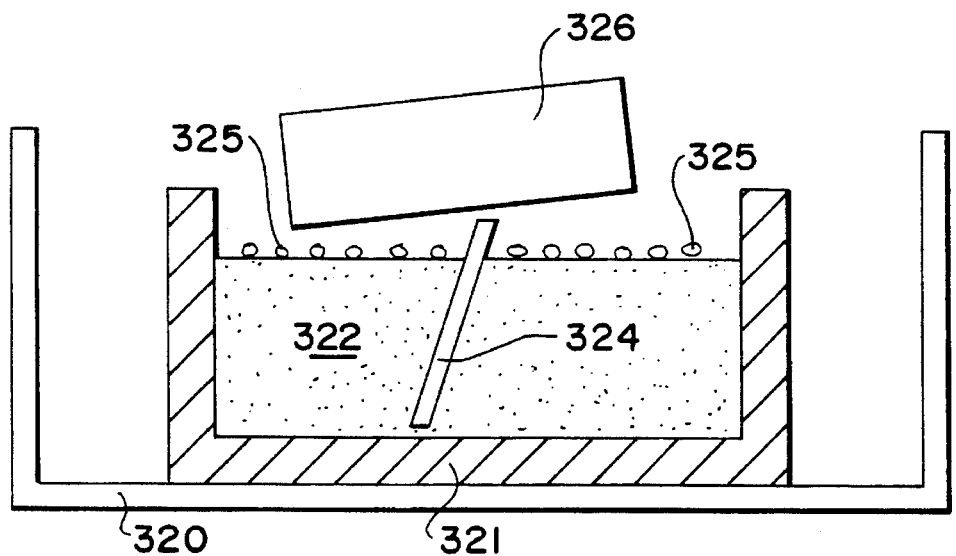
FIG. 14 is a cross-sectional schematic of the setup used to produce the macrocomposite body in accordance with Example 22.

FIG. 14 shows a schematic cross-section of the setup used to produce the macrocomposite body. Specifically, a graphite boat 321 having an inner cavity measuring about 3 inches (76 mm) long, about 3 inches (76 mm) wide, and about 2.5 inches (64 mm) high was machined from Grade ATJ graphite (Union Carbide Corp., Carbon Products Division, Cleveland, Ohio). The graphite boat 321 was placed into a stainless steel container 320 measuring about 6 inches (152 mm) long, about 6 inches (152 mm) wide, and about 4.5 inches (114 mm) deep. A filler material mixture 322 comprising by weight about 77.7% 39 CRYSTOLON® 220 grit (average particle diameter of about 66 μm) silicon carbide (Norton Co., Worcester, Mass.), about 19.4% 39 CRYSTOLON® 500 grit (average particle diameter of about 17 μm) silicon carbide, and about 2.9% −325 mesh (particle diameter less than about 45 μm) magnesium powder (Reade Manufacturing Co., Lakehurst, N.J.) was placed into the graphite boat 321 to a depth of about 1 inch (25 mm) and levelled. The filler material mixture 322 was then coated with −50 mesh (particle diameter less than about 300 μm) magnesium powder 325 (ALFA®, Johnson Matthey, Ward Hill, Mass.).

In one setup, as described above and schematically shown in FIG. 14, a pre-nitrided piece of commercially available (description) titanium 324 measuring about 2 inches (50 mm) long, about 1 inch (25 mm) wide, and about 0.06 inch (1.5 mm) thick was placed into the filler material mixture 322. The titanium piece 324 had been pre-nitrided by heating it from room temperature to about 1400° C. at about 250° C. per hour in flowing nitrogen gas having a flow rate of about 1 liter per minute. After about 1 hour at about 1400° C., with a nitrogen flow rate of about 1 liter per minute, the sample was cooled to room temperature at about 250° C. per hour. An approximately 63 gram body of matrix metal 326 designated aluminum alloy 336 and having the composition described in the following paragraph was placed onto the filler material mixture 322 coated with the magnesium powder 325.

In a second setup, as described above and illustrated in FIG. 14, a piece of titanium alloy 324 having substantially the same size as that described above for the nitrided piece of titanium was placed into the filler material mixture 322 as illustrated in FIG. 14. An approximately 63 gram body of matrix metal 326 designated aluminum alloy 336 and nominally comprising by weight about 11.0–13.0% Si, ≦1.2% Fe, 0.5–1.5% Cu, ≦0.35% Mn, 0.7–1.3% Mg, 2.0–3.0% Ni, ≦0.35% Zn, ≦0.25% Ti, and the balance aluminum, was placed onto the filler material mixture 322 coated with the magnesium powder 325.

Each of the two setups described above were placed into retorts contained within separate resistance heated furnaces and the retort doors were closed. At about room temperature, a vacuum of about 30 inches of mercury was created within the retort chambers and the furnaces and their contents were heated to about 200° C. at about 400° C. per hour. After about an hour at about 200° C., nitrogen gas at a flow rate of about 5 liters per minute was introduced to each retort chamber and the furnaces and their contents were heated at about 400° C. per hour to about 815° C. After about 3 hours at about 815° C., the flow of nitrogen gas was terminated and the furnaces were cooled to about room temperature at about 400° C. per hour.

Figure 15A:
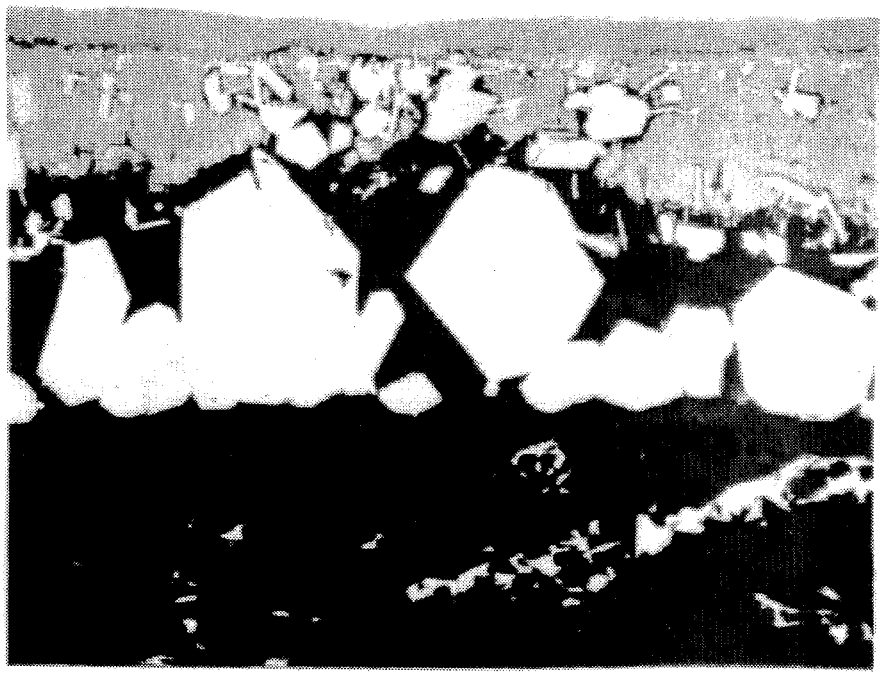
FIGS. 15A and 15B are micrographs done in the back-scattered electron mode taken at about 200× magnification of the interaction of the matrix metal and the titanium alloy in Example 22.
Figure 15B:

After the lay-ups had cooled to room temperature, the lay-ups were disassembled to reveal that the matrix metal had infiltrated the filler material mixture 322 and embedded the titanium pieces 324 to form macrocomposite bodies. The macrocomposite bodies were then sectioned with a diamond saw, and the sections were mounted and polished so that the interaction between the matrix metal and the titanium metal incorporated within the aluminum alloy metal matrix could be examined. FIGS. 15A and 15B are microstructures of the two macrocomposite bodies showing the interaction between the matrix metal and the titanium inserts. Specifically, FIG. 15A micrograph taken at about 200× magnification of the interaction area between the titanium metal insert which was not pre-nitrided and the aluminum alloy matrix metal showing the formation of intermetallics to a depth of about 250 microns within the titanium metal insert. In contrast, FIG. 15B, which is also a micrograph taken at about 200× magnification, shows that the extent of the interaction between the titanium metal insert and the matrix metal can be reduced by pre-nitriding the titanium metal insert. As shown in FIG. 15B, the interaction area has been reduced to a thickness of about 10 microns.

Thus, this Example demonstrates that the interaction between the molten matrix metal and a body of metal to be bonded or attached to the matrix metal can be reduced by forming a coating on the body of metal which resists interaction with the molten matrix metal.

EXAMPLE 23

The following Example demonstrates the utilization of a spontaneous infiltration technique to form a macrocomposite body comprising an open-ended metal matrix composite box containing a plurality of electrical feed-throughs.

Figure 16A:
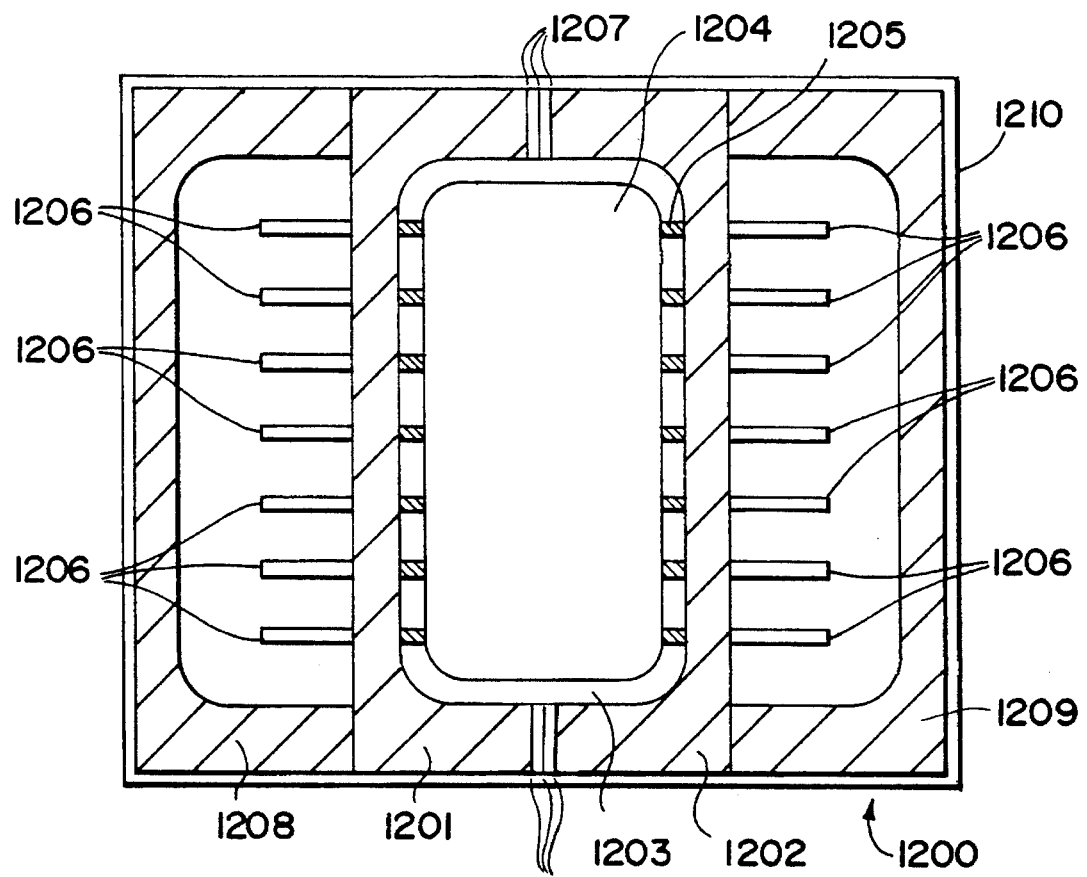
FIG. 16A is a top view schematic of the setup used to produce the macrocomposite body in accordance with Example 23.

FIG. 16A shows a top view schematic of the setup used to make a macrocomposite comprising an open-ended metal matrix composite box with 14 electrical feed-throughs through its side walls. Specifically, a mold similar to the mold used in Example 9, was cut in half and in the side walls of each mold half seven holes, each having a diameter of about 0.039 inch (1.0 mm), were drilled in a line about 0.28 inch (7.1 mm) above the bottom of the mold. The holes were equally spaced about 0.25 inch (6.4 mm) apart. Likewise, a graphite insert, similar to the graphite insert described in Example 9, was also drilled with seven holes on each side which aligned with the holes in the side walls of the mold halves when the mold halves and graphite insert were assembled. Each of these holes was designed to accommodate a portion of an electrical feed-through. After the holes had been drilled, the mold halves, the graphite insert, and 14 electrical feed-throughs were coated with a colloidal graphite mixture as described in Example 9. The coating procedure was repeated four times and each coating was allowed to dry prior to the application of a subsequent coating. The seam between mold halves 1201 and 1202 was filled with three pieces of GRAFOIL® graphite foil 1207. The circumferential edges of the alumina disk portion 1205 of the electrical feed-throughs 1206 were sanded prior to assembly to remove any of the colloidal graphite coating. The mold halves 1201 and 1202, the graphite insert 1204, and the electrical feed-throughs 1206 were cured together in an air atmosphere furnace for about 2 hours at about 400° C.

To complete the setup, as shown in FIG. 16A, a second graphite mold was cut in half and the mold halves 1208 and 1209 were contacted to the outer surfaces of mold halves 1201 and 1202 as shown in FIG. 35 and copper wire 1210 was wrapped three times around the setup to clamp the setup together.

After the assembly, as shown in FIG. 16A, had been completed, a filler material mixture comprising by weight about 67.3% 39 CRYSTOLON® 220 grit silicon carbide (average particle diameter of about 66 μm) (Norton Co., Worcester, Mass.), about 28.8% 39 CRYSTOLON® 500 grit silicon carbide (average particle diameter of about 17 μm), and about 3.9% −200 mesh $Mg_2Cu$ (particle diameter smaller than about 75 μm) (University of Missouri-Rolla), was mixed with a mortar and pestle and poured then into the first graphite mold formed by mold halves 1201 and 1202. The surface of the filler material mixture was then covered with a piece of graphite foil having a hole measuring about 0.50 inch (13 mm) in diameter and additional −200 mesh $Mg_2Cu$ was placed along the perimeter of the graphite foil and within the hole. A body of the same matrix metal used in Example 9, but weighing about 52.3 grams, was placed onto the graphite foil.

The setup, comprising the assembly and its contents, was placed onto a bed of Grade B aluminum nitride powder (about 0.4 micron in diameter) (Hermann C. Stark, Inc., New York, N.Y.) contained within a graphite boat. The graphite boat and its contents were placed into a retort contained within a resistance heated furnace, as described in Example 9, and a vacuum of about 30 inches (762 mm) of mercury was created within the retort chamber. The furnace and its contents were then heated to about 200° C. in about one hour and a nitrogen flow rate of about 5 liters per minute was introduced. After about 7.7 hours at about 200° C. with a nitrogen flow rate of about 5 liters per minute, the furnace and its contents were heated to about 810° C. at about 200° C. per hour. The same nitrogen gas flow rate was maintained at all times. After about 5 hours at about 810° C., the power to the furnace and the flow of nitrogen gas were terminated and the graphite boat was removed from the furnace. The setup at about 810° C. was placed onto a water cooled aluminum chill plate at about room temperature. The aluminum chill plate had dimensions of about 12 inches (305 mm) long, about 10 inches (254 mm) wide, and about 2 inches (51 mm) thick. By providing a heat sink at the bottom of the hot setup, the directional solidification of the molten metal contained within the setup was effected.

Figure 16B:
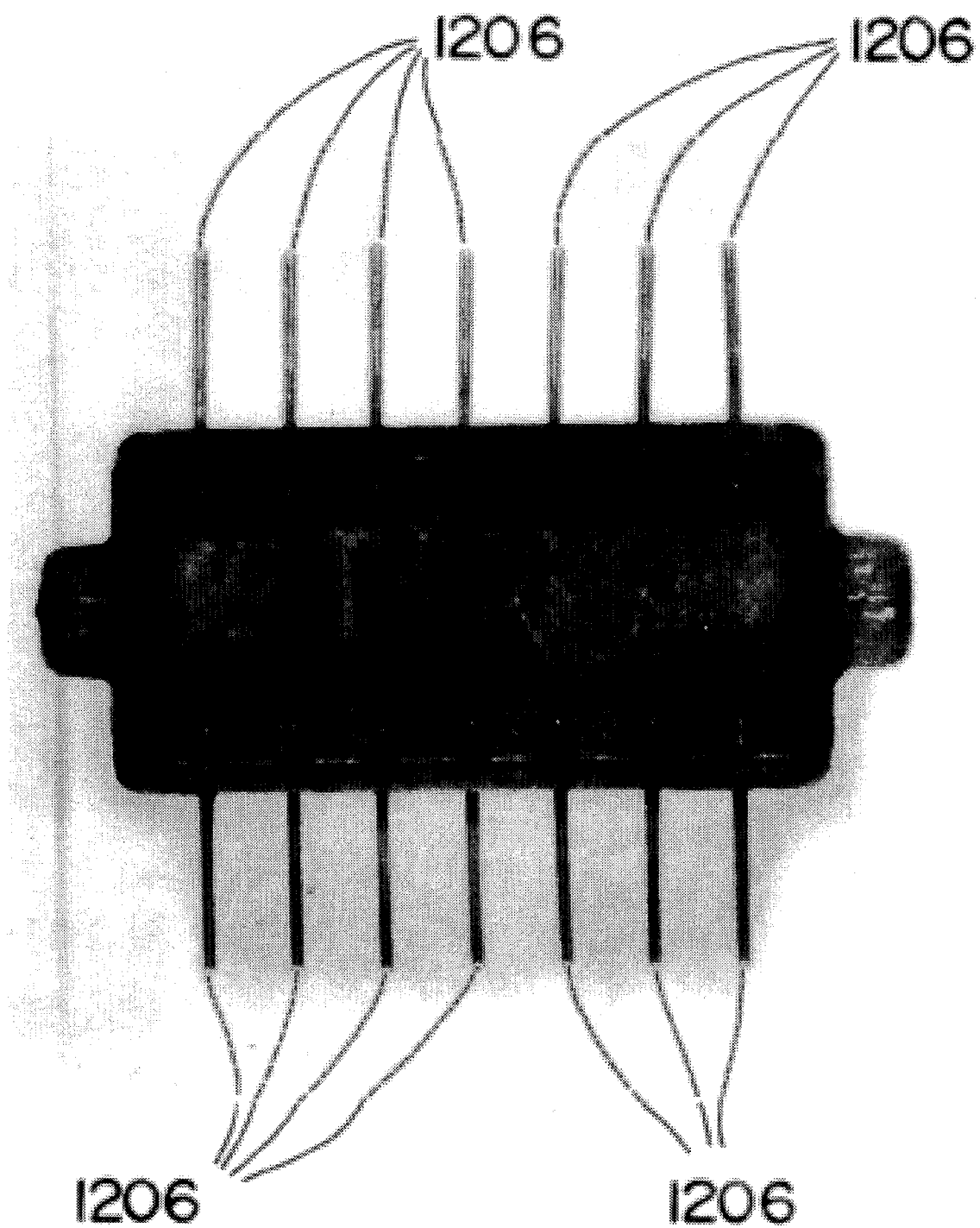
FIG. 16B is a photograph of the macrcomposite body produced in accordance with Example 23.

After the setup had cooled to room temperature, the setup was disassembled to reveal that the matrix metal had infiltrated the filler material mixture and embedded the alumina disk portions 1205 of the electrical feed-throughs 1206, to form a macrocomposite body comprising an open-ended metal matrix composite box, with the electrical feed-throughs bonded to and electrically insulated from the metal matrix composite box by the alumina disk portions 1205 of the electrical feed-throughs 1206. Specifically, FIG. 16B shows the open-ended metal matrix composite box with the 14 electrical feed-throughs 1206 in its side walls.

EXAMPLE 24

The following Example demonstrates a method of incorporating strip line feed-throughs into a metal matrix composite box.

Figure 17:
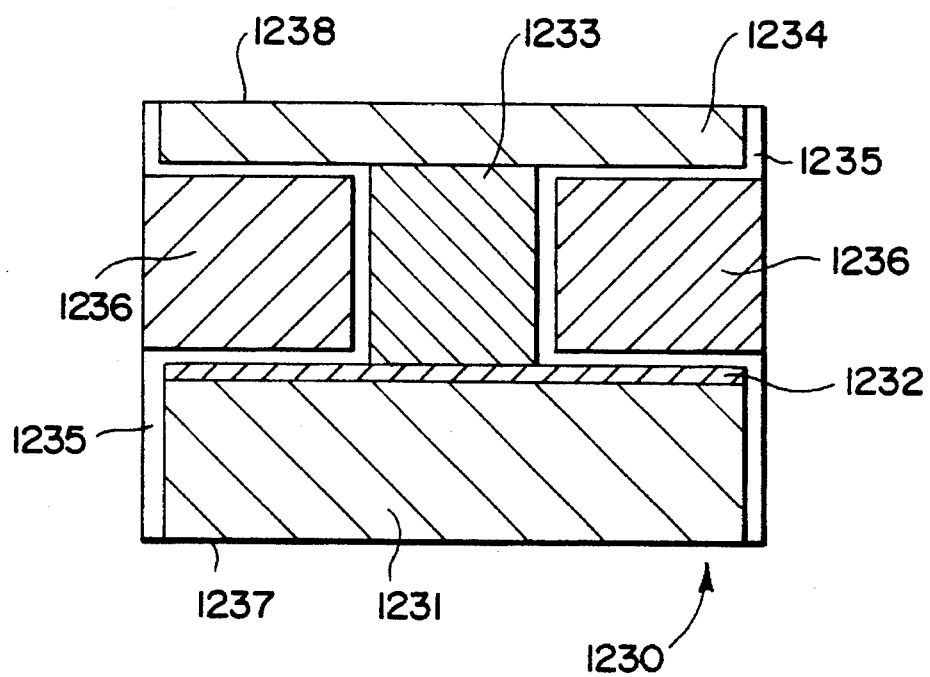
FIG. 17 is a cross-sectional schematic of the strip line feed-through prepared for incorporation into the setup to produce a macrocomposite body in accordance with Example 24.

Specifically, FIG. 17 shows a cross-sectional schematic of a strip line feed-through 1230 just prior to incorporation into a graphite mold for the subsequent formation of a macrocomposite body comprising an open-ended metal matrix composite box containing the strip line feed-throughs therein. The strip line feed-through, as illustrated in FIG. 37, comprises an alumina base 31 measuring about 0.36 inch (9.1 mm) long, about 0.11 inch (2.8 mm) wide, and about 0.015 inch (0.4 mm) thick. An electrically conductive coating 1232 comprising gold coated tungsten was placed onto the base 1231. Subsequently, an alumina pedestal 1233 is placed on top of the electrically conductive coating 1232. The pedestal 1233 measured about 0.36 inch (9.1 mm) long, about 0.04 inch (1.0 mm) wide, and about 0.15 inch (0.4 mm) high. An alumina top piece 1234 measuring about 0.36 inch (9.1 mm) long, about 0.11 inch (2.8 mm) wide, and about 0.01 inch (0.25 mm) thick is attached to pedestal 1233. The strip line feed-through was manufactured by Tech-Ceram Corp., Amesburg, Mass. to applicants' specifications.

The strip line feed-through was placed onto a piece of masking tape such that surface 1237 contacted the adhesive side of the tape. The remaining surfaces were then coated four times with the colloidal graphite ethanol mixture described in Example 9. Each coating was allowed to substantially dry before the subsequent coating was applied. After the fourth coating had sufficiently dried, the graphite coating was scraped from the top 1234 to expose surface 1238. A gap along the length of both sides of the pedestal 1233 was filled with several pieces of graphite foil 1236 to complete the preparation of the strip line electrical feed-through for incorporation into a two piece graphite mold (similar to the mold described in Example 33) designed for making a macrocomposite body comprising an open-ended metal matrix composite box with strip line feed-throughs in the side walls thereof.

A filler material mixture comprising about 66% 39 CRYSTOLON® 220 grit (average particle diameter of about 66 lm) silicon carbide (Norton Co., Worcester, Mass.), about 28.3% 39 CRYSTOLON® 500 grit (average particle diameter about 17 μm) silicon carbide (Norton Company, Worcester, Mass.), and about 5.7% −200 mesh (particle diameter less than about 75 μm) $Mg_2Cu$ (description) was mixed with a mortar and pestle and placed into the graphite mold. The surface of the filler material mixture was then covered with a piece of graphite foil having two holes measuring about 0.25 inch (6.4 mm) in diameter. Additional $Mg_2Cu$ was then placed along the perimeter of the graphite foil and within the holes in the graphite foil. Two about 12.5 gram bodies of the same matrix metal used in Example 9, were placed over the holes in the graphite foil. The graphite mold and its contents were then placed onto a bed of Grade B aluminum nitride powder (about 0.4 micron in diameter) (Hermann Starck, Inc., New York, N.Y.) contained within a graphite boat. The heating schedule described in Example 23 was repeated, except that the time at about 200° C. was about 6.5 hours. After the setup had cooled to room temperature, the setup was disassembled to reveal that the matrix metal had infiltrated the filler material mixture and embedded the strip line feed-throughs to form a macrocomposite body comprising an open-ended metal matrix composite box with strip line feed-throughs contained in the side walls thereof. The strip line feed-throughs were well bonded to the open-ended metal matrix composite box at surfaces 1237 and 1238 of the feed-throughs and the electrically conductive tungsten coating of each feed-through was electrically insulated from the metal matrix composite box by the alumina structure of each feed-through as well as the graphite coating and graphite foil on the side surfaces of each feed-through.

EXAMPLE 25

The following Example demonstrates the use of a spontaneous infiltration technique, metal coating techniques and a seam sealing technique to form macrocomposite bodies comprising open-ended metal matrix composite boxes with a titanium alloy lips around the perimeter of the open-end of the boxes coated with a duplex gold-nickel coating and closed by attaching a gold-nickel coated KOVAR® alloy lid.

Figure 18:
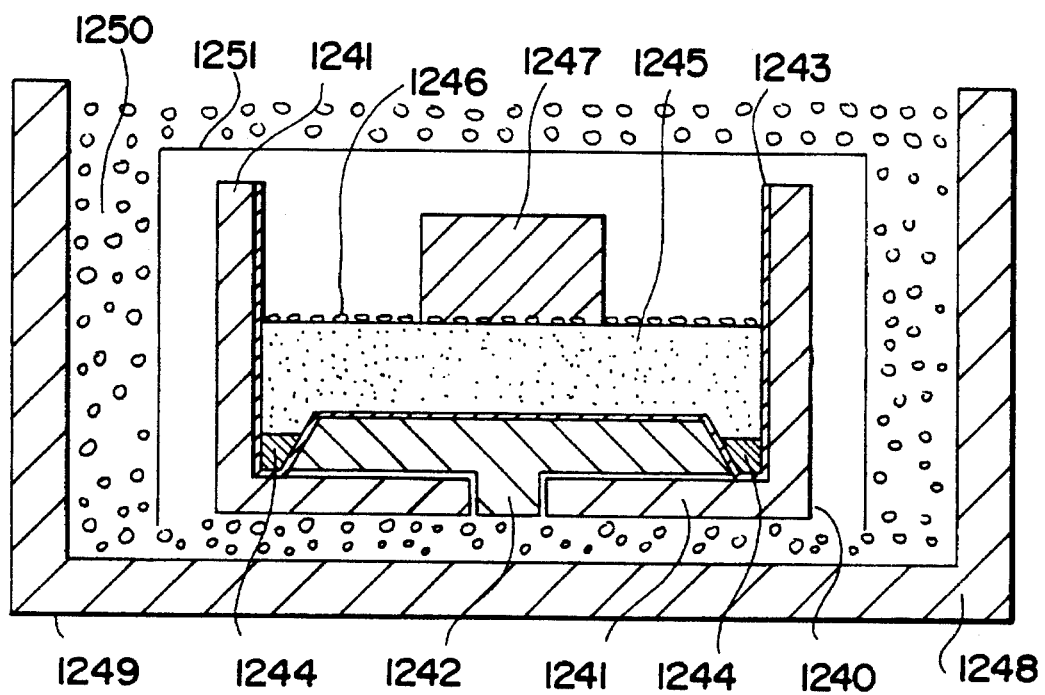
FIG. 18 is a cross-sectional schematic of the lay-up used to produce the open-ended metal matrix composite boxes of Example 25.

FIG. 18 is a cross-sectional schematic of the lay-up 1249 used to produce the open-ended metal matrix composite boxes of this Example. Specifically, rectangular graphite molds 1241 having wall thickness of about 0.25 inch (6.4 mm) and an inner cavity measuring about 2 inches (51 mm) long, about 1 inch (25 mm) wide, and about 1 inch (25 mm) deep, were machined from a solid pieces of graphite. Two rectangular molds 1241 were machined from Grade AXF-5Q graphite (Poco Graphite, Inc., Decatur, Tex.) and four rectangular molds were machined from Grade ATJ graphite (Union Carbide Corporation, Carbon Product Division, Cleveland, Ohio). Graphite inserts 1242 measuring about 1.875 inches (48 mm) long, about 0.874 inch (22 mm) wide, and about 0.312 inch (7.9 mm) high were placed into the bottom of the graphite molds 1242 so that an about 0.312 inch (7.9 mm) deep and about 0.63 inch (1.6 mm) wide channels were created between the perimeter of the graphite insert 1242 and the inside wall of the rectangular graphite mold 1241. The graphite molds 1241 and the graphite inserts 1242 were then spray coated with five applications of a mixture comprising by volume about 50% DAG® 154 colloidal graphite (Acheson Colloids, Port Huron, Mich.) and about 50% ethanol. Each coating was allowed to dry before the subsequent coating was applied.

Metal gaskets 1244 were electrical discharge machined from an about 0.04 inch (1 mm) thick sheet of titanium alloy having a nominal composition comprised by weight of about 5.50–5.75% Al, 3.50–4.50% V, <0.30% Fe and the balance titanium. The metal gaskets 1244 had dimensions of about 1.99 inches (51 mm) for its long sides, about 0.9 inch (23 mm) for its short sides, about 0.40 inch (10 mm) thick from top surface to bottom surface, and about 0.50 inch (1.30 mm) in wall width so that they substantially completely covered the exposed surfaces of the bottom of the rectangular molds 1241 which were not covered by the graphite inserts 1242. After electrical discharge machining, all the surfaces of each titanium alloy gasket 1244 were grit blasted at a working pressure of about 12 pounds per square inch (0.84 kilograms per square centimeter). The titanium alloy gaskets 1244 were then cleaned by soaking in dehydrated ethanol for about 15 minutes. After air drying for about 5 minutes, the titanium alloy gaskets 1244 were affixed with SCOTCH™ double coated tape to a brown wrapping paper supported by a steel sheet measuring about 6 inches (152 mm) square and about 0.125 inch (3.2 mm) thick. The exposed surfaces of the titanium alloy gaskets 1244 were then spray coated using an air brush with the mixture comprised by volume of about 50% DAG® 154 colloidal graphite (Acheson Colloids, Port Huron, Mich.) and 50% ethanol. The application of each coating involved spraying the mixture on the accessible surfaces of the titanium alloy gaskets 1244 and then rotating the steel sheet supporting the brown wrapping paper to access the uncoated surfaces of the titanium alloy gaskets 1244. The steel sheet was rotated until all the surfaces of the titanium alloy gaskets 1244 were coated. About 10 minutes elapsed prior to applying subsequent coatings. Once the three coatings of the colloidal graphite-ethanol mixture had substantially completely dried, the mixture coated titanium alloy gaskets 1244 were removed from the brown wrapping paper. One mixture coated titanium alloy gasket 1244 was then placed into each channel between the graphite insert 1242 and the inside walls of the six rectangular graphite molds 1241 so that the graphite coating on the titanium alloy gaskets 1244 contacted the graphite coating 1243 on the rectangular graphite molds 1241 and the graphite inserts. The spray coated graphite molds 1241, the spray coated graphite inserts 1242 and the spray coated titanium gaskets were placed into an air atmosphere oven at about 400° C. for about three hours to cure the graphite coating 1243.

A filler material mixture 1245 was made by mixing in a plastic jar on a ball mill for about 24 hours a mixture comprising by weight about 68.6% 39 CRYSTOLON® 220 grit (average particle diameter of about 66 μm) silicon carbide (Norton Company, Worcester, Mass.), 29.4% 39 CRYSTOLON® 500 grit (average particle diameter of about 17 μm) silicon carbide (Norton Company, Worcester, Mass.) and about 2.0% −325 mesh (particle diameter less than about 45 μm) magnesium powder (Reade Manufacturing Company, Lakehurst, N.J.).

About 16 grams of filler material mixture 1245 were poured into the bottom of each graphite mold 1242 to cover the titanium alloy gasket 1244 and the graphite insert 1241. The filler material mixture 1245 was thereafter leveled within each graphite mold 1241 and covered with a layer 1246 of −50 mesh (particle diameter less than about 300 μm) magnesium powder (Hart Corporation, Tamaqua, Pa.).

Approximately 35 gram bodies of matrix metal 1247 comprised by weight of about 12.0% Si; 1.0% Cu; 0.2% Hg; 2.5% Ni and the balance aluminum, were placed onto the layer 1246 of −50 mesh (particle diameter less than about 300 μm) magnesium powder covering the filler material mixture 1245, to form 6 setups 1240.

The six setups 1240 were placed onto a layer of Grade B aluminum nitride powder (Hermann C. Stark, Inc., New York, N.Y.) contained within a graphite boat 1248. The graphite boat 1248 was machined from a piece of Grade AGSX graphite (Union Carbide Corporation, Carbon Products Division, Cleveland, Ohio) and had an inner cavity measuring about 9 inches (229 mm) square by about 3 inches (76 mm) deep and had a wall thickness of about 0.5 inch (13 mm). The layer of aluminum nitride was about 0.125 inch (3 mm) deep and substantially completely covered the bottom of the graphite boat 1248. The six setups 1240 (only one shown in FIG. 38) were then covered with an inverted box 1251 measuring about 7.5 inches (191 mm) square, about 1.5 inches (39 mm) high and having a thickness of about 0.015 inch (0.38 mm) thick. The construction materials of the inverted box 1251 comprised GRAFOIL® graphite foil (Union Carbide Corporation, Carbon Products Division, Cleveland, Ohio). The space between the outer surface of the inverted box 1251 and the inner walls of the graphite boat 1248 was then substantially completely filled with additional Grade B aluminum nitride (Hermann C. Stark, Inc., New York, N.Y.) to form a lay-up 1249.

The lay-up 1249 comprising the graphite boat 1248, the graphite molds 1242, and their contents, was placed into a retort contained within a resistance heated furnace and the retort door was closed. The retort chamber was then evacuated to about 30 inches (762 mm) of mercury vacuum and for about 15 minutes then backfilled with nitrogen gas flowing at a rate of about 5.0 liters per minute. The about 5.0 liters per minute nitrogen gas flow rate was maintained as the furnace was heated to about 200° C. in about one hour. After about 6.7 hours at about 200° C., the furnace and its contents were heated to about 810° C. at about 200° C. per hour. After about 5 hours at about 810° C. with a nitrogen gas flow rate of about 5.0 liters per minute, the furnace and its contents were cooled to about 760° C. at about 200° C. per hour. At about 760° C., both the continuous flow of nitrogen gas and the power to the furnace were terminated. The lay-up was removed from the furnace at about 670° C., disassembled and placed on top of a water cooled aluminum chill plate. In addition, shortly after the six setups 1248 were placed on top of the chill plate, the surfaces of the excess molten metal contained within the graphite molds 1241 were covered with FEEDOL® No. 9 hot-topping material (Foseco, Cleveland, Ohio) to cause an exothermic reaction which supplied heat to the surfaces of the excess molten metal. The combination of a heat source on the upper end of the setup 1240 and a heat sink on the bottom of the setup 1240 resulted in the directional solidification of the molten metal contained within the lay-up.

After each setup 1240 had cooled to about room temperature, each setup was disassembled to reveal that a titanium alloy gasket 1244 was attached to an open-ended metal matrix composite box comprising the filler material mixture 1245 embedded within the matrix metal, thereby forming a macrocomposite body. After diamond machining, the six metal matrix composite boxes were cleaned by submerging the boxes for about 10 minutes in a SPARKLEEN™ detergent-water bath (Fisher Scientific, Pittsburgh, Pa.) at about 20° C. and then rinsing the boxes under cascading tap water.

The macrocomposite boxes were then conditioned in an agitated bath comprising approximately 15 volume percent $H_2SO_4$ in water at about 80° C. for about 4 minutes. After this conditioning, the macrocomposite boxes were rinsed under cascading tap water to remove any residual $H_2SO_4$ solution from the metal matrix composite boxes and to cool the box. The macrocomposite boxes were subsequently conditioned in a bath comprising about 100 grams of NIKLAD™ multiprep 502 (Witco Corporation, Melrose Park, Ill.) acid pickle, descaler, and desmutter per liter of concentrated $HNO_3$ at a temperature of about 20° C. for about 1 minute and then immediately rinsed in cool cascading tap water.

The macrocomposite boxes were then submerged in an about 10 percent by volume NIKLAD™ 261 (Witco Corporation, Melrose Park, Ill.) precatalyst sensitizer aqueous bath at a temperature of about 20° C. for about 1.5 minutes and immediately rinsed in cool cascading tap water before being submerged in an ultrasonically agitated tap water bath at about room temperature for about 5 minutes and again rinsed in cool cascading tap water.

The macrocomposite boxes were then dipped in a 5 percent by volume NIKLAD™ 262 (Witco Corporation, Melrose Park, Ill.) catalyst-aqueous ultrasonically agitated bath at a temperature of about 50° C. for about 5 minutes and rinsed in cool cascading tap water before being submerged in an ultrasonically agitated deionized water bath at about room temperature for about 5 minutes and again rinsed in cool cascading tap water.

An electroless nickel plating was then formed on the macrocomposite boxes by submerging the box in a bath comprising by volume about 15% NIKLAD™ 1000A (Witco Corporation, Melrose Park, Ill.) nickel source/replenisher, about 5% NIKLAD™ 1000B (Witco Corporation, Melrose Park, Ill.) complexor/buffer, and the balance deionized water at about 70° C. for about 20 minutes to produce a nickel plate on the metal matrix composite box and again rinsed in cool cascading tap water.

The nickel plated macrocomposite boxes were further plated with an electro-nickel plating process which utilized a bath of SN® (Witco Corporation, Melrose Park, Ill.) sulfamate nickel plating solution containing about 60 grams of boric acid per liter. Two nickel plates having dimensions of about 12 inches (305 mm) long, 1 inch (25 mm) wide, and 0.25 inch (6.4 mm) thick were connected to the positive terminal of a direct current power supply and placed on opposite sides of the bath to become the collective anode of the electrical circuit. The macrocomposite boxes were connected to the negative terminal of the direct current power supply to become the cathode of the electrical circuit. Before the metal matrix composite box cathodes were placed in the plating bath, a current was supplied to create a current density of about 25 amperes per square foot. The plating process was performed for about 15 minutes at about 60° C. Mechanical stirring was s dpplied during the plating procedure. The macrocomposite boxes were then rinsed in cool cascading tap water and then submerged in an ultrasonically agitated water batch at about room temperature for about 5 minutes.

The nickel plated macrocomposite boxes were then gold plated in a plating bath containing about 1.7 grams of gold per liter from SEL-REX® Corporation, Neutly, N.J., sold under the trade name AURO BOND TN electro-plating solution. The anode in the bath was platinum clad niobium mesh. The cathode in the bath was the nickel plated metal matrix composite boxes. The plating bath conditions were a temperature of about 50° C. and plating current density of about 10 amperes per square foot. The plating time was about 15 seconds. After this gold plating step was complete, the plated metal matrix composite boxes were removed from the bath, and rinsed first in cascading tap water and then in deionized water.

In a final coating step, the gold-nickel plated macrocomposite boxes were gold plated in a plating bath containing about 10.5 grams of gold per liter from SEL-REX® Corporation, Neutly, N.J. sold under the trade name SEL-REX® Neutronics 309 gold electro-plating solution. The anode in the bath was platinum clad niobium mesh. The cathode in the bath was the nickel plated metal matrix composite boxes. The plating bath conditions were a temperature of about 60° C., a plating current density of about 4 amperes per square foot, and mechanical stirring. The plating time at the plating bath conditions was about 15 minutes. After this gold plating step was complete, the plated metal matrix composite boxes were removed from the bath, and rinsed first in cascading tap water and then dried.

After the gold-plated macrocomposite boxes were substantially completely dried, gold-nickel plated lids were seam welded to the boxes. The lids were comprised of commercially available KOVAR® alloy having a nominal composition comprised by weight of about 50% nickel, <0.01% carbon, <0.3% manganese, <0.2% silicon and the balance iron. The lids were manufactured by Solid State Equipment Corporation, Fort Washington, Pa., according to applicants' specification. The nickel and gold coatings were applied to the lids to conform to electroless nickel MIL-C-26074 standard and gold MIL-G-45204, Grade A, Type 1 standard, respectively.

Figure 19A:
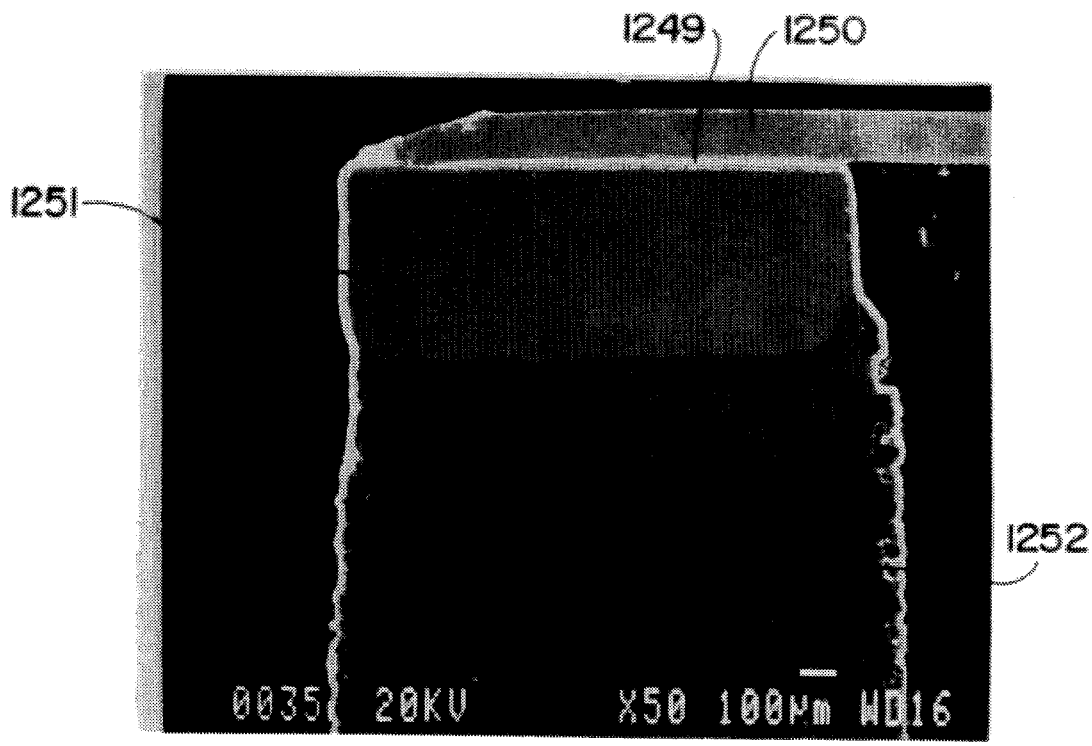
FIGS. 19A and 19B are photomicrographs corresponding to back-scattered electron images of the joint between the lid and the lip of a metal matrix composite box produced in accordance with Example 25.
Figure 19B:
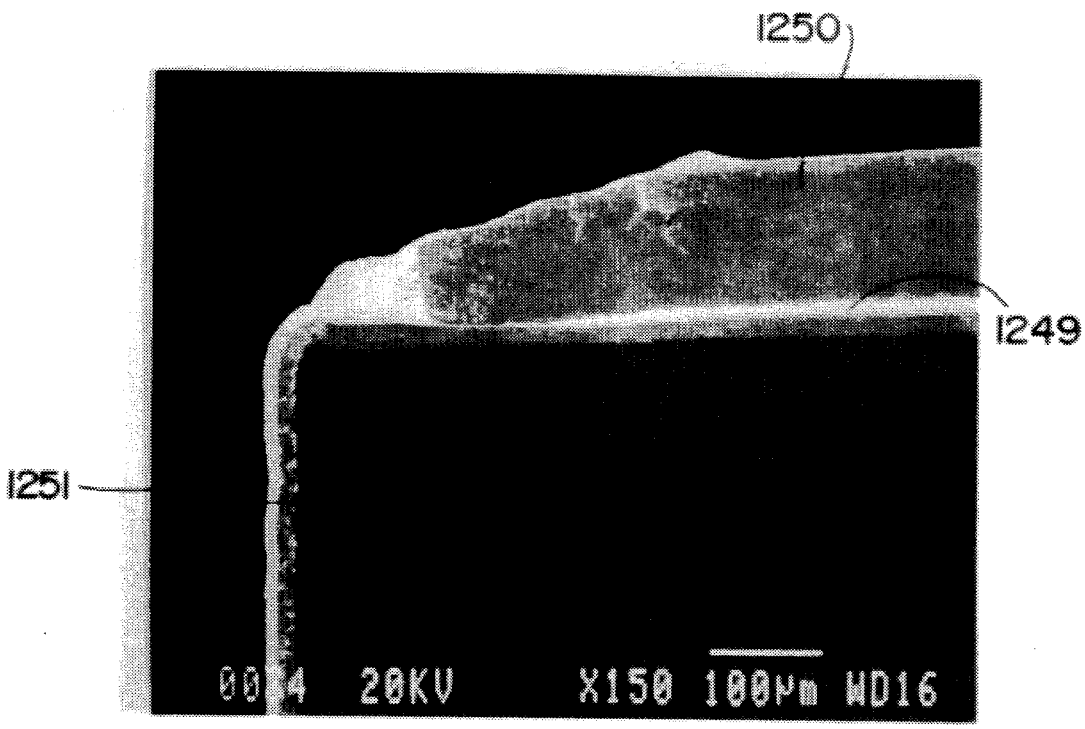

A Model 1000 parallel seam sealing system (Solid State Equipment Corporation, Fort Washington, Pa.) was used to weld the gold-nickel plated KOVAR® alloy lids to the gold-nickel plated metal matrix composite boxes. The settings of the seam sealing system included: (1) a 1500 ampere sealing current; (2) a 35 millisecond pulse repetition time; (3) a 10 millisecond pulse width; (4) a 100 millinch per second sealing speed; and (5) a 300 gram electrode force. The seam sealing integrally attached the gold-nickel plated KOVAR® alloy lid to a goldnickel plated metal matrix composite box having a titanium alloy lip. Specifically, FIGS. 19A and 19B are photomicrographs corresponding to back-scattered electron images of the joint 1249 between the gold-nickel plated KOVAR® alloy lid 1250 and the gold-nickel coated titanium lip 1251 of the metal matrix composite box 1252. FIG. 19A was taken at a magnification of about 50× while FIG. 19B was taken at a magnification of about 150×. Thus, this Example demonstrates a method for forming an electronic package.

EXAMPLE 26

The following Example demonstrates the use of a spontaneous infiltration technique and a vacuum plating technique to form a Inacrocomposite body comprising an openended metal matrix composite box with a titanium lip around the perimeter of the open-ended box and coated with a metallic aluminum coating.

The method of Example 25 was substantially repeated except that the macrocomposite box was coated with metallic aluminum using a vacuum plating process. The vacuum plating technique comprised the INVEDIZER® ion vapor deposition of aluminum carried on in an INVEDIZER® ion vapor deposition furnace (Abet Ispen Industries, Bensalem, Pa.). Specifically, after the macrocomposite boxes were removed from the molds and machined, one macrocomposite box was cleaned by abrasive grit blasting using −150 mesh (particle diameter less than about 106 µm) alumina. The desired macrocomposite box was then suspended in the chamber of an INVEDIZER® ion vapor deposition furnace (Abet Ispen Industries, Bensalem, Pa.) and the chamber door was closed. The furnace chamber was then evacuated to a pressure of about $8 \times 10^{-4}$ millimeters of mercury vacuum. The furnace chamber was then filled with argon to a pressure of about $1 \times 10^{-2}$ millimeters of mercury. The argon was ionized by energizing electrodes contained within the furnace chamber and surrounding the macrocomposite box to form a high negative potential forming a plasma field. The macrocomposite box was then cleaned with ionized argon by bombarding the macrocomposite box with the ionized argon. After the macrocomposite box was substantially completely cleaned, pure aluminum was vaporized in the furnace chamber by heating it to a temperature of about 996° C. The vaporized aluminum and the ionized argon interacted within the furnace chamber. When the vaporized aluminum contacted the macrocomposite box, it condensed on the box. The macrocomposite box was subjected to the ionized argon and vaporized aluminum for about 30 minutes, during which time the macrocomposite body was coated with metallic aluminum. The power to the energizing electrodes was then disengaged and the pressure within the furnace chamber was allowed to equilibrate to atmospheric pressure. The metallic aluminum coating a thickness of about 0.002 inch (0.051 mm) was formed. The aluminum coated macrocomposite box was then removed from the chamber and shot-peened with size 10 glass beads (MIL-G-938) to complete the metallic aluminum coating process. Thus, this Example demonstrates a method for coating a macrocomposite box with metallic aluminum to prepare it for subsequent coating methods.

EXAMPLE 27

The following Example demonstrates the use of a spontaneous infiltration technique and metal coating techniques to form a macrocomposite body comprising an open-ended metal matrix composite box coated with a duplex gold-nickel coating.

The method of Example 25 was substantially repeated to form a metal matrix box except that the filler material mixture was comprised by weight of about 78.4 percent 39 CRYSTOLON® 220 grit (average particle diameter of about 66 microns) silicon carbide (Norton Company, Worcester, Mass.), 19.6 percent 39 CRYSTOLON® 500 grit (average particle diameter of about 17 microns) silicon carbide (Norton Company, Worcester, Mass.) and about 2 percent −325 mesh (particle diameter less than about 45 microns) magnesium powder (Reade Manufacturing Co., Lakehurst, N.J.). In addition, no titanium alloy gasket was inserted in the bottom of the graphite mold and the method for coating the metal matrix composite box differed.

After machining, the metal matrix composite box was cleaned by submerging the box for about 5 minutes in a 100 gram ALCONOX® detergent (Alconox Inc., New York, N.Y.) per liter of water bath at about 80° C. and then rinsing the box under warm cascading tap water for about 2 minutes.

The metal matrix composite box was then conditioned in an agitated bath comprised of approximately 15 volume percent $H_2SO_4$ in water at about 80° C. for about 45 seconds. After this conditioning, the metal matrix composite box was rinsed for about 2 minutes under cascading tap water to remove any residual $H_2SO_4$ solution from the metal matrix composite box. The metal matrix composite box was subsequently conditioned in a bath comprising about 100 grams NIKLAD™ multiprep 502 (Witco Corp., Melrose Park, Ill.) acid pickler, descaler, and desmutter per liter of concentrated $HNO_3$ at a temperature of about 22° C. for about 5 seconds and then immediately rinse in warm cascading tap water for about 2 minutes.

The metal matrix composite box was then submerged in an about 10 volume percent NIKLAD™ 261 (Witco Corp., Melrose Park, Ill.) precatalyst sensitizer aqueous bath at a temperature of about 22° C. for about 45 seconds and immediately rinsed in warm cascading tap water for about 2 minutes before being submerged in an ultrasonically agitated tap water bath at about room temperature for about 5 minutes and again rinsed in a warm cascading tap water bath for about 2 minutes.

The metal matrix composite box was then dipped in a 5 percent by volume NIKLAD™ 262 (Witco Corp., Helrose Park, Ill.) catalyst-aqueous mechanically agitated bath at about 47° C. for about 1 minute and rinsed in warm cascading tap water for about 2 minutes, An electroless nickel plating was then formed on the metal matrix composite box by submerging the box in a bath comprising NIKLAD™ 752 in a bath comprising NIKLAD™ 752 (Witco Corp., Helrose Park, Ill.) nickel plater having a 5 percent by volume reducer concentration and a 95–105 percent nickel metal activity at about 65° C. for about 1 hour and 20 minutes to produce a nickel plate on the metal matrix composite box. The nickel plated box was then rinsed in warm cascading tap water for about 2 minutes and rinse in deionized water.

The nickel plated metal matrix composite box was then gold plated in a plating bath containing about 2 grams gold per liter from Sel-Rex Corporation, Neutly, N.J., sold under the trade name AURO BOND TN electroplating solution. The anode in the bath was a platinized niobium mesh. The cathode in the bath was the nickel plated metal matrix composite box. The plating bath conditions were a temperature of about 50° C. and plating current density of about 1.5 amperes per square foot. The plating time was about 3 minutes. After this gold plating step was complete, the plated metal matrix composite box was removed from the bath and rinsed first in cascading warm tap water and then in deionized water.

In a final coating step, the gold-nickel plated metal matrix composite box was gold plated in a plating bath containing about 5 grams gold per liter from Sel-Rex Corporation, Neutly, N.J., sold under the trade name PURA GOLD 540 electroplating solution. The anode in the bath was platinized niobium mesh, the cathode in the bath was the gold-nickel plated metal matrix composite box. The plating conditions were a temperature of about 50° C., a plating current of about 1.5 amperes per square foot and vigorous mechanical stirring. The plating time at the plating bath condition was about 24 minutes. The gold plating of this step conformed to military specification MIL-G-45204, Grade A, Type III. Thus, this Example demonstrates a method for forming a macrocomposite comprising a metal matrix composite box coated with a gold-nickel plating.

EXAMPLE 28

The following Example demonstrates a method of incorporating strip line feed-throughs into a metal matrix composite box.

Figure 20A:
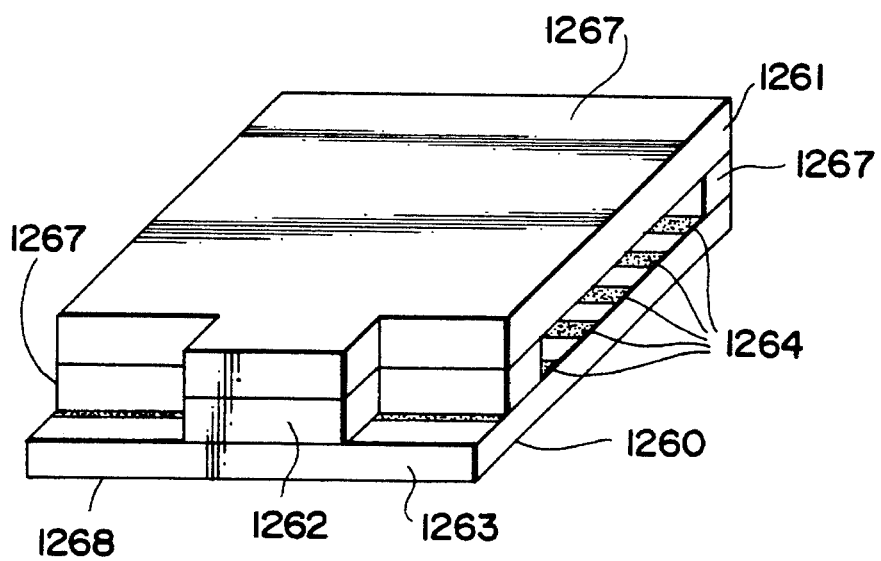
FIGS. 20A and 20B show an isometric schematic and a cross-sectional schematic, respectively, of a strip line feed-through used to produce the macrocomposite body of Example 28.
Figure 20B:
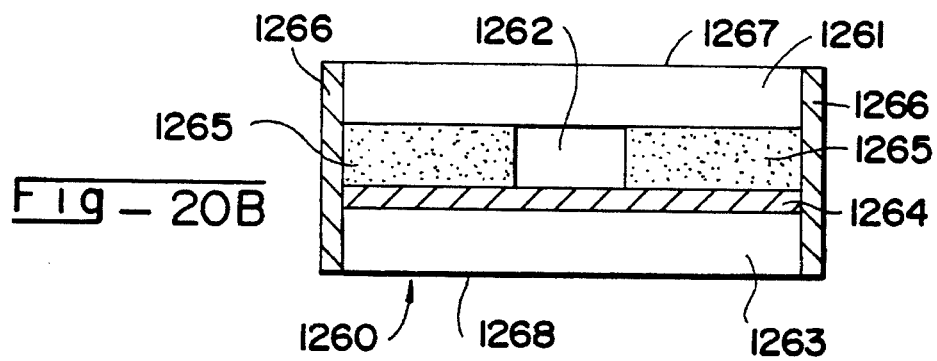

Specifically, FIG. 20A and 20B show an isometric schematic and a cross-sectional schematic of a strip line feed-through 1260. FIG. 208 shows the stripline feed-through 1260 just prior to incorporation into a graphite mold for the subsequent formation of a macrocomposite body comprising an open-ended metal matrix composite box containing the strip line feed-throughs therein. The strip line feed-through 1260, as illustrated in FIG. 20A and 20B, comprises an alumina base 1263 measuring about 0.395 inch (10 mm) long, about 0.13 inch (3.3 mm) wide, and about 0.015 inch (0.4 mm) thick. An electrically conductive coating 1264 comprising gold coated tungsten was placed onto the base 1263. Subsequently, an alumina pedestal 1262 is placed on top of the electrically conductive coating 1232. The pedestal 1233 measured about 0.395 inch (10 mm) long, about 0.04 inch (1.0 mm) wide, and about 0.015 inch (0.4 mm) high. Additionally, the pedestal comprised cross members 1267 at each end and about 0.34 inch (8.6 mm) apart. The cross members 1267 measured about 0.05 inch (1.2 mm) long, about 0.04 inch (1 mm) wide and about 0.015 inch (0.4 mm) thick. An alumina top piece 1261 measuring about 0.395 inch (10 mm) long, about 0.13 inch (3.3 mm) wide, and about 0.01 inch (0.25 mm) thick was attached to pedestal 1262. The strip line feed-through 1260 was manufactured by Tech-Ceram Corp., Amesbury, Mass. to applicants' specifications.

A gap along the length of both sides of the pedestal 1262 and between cross members 1267 was substantially completely filled with a paintable slurry mixture 1265 comprised of submicron titanium oxide powder and ethanol. The slurry mixture was aligned with the sides of the alumina base 1263 and the alumina top piece 1261. After the slurry mixture had dried sufficiently, the edges of the stripline feed-through 1260 defined by the alumina base 1263, the dried slurry mixture 1265 and the alumina top piece 1261 were coated with a mixture comprised by volume of about 50% DAG®154 colloidal graphite and about 50% ethanol. Two stripline feed-throughs were placed into predetermined locations of a coated graphite mold described below.

A two piece rectangular shaped mold having a wall thickness of about 0.1 (2.5 mm) inches and an inner cavity measuring about 2.5 inches (64 mm) in length, about 0.55 inches (14 mm) in width and about 0.72 inch (18 mm) in height was machined from graphite. A lower portion of the graphite mold had an about 0.188 inch (4.8 mm) deep and a 0.04 inch (1 mm) wide channel machined along the perimeter of the inside wall of the rectangular mold. The length of the channel was about 2.0 inches (51 mm) while the width of the channel was about 0.5 inch (13 mm). The interior surfaces of the two piece mold were then spray coated with a a mixture comprised by volume of equal parts of DAG® 154 colloidal graphite (Acheson Colloids Company, Port Huron, Mich.) and ethyl alcohol. After drying the coating in air at ambient temperature for about 0.5 hour, the coating and drying process was repeated two more times to produce a total of three colloidal graphite coatings on the graphite mold. The coated two piece graphite mold containing two strip line feed-throughs 1260 was then placed into a resistance heated air atmosphere furnace at about room temperature. The furnace temperature was then increased to a temperature of about 380° C. at a rate of about 400° C. per hour. After maintaining a temperature of about 380° C. for about 2 hours, power to the furnace was turned off and the furnace was allowed to cool to about room temperature.

Figure 20C:
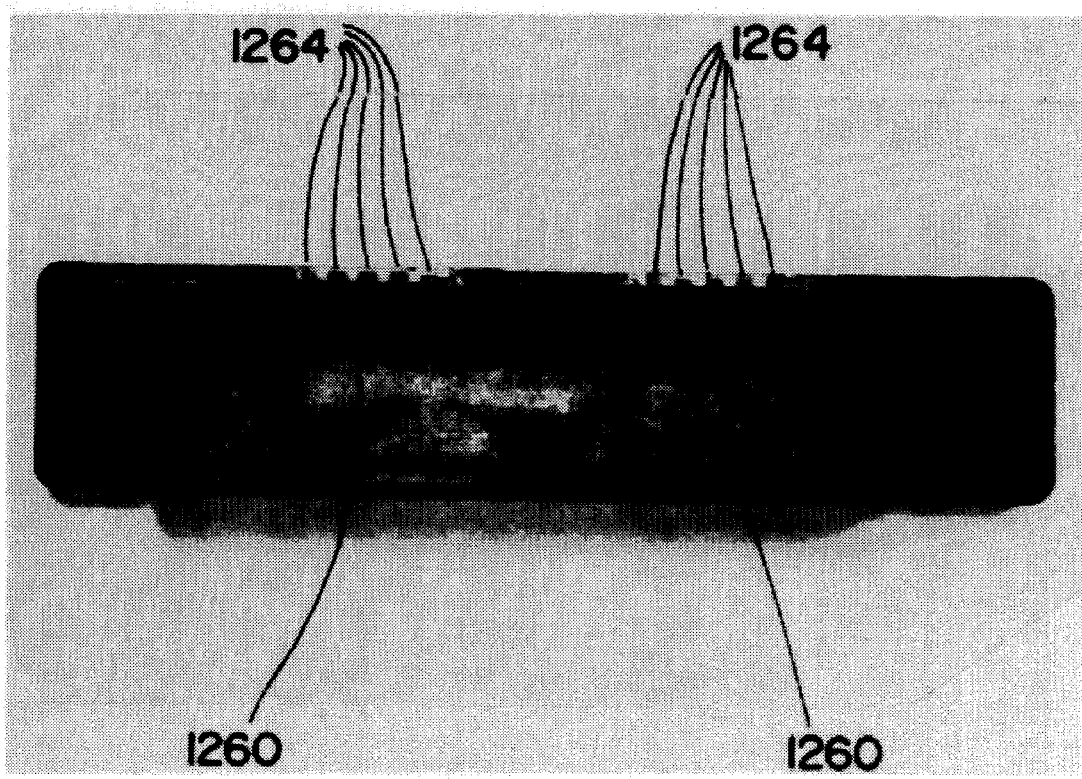

A filler material mixture comprising about 77.7 percent 39 CRYSTOLON® 220 grit (average particle diameter of about 66 μm) silicon carbide (Norton Co., Worcester, Mass.), about 19.3 percent 39 CRYSTOLON® 500 grit (average particle diameter about 17 μm) silicon carbide (Norton Company, Worcester, Mass.), and about 3 percent −325 mesh (particle diameter less than about 75 μm) magnesium powder was mixed, dried in a vacuum oven at about 30 inches (762 mm) mercury vacuum at about 150° C. for about 48 hours, and placed into the coated two piece graphite mold. The surface of the filler material mixture was then covered with a piece of graphite foil having two holes measuring about 0.25 inch (6.4 mm) in diameter. The holes were located in the graphite foil so as to evenly distribute the molten matrix metal to the filler material mixture. Additional −325 mesh magnesium was then placed along the perimeter of the graphite foil and within the holes in the graphite foil. Two about 12.5 gram bodies of a matrix metal comprised by weight of about 12% silicon, 2.5% nickel, 1% copper, 0.1% magnesium and the balance aluminum, were placed over the holes in the graphite foil. The coated two piece graphite mold and its contents were then placed onto a bed of Grade B aluminum nitride powder (about 0.4 micron in diameter) (Hermann Starck, Inc., New York, N.Y.) contained within a graphite boat. The graphite boat and its contents were then placed into a retort lined resistance heated furnace and the retort and its contents were evacuated to about 30 inches mercury (762 mm Hg) vacuum. The furnace and its contents were then filled with nitrogen flowing at a rate of about 15 liters per minute and heated to about 810° C. at about 300° C. per hour. After about 2.5 hours at about 810° C. with a nitrogen atmosphere flowing at about 15 liters per minute, the furnace and its contents were cooled to about room temperature. After the setup had cooled to about room temperature, the setup was disassembled to reveal that the matrix metal had infiltrated and embedded the filler material mixture while surrounding the two strip line feed-throughs to form a macrocomposite body comprising an open-ended metal matrix composite box 1269 with strip line feed-throughs 1260 contained in the side walls thereof. Specifically, FIG. 20C shows a photograph of the resultant metal matrix composite 1269 incorporating strip line feed-throughs 1260. The strip line feed-throughs were well bonded to the open-ended metal matrix composite box 1269 at surfaces 1267 and 1268 of the feed-throughs and the gold coated tungsten electrically conductive coating 1264 of each feed-through 1260 was electrically insulated from the metal matrix composite box by the alumina structure of each feed-through.

EXAMPLE 29

The following Example demonstrates the use of a spontaneous infiltration technique to form a macrocomposite body comprising an open-ended first metal matrix composite box with a second metal matrix composite lip around the perimeter of the open end of the box.

The method of Example 25 was substantially repeated except that the titanium alloy metal gasket in the channel created between the perimeter of the graphite insert and the inside walls of the rectangular graphite mold was replaced with a second filler material mixture. In addition, the outside bottom surface of each graphite mold was covered with a piece of graphite foil. The graphite foil was attached to the bottom of each graphite mold with a mixture comprised by weight of about 50%, −50 mesh magnesium powder and about 50% RIGIDLOCK® graphite cement (Polycarbon Corp., Valencia, Calif.).

About 15 grams of the second filler material mixture comprised by weight of about 5 percent −325 mesh (particle diameter less than about 45 microns) magnesium powder (Reade Manufacturing Company, Lakehurst, N.J.) and the balance −325 mesh (particle diameter was less than about 45 μm) mullite powder (Kyanite Mining Corporation, Dillwyn, Va.) were combined in an about 500 milliliter polypropylene jar with alumina grinding balls having a diameter of about 0.5 inch (13 mm). The polypropylene jar was closed and placed on a rolling mill for about 4 hours to homogeneously mix the second filler material mixture. After the alumina milling balls were separated from the second filler material mixture, about 0.4 gram, about 0.5 gram, about 0.6 gram, about 0.7 gram and about 0.8 gram of the second filler material mixture were poured into the channel between the graphite insert and the inside walls of five rectangular graphite molds.

A first filler material mixture substantially the same as that used in Example 25, except that it was comprised by weight of about 77.7 percent 39 CRYSTOLON® 220 grit (average particle diameter of about 66 microns) silicon carbide (Norton Co., Worcester, Mass.), about 19.3 percent 39 CRYSTOLON® 500 grit (average particle diameter of about 17 microns) silicon carbide (Norton Co., Worcester, Mass.), and about 3 percent −325 mesh (particle diameter less than about 45 microns) magnesium powder. About 15 grams of this first filler material mixture were then placed into each of the setups, such that the second filler material mixture and the graphite inserts were substantially completely covered. The surface of the first filler material mixture in each mold was first covered with about 0.2 gram of −50 mesh magnesium powder and then with a piece of graphite foil having a hole in its center measuring about 0.5 inch (13 mm) in diameter. An additional about 0.1 gram of −50 mesh magnesium powder was then placed into the hole in the center of the graphite foil. About 35 gram bodies of matrix metal comprised by weight of about 12% silicon, 2.5% nickel, 1% copper, 0.2% magnesium and the balance aluminum were placed over the holes in the graphite foil within each setup. Each coated graphite mold and its contents was then placed into a graphite boat. The graphite boat and its contents were then placed into a retort lined resistance heated furnace and the retort and its contents were evacuated to about 30 inches of mercury (262 mm Hg). The furnace and its contents were then filled with nitrogen flowing at a rate of about 5 liters per minute and heated to about 210° C. at about 200° C. per hour. After about 8 hours at about 210° C., the furnace and its contents were heated to about 810° C. at about 200° C. per hour, held at 810° C. for about 3.5 hours and then cooled to about 725° C. at about 200° C. per hour. At about 725° C., both the continuous flow of nitrogen gas and the power to the furnace were terminated. The graphite boat and its contents were removed from the furnace at about 725° C., disassembled and the five setups were placed on top of a water cooled aluminum aluminum chill plate. In addition, shortly after the five setups were placed on top of the chill plate, the surfaces of the excess molten metal contained within the graphite molds were covered with a ceramic insulating blanket which insulated the surface of the excess metal. The combination of insulating the upper end of the setup and a heat sink on the bottom of each setup resulted in the directional solidification of the molten metal contained within each setup.

After each setup had cooled to about room temperature, each setup was disassembled to reveal that a second metal matrix composite lip was attached to an open-ended first metal matrix composite box, both comprising filler material mixtures embedded with the matrix metal. More specifically, it was noted that the matrix metal had substantially completely infiltrated both filler material mixtures in order to make the macrocomposite bodies having a second lip region with a lower thermal conductivity than a first box region. Thus, this Example demonstrates a method for forming a electronic package for seam sealing having a lip region comprised of a second metal matrix composite body having a lower thermal conductivity than the thermal conductivity of the box region of the first metal matrix composite.

EXAMPLE 30

Figure 21A:
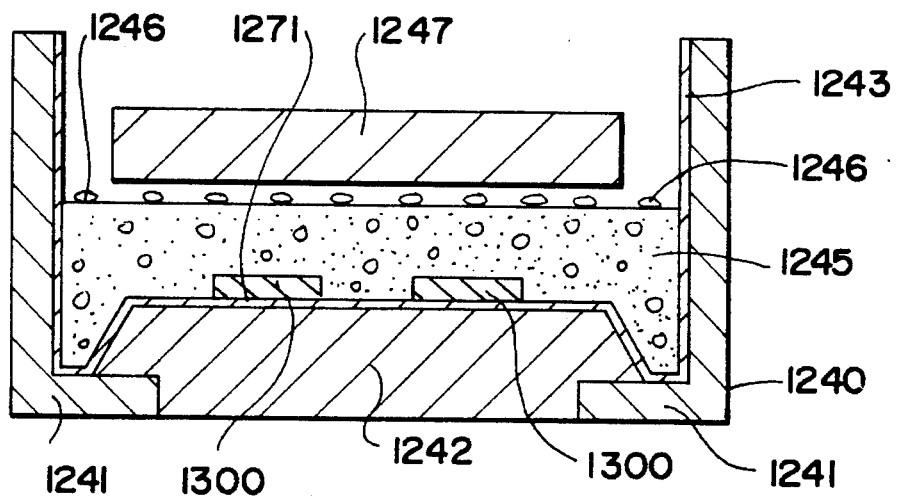
FIG. 21A is a cross-sectional schematic of a setup used to produced the open-ended metal matrix composite box of Example 30.

The following Example demonstrates the use of a spontaneous infiltration technique to form a macrocomposite body comprising an open-ended metal matrix composite box with alumina substrates contained in the bottom of the open-ended metal matrix composite box. FIG. 21A is a cross-sectional schematic of a setup used to produce the open-ended metal matrix composite box in this Example. A rectangular mold substantially the same as that described in Example 25 was used to make the macrocomposite. The methods of Example 25 were substantially repeated to form the infiltration setup, except that no titanium alloy gasket was used and aluminum substrates 1300 were placed on the graphite insert 1242 in the graphite mold 1241.

Figure 21B:
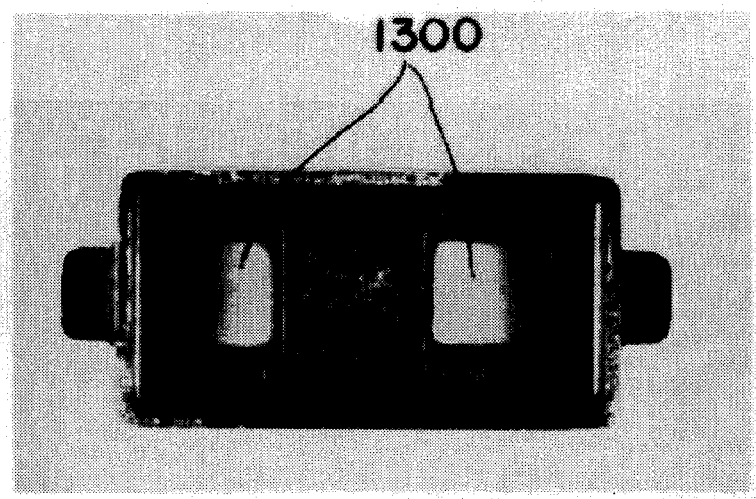
FIG. 21B is a photograph of the open-ended metal matrix composite box produced in accordance with Example 30.

Two alumina substrates 1300 measuring about 1 inch (25 mm) square by about 0.025 inch (0.64 mm) thick were cut from commercially available alumina (Kyocera Corp., Kyoto, Japan). The alumina substrates 1300 were then coated about five times with a mixture comprised by volume of about 50% DAG® 154 colloidal graphite (Acheson Colloids, Port Huron, Mich.) and about 50% ethanol. After the coating was allowed to dry, the alumina bodies were placed onto the coated graphite insert 1242 and into the coated graphite mold 1242 such that the colloidal graphite coated surfaces of each alumina substrate 1300 contacted the coated graphite insert 1242. The method of Example 25 was substantially repeated to cure the colloidal graphite coating 1243 of the graphite mold 1241, the graphite insert 1242, and the alumina substrates 1300. A filler material mixture 1245 substantially the same as that described in Example 27 was then poured into the bottom of the graphite mold 1242 to cover the alumina substrates 1300 and the graphite insert 1241. The filler material mixture 1245 was thereafter leveled within the graphite mold 1241 and covered with a layer 1246 of −50 mesh (particle diameter less than about 300 microns) magnesium powder (Hart Corporation, Tamaqua, Pa.). An approximately 50 gram body of matrix metal 1247 comprised by weight of about 12% silicon, about 1% copper, about 0.2% magnesium, about 2.5% nickel and the balance aluminum was then placed onto the layer 1246 of −50 mesh (particle diameter less than about 300 microns) magnesium powder covering the filler material mixture 1245, to form a setup 1240. The setup was then placed into a graphite boat (not shown in FIG. 41). The graphite boat and its contents were then placed into a retort contained within a resistance heated furnace and the retort door was closed. The retort chamber was then evacuated to about 30 inches (762 mm) of mercury vacuum and then backfilled with nitrogen gas flowing at a rate of about 5 liters per minute. The about 5 liters per minute gas flow rate was maintained as the furnace was heated to about 200° C. in about an hour. After about 6.3 hours at about 200° C., the furnace and its contents were heated to about 810° C. at about 200° C. per hour. After about 5 hours at about 810° C. with a nitrogen flow rate of about 5 liters per minute, the continuous flow of nitrogen gas and the power to the furnace were terminated. The graphite boat and its contents were removed from the furnace, disassembled and the setup 1240 was placed on top of a water cooled aluminum chill plate. The presence of the heat sink on the bottom of the setup 1240 resulted in the directional solidification of the molten metal contained within the layup. After the setup had cooled to about room temperature, it was disassembled to reveal that the alumina substrates were integral with the bottom of the open-ended metal matrix composite box comprising the filler material mixture 1245 embedded within the matrix metal, as shown in FIG. 21B. Thus, this Example demonstrates a method for forming a macrocomposite body comprising a metal matrix composite box containing within its bottom alumina substrates.

EXAMPLE 31

This Example demonstrates the fabrication of a macrocomposite comprising a metal matrix composite and a metal. Specifically, the metal was diffusion bonded to the metal matrix composite.

A wax mold of a box measuring about 6 inches (152 mm) square was used to form an investment pattern. An investment shell was then built on the surface of the investment pattern. Specifically, an investment pattern comprising the wax model was dipped into a slurry comprised by weight of about 29.6 percent NYACOL® 1430AT colloidal silica (Nyacol Products, Inc., an affiliate of PQ Corporation, Ashland, Me.), about 65.1 percent HUBERCARB® Q 325 calcium carbonate (−325 mesh, particle diameter less than about 45 microns, J.M. Huber Corporation, Calcium Carbonate Division, Quincy, Ill.), about 4.3 percent 39 CRYSTOLON® 500 grit (average particle diameter of about 17 microns) silicon carbide (Norton Co., Worcester, Mass.), about 0.6 percent VICTOWET® 12 wetting agent (Ransom and Randolph, Inc., Maumee, Ohio), and about 0.3 percent DC-8 ANTIFOAM® defoamer, Ransom and Randolph, Inc., Maumee, Ohio). The coated investment pattern was then dusted or stuccoed with RANCO® SIL 90 grit (average particle diameter of about 216 microns) No. 4 silica sand (Ransom and Randolph, Inc., Maumee, Ohio). The investment pattern and its developing investment shell were then dried for about 0.5 hour at about 65° C. The dried investment shell was then dipped for about 2 seconds into a bath of NYACOL® 1430AT colloidal silica (Nyacol Products, Inc., Ashland, Me.). This dip-dust-dry-wet sequence was then immediately repeated two times. Next, the coated investment pattern was dipped into a secondary slurry comprised by weight of about 1 part REDIP® indicator (Ransom and Randolph, Inc., Maumee, Ohio), about 2 parts VICTOWET® 12 wetting agent (Ransom and Randolph, Inc., Maumee, Ohio), about 56 parts distilled water, about 274 parts NYACOL® 830 colloidal silica (Nyacol Products, Inc., Ashland, Me.) and about 700 parts RANCO® SIL No. 2 silica powder (Ransom and Randolph, Inc., Maumee, Ohio) to yield a slurry viscosity corresponding to about 15 seconds in a Zahn No. 4 cup. The slurry investment shell was then stuccoed and dipped into a fluidized bed of RANCO® SIL B about 30 grit (average particle diameter of about 930 microns) silica sand (Ransom and Randolph, Inc., Maumee, Ohio). The stuccoed investment shell was again dried at about 65° C. for about 0.5 hours which corresponded to the REDIP® indicator in the shell, changing from yellow-green to orange. This second dip-stucco-dry sequence was then repeated an additional five times. After application of a secondary shell layer, the developing shell was wrapped with reinforcement wire. Several holes having a diameter of about 0.63 inch (1.6 mm) were drilled in the investment shell to allow the venting of gases from the wax during the subsequent autoclaving. The coated investment pattern was then placed into a steam autoclave to remove the wax investment pattern from the surrounding investment shell. After autoclaving at about 149° C. under a pressure of about 150 pounds per square inch (7.03 kilograms per centimeters square) for about 4 minutes, the wax was substantially completely removed from the surrounding investment shell. The investment shell was then removed from the steam autoclave and placed into a resistance heated air atmosphere furnace at about room temperature. The furnace and its contents were then heated to about 900° C. at about 800° C. per hour, held at about 900° C. for about an hour during which time any residual wax combusted and the investment shell rigidized. The furnace and its contents were then cooled to about room temperature.

A filler material mixture was made by mixing in a plastic jar on a ball mill for about 2 hour a mixture comprised by weight of about 95 percent 38 ALUNDUM® 500 grit (average particle diameter of about 17 microns) alumina (Norton Co., Worcester, Mass.) and about 5 percent −325 mesh (particle diameter less than about 45 microns) magnesium powder (Reade Manufacturing Co., Lakehurst, N.J.). After about 99 hours at about 150° C., about 1.1 kilograms of the filler material mixture were poured into the investment shell by the following sequence. A majority of the filler material mixture was poured into the investment shell and the investment shell was lightly tapped on a table top about 25 times to settle the filler material mixture. The surface of the filler material mixture was then packed with a hand tool to obtain the final density. An additional about 0.125 inch (3.2 mm) layer of loose filler material mixture was then poured into the cavity of the investment shell and onto the packed filler material mixture. This final layer of filler material mixture was left undisturbed. Several ingots of a matrix metal comprised by weight of about 10 percent magnesium and the balance aluminum were placed onto the loose filler material mixture within the investment shell thereby forming a lay-up. The quantity of matrix metal in the lay-up amounted to about 1.4 kilograms.

The lay-up comprising the investment shell and its contents was placed into a retort contained within a resistance heated furnace and the retort door was closed. The retort chamber was then evacuated to about 30 inches (762 mm) of mercury vacuum and then backfilled with nitrogen flowing at a rate of about 14 liters per minute. The about 14 liter per minute nitrogen flow rate was maintained as the furnace was heated to about 535° C. at about 600° C. per hour. After about an hour at about 535° C., the furnace and its contents were heated to about 790° C. at about 600° C. per hour. After about 2 hours at about 790° C. with a nitrogen flow rate of about 14 liters per minute, the furnace and its contents were cooled to about room temperature. At about room temperature, both the continuous flow of nitrogen gas and the power to the furnace were terminated. The furnace door was opened and it was noted that the matrix metal had spontaneously infiltrated a filler material mixture in order to make a metal matrix composite body. The metal matrix composite body was then cleaned of any residual shell by sandblasting and cut into pieces measuring about 0.875 inch (22 mm) long by about 0.813 inch (21 mm) wide by about 0.313 inch (7.9 mm) thick. The surface of these metal matrix composite plates were finished using a diamond abrasive wheel.

After the metal matrix composite plates had been diamond finished, a setup was prepared to diffusion bond an aluminum alloy to the metal matrix composite plates. Specifically, an alumina boat measuring about 3.9 inches (100 mm) long by about 1.8 inches (45 mm) wide and about 0.75 inch (19 mm) deep was filled with about 58 grams of 38 ALUNDUM® 90 grit (average particle diameter of about 216 micron) alumina bedding (Norton Co., Worcester, Mass.) and was leveled. A piece of commercially available aluminum association alloy 336 having a nominal composition comprised by weight of about 11.0–13.0 percent silicon, $_=1.2\%$ iron, 0.5–1.5% copper, $_=0.35\%$ manganese, 0.7–1.3% magnesium, 2.0–3.0% nickel, $_=0.35\%$ zinc, $_=0.25\%$ titanium and the balance aluminum measuring about 0.875 inch (22 mm) long by about 0.813 inch (21 mm) wide by about 0.5 inch (13 mm) thick was pushed into the alumina bedding contained within the alumina boat such that the surface of the aluminum alloy was substantially flush with the surface of the alumina bedding. The metal matrix composite body was then placed onto the alloy such that the edges of the metal matrix composite body substantially aligned with the edges of the alloy body. Two small strips of masking tape were then used to secure the metal matrix composite plate to the aluminum alloy. A weight assembly comprised of about 4 pieces of copper alloy ingots and a plate of commercially available alumina having a diameter of about 1.4 inches (35 mm) was then placed on top of the metal matrix composite body such that the alumina plate contacted the metal matrix composite body and supported the weight of the copper alloy ingots. The weight assembly weighed about 138 grams. The entire lay-up comprised the alumina boat containing the alumina bedding supporting the aluminum alloy in contact with the metal matrix composite body and weighted down by the weight assembly.

The lay-up was placed into a resistance heated controlled atmosphere alumina tube furnace and the ends of the tube furnace were sealed. The furnace and its contents were then evacuated to about 30 inches (762 mm) of mercury vacuum and then backfilled with argon gas flowing at about 0.5 liters per minute. After the evacuation and backfill process was repeated and the argon flow rate was stabilized at about 0.5 liters per minute, the furnace and its contents were heated at about 200° C. per hour to about 550° C., held at about 550° C. per hour for about 10 hours and then cooled to about room temperature at about 200° C. per hour. At about room temperature, the continuous flow of argon gas and the power to the furnace were terminated and the lay-up was removed from the furnace to reveal that the aluminum alloy had diffusion bonded to the metal matrix composite body. Thus, this Example demonstrates a method of forming a macrocomposite body comprising a first metal portion diffusion bonded to a second metal matrix composite portion.

We claim:

1. A method for producing an electronic package comprising the steps of:

providing a first permeable mass selected from the group consisting of at least one filler material and a preform of at least one filler material, said first permeable mass comprising a base portion and at least one wall extending from said base portion;

placing at least one lip-forming material into contact with said at least one wall, said at least one lip-forming material having a composition different from a metal matrix composite body formed by infiltrating said first permeable mass with a matrix metal and being capable of attachment to other materials;

contacting a body of matrix metal with said first permeable mass such that said matrix metal, when molten, spontaneously infiltrates said first permeable mass at least up to said at least one lip-forming material;

heating said matrix metal in an infiltrating atmosphere to a temperature above the melting point of said matrix metal but below the melting point of said first permeable mass;

spontaneously infiltrating at least a portion of said first permeable mass with said matrix metal, thereby embedding said permeable mass with matrix metal and forming a metal matrix composite, said infiltrating occurring at least up to at least a portion of said at least one lip-forming material; and cooling said matrix metal to a temperature below the melting point of the matrix metal while said matrix metal is in contact with said at least one lip-forming material, thereby forming an electronic package comprising a metal matrix composite base portion and at least one metal matrix composite wall extending from said metal matrix composite base portion and said at least one metal matrix composite wall being bonded to said at least one lip-forming material, thereby forming a macrocomposite body.

2. An electronic package comprising:

a metal matrix composite base portion and at least one metal matrix composite wall extending from said metal matrix composite base portion, wherein said metal matrix composite base portion and said at least one metal matrix composite wall comprise a matrix metal embedding at least one filler material; and at least one lip material attached to at least a portion of said at least one metal matrix composite wall, said lip material having a composition different from said metal matrix composite base portion and being capable of attachment to other materials, thereby facilitating a means for sealing said electronic package.

3. An electronic package as claimed in claim 2, wherein said at least one lip material is directly bonded to at least a portion of said at least one metal matrix composite wall.

4. An electronic package as claimed in claim 2, wherein said at least one lip material is at least partially reacted with the matrix metal comprising said at least one wall.

5. An electronic package as claimed in claim 2, wherein at least a portion of said electronic package comprises at least one material selected from the group consisting of aluminum, gold, chrome, copper, nickel, tin, titanium, tungsten, zinc, epoxy resins and combinations thereof.

6. An electronic package as claimed in claim 2, wherein said at least one lip material has substantially completely reacted with the matrix metal of said metal matrix composite comprising said at least one wall, thereby forming at least one of an alloy and an intermetallic comprised of the matrix metal of said metal matrix composite and said at least one lip material.

7. An electronic package as claimed in claim 2, further comprising at least one feedthrough embedded in and extending through at least a portion of at least one of said metal matrix composite base portion and said at least one metal matrix composite wall, wherein said at least one feedthrough provides a means for communicating electrical signals from an interior portion of said electronic package and an exterior portion of said electronic package.

8. An electronic package as claimed in claim 2, further comprising at least one substrate material attached to said metal matrix composite base portion of said electronic package.

9. An electronic package as claimed in claim 2, further comprising at least one metal rich region integral with at least one of said metal matrix composite base portion and said at least one metal matrix composite wall.

10. An electronic package as claimed in claim 2, further comprising at least four metal matrix composite walls extending from said metal matrix composite base portion and at least one lip material attached to said at least four walls, thereby forming a macrocomposite body comprising an open metal matrix composite box and at least one lip material attached to at least a portion of said at least four walls at an open end of the metal matrix composite box.

11. An electronic package as claimed in claim 2, further comprising a lid attached to said lip material.

12. An electronic package as claimed in claim 2, further comprising a lid attached to said lip material and at least one coating located on at least a portion of said electronic package.

13. An electronic package as claimed in claim 2, further comprising at least one additional wall located within an interior portion of said electronic package.

14. An electronic package as claimed in claim 13, wherein said at least one additional wall extends substantially completely from said metal matrix composite base portion to said lid which is attached to said lip material.

15. A method for producing an electronic package comprising the steps of:

providing a permeable preform of at least one filler material, said preform comprising a base portion and at least one wall extending from said base portion;

placing at least one lip-forming material into contact with said at least one wall, said at least one lip-forming material having a thermal conductivity which is less than the thermal conductivity of a metal matrix composite body formed by infiltrating said first permeable mass with a matrix metal;

contacting a body of matrix metal with said preform such that said matrix metal, when molten, spontaneously infiltrates said preform at least up to said at least one lip-forming material;

heating said matrix metal in an infiltrating atmosphere to a temperature above the melting point of said matrix metal but below the melting point of said preform;

spontaneously infiltrating at least a portion of said preform with said matrix metal, thereby filling said preform with matrix metal and forming a metal matrix composite, said infiltrating occurring at least up to at least a portion of said at least one lip-forming material; and cooling said matrix metal to a temperature below the melting point of the matrix metal while said matrix metal is in contact with said at least one lip-forming material, thereby forming an electronic package comprising a metal matrix composite base portion and at least one metal matrix composite wall extending from said metal matrix composite base portion and said at least one metal matrix composite wall being integrally attached to said at least one lip-forming material, thereby forming a macrocomposite body.

16. The electronic package of claim 2, wherein said at least one wall comprises two or more walls and said at least one lip material comprises at least one material having a thermal conductivity lower than the thermal conductivity of said two or more metal matrix composite walls.

17. An electronic package as claimed in claim 11, wherein said lid is attached to said lip material by at least one sealing means selected from the group consisting of welding and soldering.

18. An electronic package as claimed in claim 17, wherein said sealing results in a hermetic seal being formed in said electronic package.

19. An electronic package as claimed in claim 2, wherein said at least one electronic device is attached to said metal matrix composite base portion.

20. An electronic package as claimed in claim 8, wherein a plurality of electronic devices is attached to at least a portion of said metal matrix composite base portion or is attached to said at least one substrate material.

* * * * *